(12) United States Patent
Tamaki et al.

(10) Patent No.: US 9,835,310 B2
(45) Date of Patent: Dec. 5, 2017

(54) WAVE-LENGTH CONVERSION INORGANIC MEMBER, AND METHOD FOR MANUFACTURING THE SAME

(71) Applicant: NICHIA CORPORATION, Anan-shi, Tokushima (JP)

(72) Inventors: Hiroto Tamaki, Anan (JP); Takayoshi Wakaki, Anan (JP); Tadao Hayashi, Tokushima (JP); Yoshiki Sato, Anan (JP); Daisuke Oyamatsu, Tokushima (JP); Takafumi Sugiyama, Yoshinogawa (JP); Takao Kosugi, Anan (JP)

(73) Assignee: NICHIA CORPORATION, Anan-Shi, Tokushima (JP)

( * ) Notice: Subject to any disclaimer, the term of this patent is extended or adjusted under 35 U.S.C. 154(b) by 191 days.

(21) Appl. No.: 14/590,520

(22) Filed: Jan. 6, 2015

(65) Prior Publication Data

US 2015/0159836 A1 Jun. 11, 2015

Related U.S. Application Data

(63) Continuation of application No. 13/852,332, filed on Mar. 28, 2013, now Pat. No. 8,994,259.

(30) Foreign Application Priority Data

Mar. 28, 2012 (JP) .................................. 2012-072836
Apr. 2, 2012 (JP) .................................. 2012-083747
(Continued)

(51) Int. Cl.
*H01L 33/50* (2010.01)
*F21V 9/16* (2006.01)
(Continued)

(52) U.S. Cl.
CPC .................. *F21V 9/16* (2013.01); *B05D 5/06* (2013.01); *C23C 16/45525* (2013.01);
(Continued)

(58) Field of Classification Search
CPC ..... H01J 1/62–1/76; H01J 61/38–61/48; H01J 9/22–9/2278; H01L 33/50–33/508
See application file for complete search history.

(56) References Cited

U.S. PATENT DOCUMENTS 6,447,908 B2 9/2002 Yun et al.
2002/0070682 A1* 6/2002 Atagi ...................... H01J 61/30
315/246
(Continued)

FOREIGN PATENT DOCUMENTS

JP 2003-243726 A 8/2003
JP 2003-258308 A 9/2003
(Continued)

OTHER PUBLICATIONS

Japanese Notice of Reasons for Refusal application No. 2012-072836 dated Feb. 9, 2016.
(Continued)

*Primary Examiner* — Mariceli Santiago
(74) *Attorney, Agent, or Firm* — Squire Patton Boggs (US) LLP

(57) ABSTRACT

A wave-length conversion inorganic member can includes a base body and an inorganic particle layer on the base body. The inorganic particle layer can include particles of an inorganic wave-length conversion substance which is configured to absorb light of a first wave-length and to emit light of a second wave-length different from the first wave-length. The inorganic particle layer can include an agglomerate of a plurality of the particles. Each of the plurality of the particles are in contact with at least one of the other particles (Continued)

or the base body. A cover layer comprises an inorganic material, and the cover layer continuously covers a surface of the base body and surfaces of the particles. The inorganic particle layer has an interstice enclosed by the particles, or by the particles and one of the base body and the cover layer.

13 Claims, 32 Drawing Sheets

(30) Foreign Application Priority Data

| | | |
|---|---|---|
| Apr. 10, 2012 | (JP) | 2012-089068 |
| Apr. 25, 2012 | (JP) | 2012-100038 |
| May 29, 2012 | (JP) | 2012-121959 |

(51) Int. Cl.

| | |
|---|---|
| *B05D 5/06* | (2006.01) |
| *F21V 7/00* | (2006.01) |
| *H01L 31/055* | (2014.01) |
| *H05B 33/12* | (2006.01) |
| *C23C 16/455* | (2006.01) |
| *F21V 13/08* | (2006.01) |
| *F21K 9/60* | (2016.01) |
| *F21Y 115/30* | (2016.01) |
| *F21Y 115/10* | (2016.01) |

(52) U.S. Cl.
CPC ............ *F21K 9/60* (2016.08); *F21V 7/00* (2013.01); *F21V 13/08* (2013.01); *H01L 31/055* (2013.01); *H01L 33/502* (2013.01); *H01L 33/505* (2013.01); *H05B 33/12* (2013.01); *F21Y 2115/10* (2016.08); *F21Y 2115/30* (2016.08); *H01L 2224/48091* (2013.01); *H01L 2224/73265* (2013.01); *H01L 2224/8592* (2013.01); *Y02E 10/52* (2013.01); *Y10T 428/24364* (2015.01); *Y10T 428/24372* (2015.01); *Y10T 428/24413* (2015.01); *Y10T 428/24421* (2015.01)

(56) References Cited

U.S. PATENT DOCUMENTS

| | | | |
|---|---|---|---|
| 2004/0121502 A1* | 6/2004 | Summers | H01L 33/50 438/47 |
| 2004/0161631 A1 | 8/2004 | Liu et al. | |
| 2006/0076895 A1 | 4/2006 | Wada et al. | |
| 2007/0172580 A1 | 7/2007 | Fan et al. | |
| 2007/0194709 A1 | 8/2007 | Kato et al. | |
| 2007/0298250 A1 | 12/2007 | Weimer et al. | |
| 2009/0091235 A1 | 4/2009 | Matsuo et al. | |
| 2009/0128742 A1 | 5/2009 | Hashimoto et al. | |
| 2011/0304264 A1 | 12/2011 | Winkler | |
| 2012/0200218 A1 | 8/2012 | Maemura et al. | |
| 2015/0146410 A1 | 5/2015 | Maemura et al. | |

FOREIGN PATENT DOCUMENTS

| | | |
|---|---|---|
| JP | 2004003955 A | 1/2004 |
| JP | 2004-088013 A | 3/2004 |
| JP | 2004-146835 A | 5/2004 |
| JP | 2005-197509 A | 7/2005 |
| JP | 2005-536606 A | 12/2005 |
| JP | 2006-005367 A | 1/2006 |
| JP | 2006-037097 A | 2/2006 |
| JP | 2006-169422 A | 6/2006 |
| JP | 2006-303001 A | 11/2006 |
| JP | 2008117976 A | 5/2008 |
| JP | 2009-524736 A | 7/2009 |
| JP | 2009290238 A | 12/2009 |
| JP | 2010256457 A | 11/2010 |
| JP | 2011-168627 A | 9/2011 |
| JP | 2013-016268 A | 1/2013 |
| WO | 2004/021745 A1 | 3/2004 |
| WO | 2007/087480 A2 | 8/2007 |
| WO | 2008/115498 A1 | 9/2008 |
| WO | 2011097393 A1 | 8/2011 |

OTHER PUBLICATIONS

Japanese Notice of Reasons for Refusal application No. 2012-083747 dated Feb. 9, 2016.
Japanese Notice of Reasons for Refusal application No. 2012-089068 dated Feb. 9, 2016.
Japanese Notice of Reasons for Refusal application No. 2012-100038 dated Mar. 8, 2016.
Korean Office Action application No. 10-2013-32959 dated Dec. 29, 2014.
European Search Report application No. 13161479.4 dated Dec. 4, 2015.
Japanese Office Action issued in corresponding Japanese Patent No. 5966529 (Japanese Patent Application No. 2012-83747) dated Feb. 10, 2017.

* cited by examiner

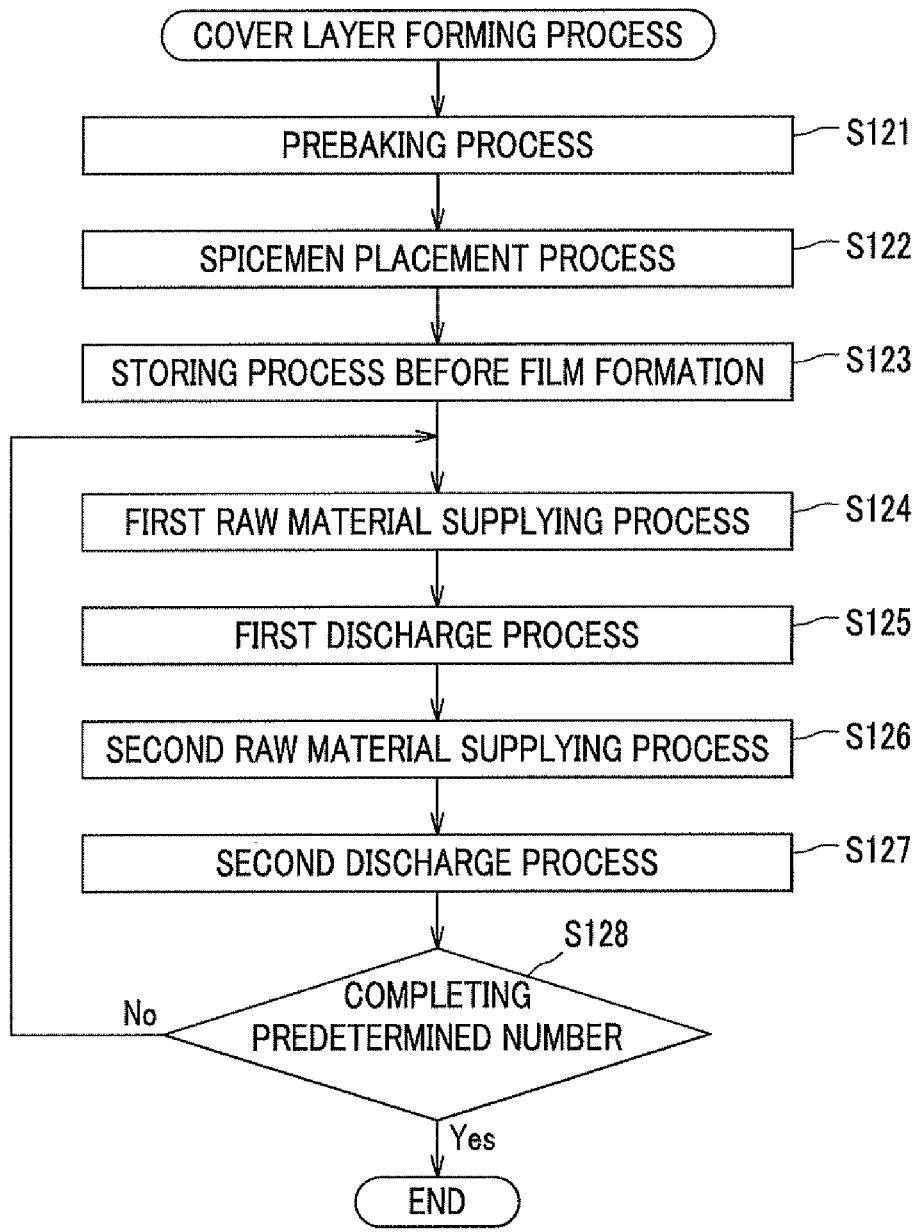

WAVE-LENGTH CONVERSION INORGANIC MEMBER, AND METHOD FOR MANUFACTURING THE SAME

CROSS-REFERENCE TO RELATED APPLICATIONS

The present application is a Continuation application of U.S. application Ser. No. 13/852,332, filed Mar. 28, 2013, which claims priority under 35 U. S. C. §119 to Japanese Patent Application No. 2012-072836, filed Mar. 28, 2012, Japanese Patent Application No. 2012-083747, filed Apr. 2, 2012, Japanese Patent Application No. 2012-089068, filed Apr. 10, 2012, Japanese Patent Application No. 2012-100038, filed Apr. 25, 2012 and Japanese Patent Application No. 2012-121959, filed May 29, 2012. The contents of these applications are incorporated herein by reference in their entirety.

BACKGROUND

Field

Embodiments of the present invention relate to a wave-length conversion inorganic member, and a method for manufacturing the same.

Description of the Related Art

A semiconductor light-emitting element such as a light emitting diode or a semiconductor laser is used for a light emitting device which color or wave-length converts a part of or all of light using a color conversion member (a wave-length conversion member). Thus, the converted emitting-light color (emitting-light wave-length) is output. This light-emitting device has been used for a head light and a projector which require a high output.

An exemplary conventional wavelength (color) conversion material used in such light-emitting device is a color conversion material prepared by dispersing a phosphor in a silicone resin which has relatively high heat resistance and light resistance. However, in recent severe applications corresponding to the higher output and higher load of the light source using a semiconductor light emitting device such as a LED (light emitting diode) or a LD (laser diode), the resin used for the color conversion material has the risk of deterioration.

In view of such situation, LEDs and LDs which are free from the use of a resin and other organic substances have been put in practical use. These LEDs and LDs employ a wavelength (color) conversion ceramic material sintered into a plate prepared by solely using an inorganic phosphor or an inorganic phosphor with a transparent inorganic material for the color conversion material for high output, high lord applications.

In addition, various methods have been proposed as a method for producing a wavelength (color) conversion ceramic material solely of an inorganic material.

For example, there is described that a rare earth garnet phosphor which is an inorganic oxide, and in particular, a YAG (yttrium-aluminum-garnet) phosphor as a durable wavelength (color) conversion material (See JP 2004-146835A). While the production method is not disclosed in detail, the color conversion material is produced by preparing polycrystalline ceramics from a base material, and doping an activator which would be the luminescence center. Patent literature 1 discloses use of this polycrystalline ceramic member which is a color conversion material in combination with a semiconductor light emitting device.

There is described that a glass containing an inorganic phosphor for use as a wavelength (color) conversion material and its production method. Use of a YAG phosphor which is an oxide phosphor is mentioned as an example (See JP 2003-258308A).

There is described that a method for producing a light emitting ceramics for use as a wavelength (color) conversion member (See JP 2006-5367A). In this method, an inorganic phosphor is sintered at a high temperature and high pressure.

There is described that production of an inorganic color conversion glass sheet by preparing a sheet from a phosphor powder and a glass powder, and heating the sheet in a high temperature oven (See JP 2006-37097A). Patent literature 4 also discloses use of a low-melting glass having a melting point of up to 400° C. in producing the inorganic color conversion glass sheet from the phosphor of various compounds.

In addition, there is described that precipitation and development of a YAG phosphor from a melt of alumina and the like as a production method of a ceramic composite for light conversion (See JP 2006-169422A).

SUMMARY

According to one aspect of the present invention, a wave-length conversion inorganic member comprises abase body, and an inorganic particle layer on the base body. The inorganic particle layer includes particles of an inorganic wave-length conversion substance which is configured to absorb light of a first wave-length and to emit light of a second wave-length different from the first wave-length. The inorganic particle layer comprises an agglomerate of a plurality of the particles, wherein each of the plurality of the particles are in contact with at least one of the other particles or the base body. The inorganic particle layer comprises a cover layer comprising an inorganic material, and the cover layer continuously covers a surface of the base body and surfaces of the particles. The inorganic particle layer has an interstice enclosed by the particles, or by the particles and one of the base body and the cover layer.

According to another aspect of the present invention, a method for manufacturing a wave-length conversion inorganic member comprises an inorganic particle layer forming process for forming an agglomerate including a plurality of particles of an inorganic wave-length conversion substance which absorbs light of a first wave-length, and emits light of a second wave-length different from the first wave-length. A cover-layer forming process is for forming a cover layer comprising an inorganic material which continuously covers a surface of the substrate and surfaces of particles.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings.

FIG. 3A is the appearance after masking.

FIG. 3B is the appearance after phosphor deposition.

FIG. 3C is the appearance after cover layer formation.

FIG. 3D is the appearance after removing the mask.

FIG. 4 is a flow chart showing details of the cover layer formation process in the manufacturing method of the inorganic member according to the first embodiment.

FIG. 10A is the appearance after forming a reflective layer.

FIG. 10B is the appearance after forming a dielectric layer.

FIG. 10C is the appearance after masking.

FIG. 10D is the appearance after forming an electroconductive layer.

FIG. 11A is the appearance after phosphor deposition, FIG. 11B is the appearance after making the electroconductive layer transparent.

FIG. 11C is the appearance after forming a cover layer.

FIG. 11D is the appearance after removing the mask.

FIG. 14A is the appearance after forming an electroconductive layer.

FIG. 14B is the appearance after phosphor deposition.

FIG. 14C is the appearance after making the electroconductive layer transparent.

FIG. 14D is the appearance after forming a cover layer.

FIG. 17A is the appearance after masking.

FIG. 17B is the appearance after phosphor deposition.

FIG. 17C is the appearance after cover layer formation.

FIG. 17D is the appearance after removing the mask.

FIG. 34A is the view showing the constitution of the light emitting device having a protective layer.

FIG. 34B is the view showing the constitution of the light emitting device having a filler particles.

DESCRIPTION

Figure 1A:
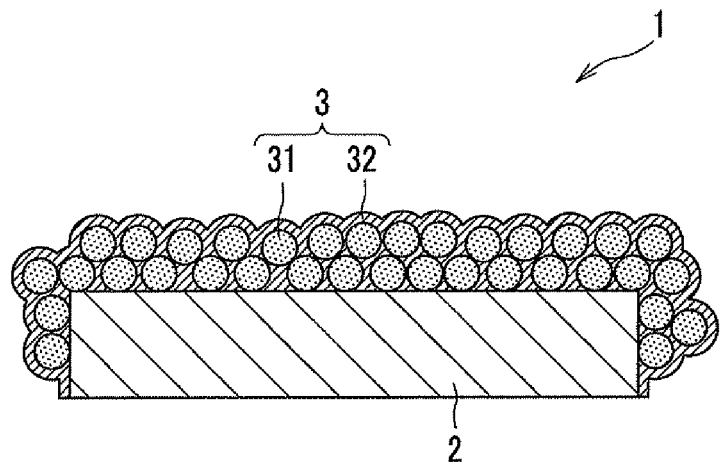
FIG. 1A is a schematic cross-sectional view showing constitution of an inorganic member according to first embodiment.

The embodiments will now be described with reference to the accompanying drawings, wherein like reference numerals designate corresponding or identical elements throughout the various drawings.

Next, the wave-length (wavelength) conversion inorganic member (hereinafter also referred to as "color conversion inorganic member" and abbreviated as "inorganic member", manufacturing method of the inorganic member, and a light emitting device prepared by using the inorganic member are described.

The wavelength conversion inorganic member comprises a base body and an inorganic particle layer, and the inorganic particle layer including particles of a wavelength conversion substance (color conversion substance) comprising an inorganic material. The inorganic particle layer comprises an agglomerate, a cover layer, and an interstice.

Because of such constitution, when a light of first wavelength (first color) enters into the inorganic particle layer, the light of the first wavelength is absorbed and converted by the wavelength conversion substance and to a light of second wavelength (second color) which is different from the first wavelength, and the light is thereby emitted. In this process, the light that has entered the inorganic particle layer is scattered by the interstice in the inorganic particle layer, and the wavelength conversion substance in the inorganic particle layer is efficiently exposed to the light of the first wavelength. As a consequence, the light of the first wavelength is efficiently absorbed by the particles of the wavelength conversion substance and converted to the light of the second wavelength.

The wavelength conversion substance is a material which absorbs the light of the first wavelength and emits the light of the second wavelength which is different from the first wavelength, and exemplary wavelength conversion substances include inorganic phosphors such as nitride phosphors and fluoride phosphors. In the inorganic particle layer, the particles of the wavelength conversion substance form an agglomerate wherein the particles are in contact with each other or with the base body, and the surface of the base body and the surface of the particles of the wavelength conversion substance are continuously covered by the cover layer comprising an inorganic material. In other words, thickness and shape of the inorganic particle layer which is the layer performing the wavelength conversion (color conversion) is determined by the thickness and shape of the agglomerate of the particles of the wavelength conversion substance. In addition, the interstice is also formed in the interior of the inorganic particle layer, and the interstice is enclosed by the particles, or by the particles and one of the base body and the cover layer.

The wavelength conversion inorganic member is produced by a method comprising the inorganic particle layer forming process and the cover layer forming process, which are conducted in this order.

In the inorganic particle layer forming process, the agglomerate including the particles of the wavelength conversion substance comprising the inorganic material which absorbs the light of the first wavelength and emits the light of the second wavelength which is different from the first wavelength are first formed on the base body. In other words, thickness and shape of the inorganic particle layer which is the layer performing the wavelength conversion are determined by thickness and shape of the agglomerate of the particles of the wavelength conversion substance.

Next, in the cover layer forming process, the cover layer comprising the inorganic material continuously covering the surface of the base body and the surface of the particles of the wavelength conversion substance is formed. In other words, the agglomerate retains their shape because they are covered by the cover layer, and the agglomerate and the base body are integrated into an inorganic member by the cover layer.

The thickness and the shape of the inorganic particle layer which is the layer performing the wavelength conversion can be designed with the agglomerate of the particles of the wavelength conversion substance covered with the cover layer and the interstice disposed in the interior, which allows the thickness and the shape to be freely designed. Such a constitution reduces thickness of the inorganic particle layer required for realizing the wavelength conversion efficiency of certain level. This is because content of the wavelength conversion substance in the inorganic particle layer can be increased and the wavelength conversion at a high efficiency is enabled by the scattering of the light with the pores in the interior of the inorganic particle layer. In addition, the inorganic particle layer is formed by using an inorganic material without using any organic material such as a resin, which reduces long term deterioration of the resulting wavelength conversion inorganic member even if the member is exposed to a bright light or high temperature.

The thickness and the shape of the inorganic particle layer which is the layer performing the wavelength conversion can be freely designed because the thickness and the shape of the inorganic particle layer is determined by the thickness and the shape of the agglomerate of the particles of the wavelength conversion substance. In addition, the member is formed by covering the agglomerate of the particles of the wavelength conversion substance with the cover layer, which increases content of the wavelength conversion substance in the inorganic particle layer, and enables the wavelength conversion at a high efficiency by the scattering of the light with the pores or interstices in the interior of the inorganic particle layer. Accordingly, this reduces the thickness of the inorganic particle layer required for realizing the wavelength conversion efficiency of certain level. In addition, the inorganic particle layer is formed by using an inorganic material without using any organic material such as a resin, which reduces long term deterioration of the resulting wavelength conversion inorganic member even if the member is exposed to a bright light or high temperature.

<First Embodiment>
[Constitution of the Inorganic Member]

Figure 1B:
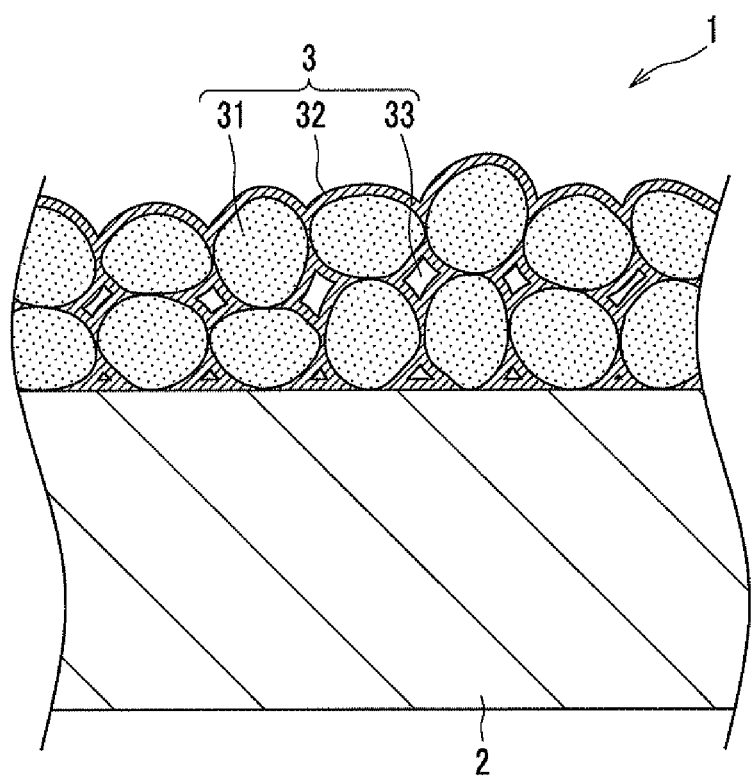
FIG. 1B is a partially enlarged view of FIG. 1A showing the constitution of the inorganic member according to the first embodiment.

Next, structure of the inorganic member according to the first embodiment is described by referring to FIGS. 1A and 1B.

An inorganic member 1 according to the first embodiment has a phosphor layer (an inorganic particle layer) 3 formed on the upper and side surfaces of a substrate 2 as a base body. The phosphor layer 3 is formed from a particulate inorganic phosphor (wave-length conversion substance) 31 and a cover layer 32 covering the inorganic phosphor 31. More specifically, the phosphor layer 3 has pores or interstices 33 formed therein.

The inorganic member 1 according to this embodiment uses a metal material for the substrate 2, and the upper and side surfaces of the substrate 2 function as reflective surfaces reflecting the light irradiated from the upper or the side direction. Accordingly, the inorganic member 1 of this embodiment functions as a reflective color conversion member which absorbs a part or all of the light entering from the upper or the side direction by the inorganic phosphor 31 of the phosphor layer 3 and converts the incident light to a light having a color different from the incident light, and reflects the converted light.

Next, elements of the inorganic member 1 are described in detail.

(Substrate (Base Body))

The substrate 2 is a metal plate member for supporting the phosphor layer 3. The substrate 2 may be prepared, for example, by using a metal which is solid at the temperature used in the cover layer forming process as described below such as Al (aluminum), Cu (copper), Ag (silver), an alloy containing such metal, or a laminate of such metal or alloy. In the present embodiment, the upper and the side surfaces of the substrate 2 where the phosphor layer 3 is disposed may preferably have a high reflectivity since these surfaces function as a reflective surface for the light that has entered the phosphor layer 3 and the light whose color has been converted by the phosphor layer 3.

The upper and side surfaces of the substrate 2 are preferably a high reflectivity surface and/or a high gloss surface prepared by mirror finishing or by provision of an optical thin film having a high reflectivity.

The substrate 2 may not be necessarily made solely from a metal, and the substrate 2 may include a substrate of glass, an inorganic compound, or carbon or diamond with high heat conductivity having a metal layer formed thereon.

The substrate 2 may be preferably made of a material having a high heat conductivity for efficient dissipation of the heat generated by Stokes loss of the light converted by the phosphor layer 3 through the substrate 2. For example, the material used for the substrate 2 may preferably have a heat conductivity of at least 5 W/m·K.

In the present embodiment, the term "light transmissible" means that the material allows passing of the light entering the inorganic member 1 (the light of the first color) and the light whose color has been converted by the inorganic member (the light of the second color) through the material.

(Phosphor Layer (Inorganic Particle Layer))

The phosphor layer 3 is an inorganic particle layer including an agglomerate of particles of the inorganic phosphor 31 covered with the cover layer 32 of an inorganic material. In this embodiment, the phosphor layer 3 is provided to cover the upper and the side surfaces of the substrate 2. The phosphor layer 3 is the layer having the color conversion function which absorbs apart or all of the light entering from the upper or side direction of the substrate 2 to emit light having a color different from the incident light.

As shown in FIG. 1B, the phosphor layer 3 includes the particles of the inorganic phosphor 31 covered by the cover layer 32 of an inorganic material, and the cover layer 32 firmly bonds the particles of the inorganic phosphor 31 and the substrate 2, and the particles to each other thereby forming an member wherein the particulate inorganic phosphor 31 are integrally formed with the substrate 2. The phosphor layer 3 has a concave and convex (uneven) surface which results from the various particle sizes of the inorganic phosphor 31. The phosphor layer 3 has therein the interstices (pores) 33 formed between the particles of the inorganic phosphor 31.

The light entering the phosphor layer 3 is scattered by the interstices 33, and the light is thereby efficiently absorbed by the inorganic phosphor 31 in the phosphor layer 3. Therefore, the phosphor layer 3 obtains a higher color conversion efficiency, compared with one without interstices 33. Accordingly, in order to obtain an equivalent color conversion efficiency, the phosphor layer 3 is allowed to be thinner than one without interstices 33.

The surface of the phosphor layer 3 has the concave and convex (uneven) surface resulting from the various particle sizes of the inorganic phosphor 31, and total reflection at the interface is reduced and this has enabled efficient extraction of the light from the phosphor layer 3. Accordingly, a high light emission efficiency is realized when a light emitting device is prepared by using this inorganic member 1 for the color conversion member.

The phosphor layer 3 may also contain an inorganic binder including a light-transmissible alkaline earth metal salt (not shown). The inorganic binder binds the inorganic phosphor 31 and the substrate and/or the inorganic phosphor 31 with each other. More specifically, the inorganic binder is added in the process of disposing the inorganic phosphor 31 on the substrate 2, and the inorganic binder prevents dissipation of the particles of the inorganic phosphor 31 until the particles of the inorganic phosphor 31 are secured to the substrate 2 or the particles of the inorganic phosphor 31 are secured to each other by the cover layer 32 of the inorganic material firmly bonding to the particles of the inorganic phosphor 31.

The phosphor layer 3 may also contain electroconductive particles such as an inorganic filler or a metal powder. For example, an inorganic filler may be added for scattering and diffusion of the light entering the phosphor layer 3 and efficiently conducting the heat due to the Stokes loss to the substrate 2 to thereby facilitate heat dissipation. Addition of the inorganic filler also enables adjustment of the content of the inorganic phosphor 31 in the phosphor layer 3. A shape of the interstice 33, the porosity as a density, and a concave and convex shape of the surface of the phosphor layer 3 may also be adjusted by the particle size and shape of the inorganic filler added.

Addition of the electroconductive particles also facilitates efficient conduction of the heat generated by the Stokes loss to the substrate 2 thereby improving the heat dissipation.

Exemplary inorganic fillers include aluminum nitride, barium titanate, titanium oxide, aluminum oxide, silicon oxide, silicon dioxide, heavy calcium carbonate, light calcium carbonate, silver, silica (fumed silica, precipitated silica, etc.), potassium titanate, barium silicate, glass fiber, and carbon, diamond, which may be used in combination of two or more.

The inorganic filler used may also mainly use a light transmissible material with low light absorption such as tantalum oxide, niobium oxide, or a rare earth oxide or an inorganic compound which reflects or absorbs the light having a certain wavelength.

The inorganic filler used may have a particle size equivalent to the inorganic phosphor 31.

The phosphor layer 3 is the layer prepared by integrating the agglomerates of the particles of the inorganic phosphor 31 by continuously covering the agglomerates with the cover layer 32, and additional layers, for example, a protective layer or an anti-reflection layer may also be disposed on the cover layer 32. In such a case, total thickness of the phosphor layer 3 from the upper surface of the substrate 2 to the upper surface of the phosphor layer 3 including the additional layers such as protective layer and the reflective layer is preferably in the range of approximately 10 μm to 300 μm.

Since the phosphor layer 3 is the agglomerates of the particles of the inorganic phosphor 31, the thickness of the phosphor layer 3 depends on the particle size. The thickness of the phosphor layer 3 substantially contributing for the color conversion, however, may be about 1 μm to 150 μm, preferably about 5 μm to 70 μm, and more preferably about 10 μm to 50 μm. "The phosphor layer substantially contributing for the color conversion" designates the layer prepared by integrating the agglomerates of the particles of the inorganic phosphor 31 by continuously covering the agglomerates with the cover layer 32, and not including the protective layer or the reflective layer.

The thickness of the phosphor layer 3 (the thickness of the phosphor layer substantially contributing for the color conversion and the total thickness) may be measured by using a scanning electron microscope.

Compared with conventional phosphor members including sintered ceramics, thickness of the phosphor layer 3 required for realizing the equivalent color conversion efficiency has been reduced by the increased content of the inorganic phosphor 31 in the phosphor layer 3 and by the presence of the interstices 33. Accordingly, the heat generated in the inorganic phosphor 31 in the phosphor layer 3 by Stokes loss can be rapidly conducted to the substrate 2 having the heat dissipation function. The high heat dissipation of the inorganic member 1 is thereby realized.

(Inorganic Phosphor (Wave-Length Conversion Substance))

The inorganic phosphor 31 is a phosphor including an inorganic material which absorbs the light entering the phosphor layer 3 to convert into and emit the light having a color different from the incident light.

The phosphor material used for the inorganic phosphor 31 may be any material as long as it can absorb the incident light which is the excitation light and convert the incident light to a light having a different color (wavelength) by color conversion (wavelength conversion). Preferably, the inorganic phosphor 31 is the one which absorbs ultraviolet light or blue light for conversion into a blue light or a red light.

The particles of the inorganic phosphor 31 are not limited for their average particle size. The average particle size however, is about 0.1 μm to 100 μm, and in view of the handling convenience, the average particle size is preferably about 1 μm to 50 μm, and more preferably about 2 μm to 30 μm.

The average particle size may be the one measured by air permeability method or F.S.S.S. No (Fisher-SubSieve-Sizer-No.) (the value expressed by the so called D bar (bar on D)).

When ratio of median diameter Dm measured by a laser diffraction particle size analyzer (for example, SALD series manufactured by Shimadzu.com) or an electrical resistance size analyzer (for example, Coulter counter manufactured by Beckman Coulter) to the average particle diameter D-bar, namely Dm/D-bar is used for the index of dispersibility of the particles of the inorganic phosphor 31, this index is preferably near 1. More specifically, dispersibility of the particles is higher (with no aggregation of the particles) when the index value is nearer to 1, and the phosphor layer 3 will enjoy reduced stress. This in turn results in the reduced crack generation in the phosphor layer 3.

The inorganic phosphor 31 may not necessarily include one type of phosphor, and a mixture of two or more inorganic phosphors 31 may also be used. Alternatively, two or more different layers of the particles of the inorganic phosphor 31 may be consecutively disposed.

Examples of the inorganic phosphor 31 used include those as described below.

Exemplary preferable inorganic phosphors 31 includes a nitride phosphor, an oxynitride phosphor, and a SIALON phosphor which are mainly activated, for example, by a lanthanoid series element such as Eu or Ce; an alkaline earth haloapatite phosphor, an alkaline earth metal haloborate phosphor, an alkaline earth metal aluminate phosphor, an alkaline earth silicate phosphor, an alkaline earth sulfide phosphor, an alkaline earth thiogallate phosphor, a thiosilicate phosphor, an alkaline earth silicon nitride phosphor, a germinate phosphor, an alkaline metal halosilicate phosphor, and an alkaline metal germanate phosphor which are mainly activated, for example, by a lanthanoid element such as Eu or a transition metal element such as Mn; and at least one member selected from rare earth aluminate phosphors, rare earth silicate phosphors, and the like which are mainly activated by a lanthanoid series element such as Ce. Non-limiting examples include the phosphors as described below, which by no means limit the scope of the present invention.

Exemplary nitride phosphors which are mainly activated by a lanthanoid series element such as Eu or Ce include $M_2Si_5N_8$:Eu and $MAlSiN_3$:Eu (wherein M is at least one member selected from Sr, Ca, Ba, Mg, and Zn), and also, $M_2Si_5N_8$:Eu as well as $MSi_7N_{10}$:Eu, $M_{1.8}Si_5O_{0.2}N_8$:Eu, and $M_{0.9}Si_7O_{0.1}N_{10}$:Eu (wherein M is at least one member selected from Sr, Ca, Ba, Mg, and Zn).

Exemplary oxynitride phosphors which are mainly activated by a lanthanoid series element such as Eu or Ce include $MSi_2O_2N_2$:Eu (wherein M is at least one member selected from Sr, Ca, Ba, Mg, and Zn).

Exemplary SIALON phosphors which are mainly activated by a lanthanoid series element such as Eu or Ce include $M_1p/2_1Si_112-p-q_1Al_1p+q_1O_1q_1N_116-p_1$:Ce, and M-Al—Si—O—N (wherein M is at least one member selected from Sr, Ca, Ba, Mg, and Zn, q is 0 to 2.5, and p is 1.5 to 3.

Exemplary alkaline earth haloapatite phosphors which are mainly activated by a lanthanoid element such as Eu or a transition metal element such as Mn include $M_5(PO_4)_3X$:R (wherein M is at least one member selected from Sr, Ca, Ba, Mg, and Zn, X is at least one member selected from F, Cl, Br, and I, and R is any one of Eu, Mn, and Eu and Mn).

Exemplary alkaline earth metal haloborate phosphors include $M_2B_5O_19_1X$:R (wherein M is at least one member selected from Sr, Ca, Ba, Mg, and Zn, X is at least one member selected from F, Cl, Br, and I, and R is any one of Eu, Mn, and Eu and Mn).

Exemplary alkaline earth metal aluminate phosphors include $SrAl_2O_4$:R, $Sr_4Al_114_1O_125_1$:R, $CaAl_2O_4$:R, $BaMg_2Al_116_1O_127_1$:R, $BaMg_2Al_116_1O_{12}$:R, and $BaMgAl_110_1O_117_1$:R (wherein R is any one of Eu, Mn, and Eu and Mn).

Exemplary alkaline earth metal silicate phosphors include $M_2SiO_4$:Eu (wherein M is at least one member selected from Ca, Sr, Ba, Mg, and Zn).

Exemplary alkaline earth sulfide phosphors include $La_2O_2S$:Eu, $Y_2O_2S$:Eu, and $Gd_2O_2S$:Eu.

Exemplary alkaline metal halosilicate phosphors include those represented by compositional formulae of $MSiX_6$:Mn (wherein M is at least one member selected from Li, Na, and Km, X is at least one member selected from F, Cl, Br, and I, and Si may be partly substituted with Ge), $Li_2SiF_6$:Mn, and $K_2(SiGe)F_6$:Mn.

Exemplary rare earth aluminate phosphors which are activated mainly by a lanthanoid series element such as Ce include YAG phosphors represented by the compositional formulae of $Y_3Al_5O_{12}$:Ce, $(Y_{0.8}Gd_{0.2})_3Al_5O_{12}$:Ce, $Y_3(Al_{0.8}Ga_{0.2})_5O_{12}$:Ce, and $(Y,Gd)_3(Al,Ga)_5O_{12}$:Ce. Also included are $Tb_3Al_5O_{12}$:Ce, $Lu_3Al_5O_{12}$:Ce and the like wherein a part or all of Y is substituted with Tb, Lu, and the like.

Examples of other phosphors include MS:Eu, $Zn_2GeO_4$:Mn, $0.5MgF_2.3.5MgO.GeO_2$, and $MGa_2S_4$:Eu (wherein M is at least one member selected from Sr, Ca, Ba, Mg, and Zn). These phosphors may have at least one member selected from Tb, Cu, Ag, Au, Cr, Nd, Dy, Co, Ni, and Ti added for substitution of the Eu or further addition.

Also, a phosphor other than those as described above but having equivalent performance and effects may also be used.

The phosphor used may be the one which will have the emission spectrum of yellow, red, green, or blue when exposed to the excitation light from the light emitting device, or the one with the emission spectrum of an intermediate color such as yellow, blue-green, or orange. Use of these phosphors in adequate combination enables manufacturing of a light-emitting device which can emit lights with various colors.

For example, a phosphor of $Y_3Al_5O_{12}$:Ce or $(Y_{0.8}Gd_{0.2})_3Al_5O_{12}$:Ce may be irradiated by using GaN or InGaN compound semiconductor light emitting device which emits blue light for the light source to thereby conduct the color conversion, and a light-emitting device emitting a white light may be provided by mixing the light from the light emitting device and the light from the phosphor.

Another example is light-emitting device emitting a white light having excellent color rendering property which is realized by using three types of phosphors, namely, $CaSi_2O_2N_2$:Eu or $SrSi_2O_2N_2$:Eu emitting green to yellow light, $(Sr,Ca)_5(PO_4)_3Cl$:Eu emitting blue light, and $Ca_2Si_5N_8$:Eu or $CaAlSiN_3$:Eu emitting red light. In this case, red, blue, and green, which are the three primary colors of light, are used, and therefore any desired white light can be realized by changing the blend ratio of the phosphor.

The exemplary phosphors of the inorganic phosphor 31 as mentioned above include those wherein the host is easily decomposed or the activator is easily inactivated by heat as in the case of the non-oxide phosphors such as sulfide phosphors, halogen silicate phosphors, nitride phosphors, and oxynitride phosphors and those which are easily deteriorated by the atmosphere through deliquescence by moisture as in the case of the fluoride phosphors.

In this embodiment, phosphors which are easily deteriorated by heat, for example, $CaAlSiN_3$:Eu (abbreviated as CASN) (a non-oxide phosphor) and $(Sr,Ca)AlSiN_3$:Eu (abbreviated as SCASN) (a nitride phosphor) may also be used in the formation of the inorganic member 1 since the phosphor is not heated to a high temperature as in the case of sintering or glass encapsulation.

In this embodiment, phosphors which are easily deliquesced by moisture, for example, fluoride phosphors such as $LiSiF_4$:Mn may also be used since the inorganic phosphor 31 is preferably compactly covered with the cover layer 32 formed by the atomic layer deposition as described below.
(Cover Layer)

The cover layer 32 is a light transmissible film which covers the particles of the particulate inorganic phosphor 31 while maintaining the bonding of such particles with the substrate 2 and the bonding of such particles with each other. In other words, the cover layer 32 has the function as a protective layer of the inorganic phosphor 31, the function of a binder, and the function of a heat conduction pathway.

The cover layer 32 is preferably fabricated by using at least one compound selected from the group consisting of $Al_2O_3$, $SiO_2$, $ZrO_2$, $HfO_2$, $TiO_2$, ZnO, $Ta_2O_5$, $Nb_2O_5$, $In_2O_3$, $SnO_2$, TiN, and AlN, and the cover layer 32 may be deposited by ALD (Atomic Layer Deposition), MOCVD (Metal Organic Chemical Vapor Deposition), PECVD (Plasma-Enhanced Chemical Vapor Deposition), atmospheric pressure plasma process, or the like.

Of these methods, a preferred one is use of ALD since the film formed is highly compact, surface unevenness is highly covered, and the film formed has consistent thickness. The cover layer 32 formed by ALD, even if the layer formed is a thin film, is capable of adequately covering the particles of the inorganic phosphor 31 and integrally holding the agglomerates of the particles of the inorganic phosphor 31, and accordingly, the phosphor layer 3 can be formed to have a reduced thickness. This in turn facilitates conduction of the heat generated in the particles of the inorganic phosphor 31 by Stokes loss to the substrate 2 having the heat dissipation function through the thin cover layer 32, and manufacturing of an inorganic member 1 having exhibiting good heat dissipation exhibiting excellent heat dissipation is thereby enabled. For realizing good heat dissipation, the phosphor layer 3 may preferably have the thickness as described above, and the cover layer 32 may preferably have the thickness as described below.

The material used for the formation of the cover layer 32 by ALD include organic metal materials, metal halide compounds, and the like having a vapor pressure of room temperature to up to 300° C. A film of $Al_2O_3$ prepared by ALD is particularly preferable in view of barrier property for atmosphere such as moisture. The materials used for the $Al_2O_3$ film are TMA (trimethyl aluminum) and water.

The cover layer 32 may have an average thickness of 10 nm to 50 μm, preferably 50 nm to 30 μm, and more preferably 100 nm to 10 μm.

The thickness of the cover layer 32 is the thickness of the part where the cover layer 32 uniformly covers the particles of the inorganic phosphor 31 (when inorganic filler and the like are added, the particles of the inorganic phosphor 31 and the inorganic filler and the like).

The cover layer 32 may be formed as a single layer film of the compound as described above, or as a multi-layer film of different materials. In the case of a multi-layer film, for example, a compact layer may be formed by the ALD as the first layer (the layer in contact with the inorganic phosphor 31), and the second layer may be formed by a method such as PECVD or atmospheric pressure plasma process with a higher film deposition speed.
(Interstice)

The interstice 33 is formed as a gap between the particles of the inorganic phosphor 31 deposited on the substrate 2. In other words, the interstice 33 is a space surrounded by any one of the substrate 2, the inorganic phosphor 31, and the cover layer 32. When the phosphor layer 3 also contains particles of an inorganic filler or electroconductive particles other than the inorganic phosphor 31, the interstice 33 is formed as a gap between the particles including the inorganic phosphor 31.

The interstice 33 scatters the light that has entered the phosphor layer 3 to facilitate efficient absorption of the incident light by the inorganic phosphor 31. The porosity or density is preferably in the range of about 1% to 50%, and more preferably 5% to 30%. While optimal density depends on the particle size of the inorganic phosphor 31 and thickness of the cover layer 32, the density of 1% or higher realizes effective scattering of the incident light and the density of up to 50% enables inclusion of the inorganic phosphor 31 at an amount sufficient for the color conversion even if the thickness of the phosphor layer 3 is further reduced.

When the interstices 33 having the density within such range are provided, the stress generated in the member by increase in the temperature during the manufacturing process or in the use after the manufacturing is absorbed even if difference in coefficient of linear expansion between the substrate 2 and the phosphor layer 3 is large, and occurrence of cracks is thereby prevented.

The porosity or density of the phosphor layer 3 may be controlled by adjusting the average particle size of the inorganic phosphor 31 and the thickness of the cover layer 32 within the range as described above. In other words, desired density can be realized by determining the film thickness of the cover layer 32 depending on the average particle size of the inorganic phosphor 31. When an inorganic filler is added to the phosphor layer 3, the density may be controlled by the average particle size of both the particles of the inorganic phosphor 31 and the inorganic filler particles and the thickness of the cover layer 3. The control of the density is preferably accomplished by further taking shape and dispersibility of the particles in consideration.

(Filler Material of the Interstice)

If desired, the interstice 33 may be filled with a filler material, and the filler material is preferably an air layer (a gas mixture of $N_2$, $O_2$, $CO_2$, and the like). The filler material is not limited, and a solid such as an inorganic compound (for example, AlOOH or SiOx), an inorganic material (for example, polysilazane), a glass, or an inorganic nanoparticles may constitute some or all of the material. The materials used for preparing such solid filler material include a liquid containing an inorganic compound such as liquid glass material and sol-gel materials. The liquid containing an inorganic compound as described above may be prepared by using a solvent such as water or an organic solvent, or a resin mainly made of an inorganic substance such as silicone or fluororesin.

The solid filler material filled in the interstices 33 may contain a material which is the same as the material which constitutes the cover layer 32. In this case, the cover layer 32 and the filler material of the interstice 33 may preferably have different physical properties including refractive index and transmittance. For this purpose, for example, the cover layer 32 may be formed by using $Al_2O_3$ formed by ALD, and $Al_2O_3$ formed by sol-gel process may be used for the filler material of the interstices 33. Differences in the manufacturing process leads to difference in the crystallinity and density, and hence, differences in the physical properties as described above.

As described above, diffusion and extraction of the light entering the phosphor layer 3 can be controlled by the filling of the interstices 33 with a material having physical properties different from the cover layer 32.

[Manufacturing Method of the Inorganic Member]

Figure 2:
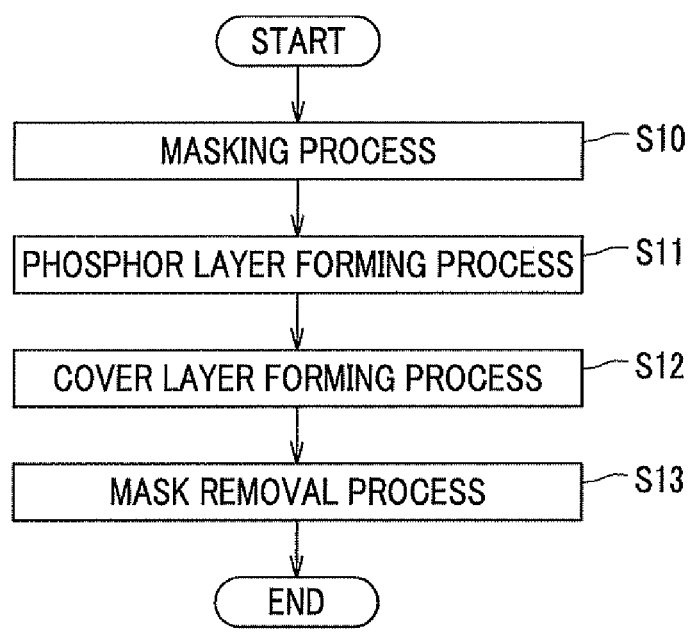
FIG. 2 is a flow chart showing a manufacturing method of the inorganic member according to the first embodiment.

Next, manufacturing method of the inorganic member according to the first embodiment is described by referring to FIG. 2.

The manufacturing method of the inorganic member according to the first embodiment includes masking process S10, the phosphor layer forming process S11, the cover layer forming process S12, and the mask removal process S13, which are conducted in this order.

Next, each process is hereinafter described in detail by referring to FIGS. 3A to 3D (and if desired, also FIGS. 1A, 1B, and 2).

(Masking Process)

Figure 3A:
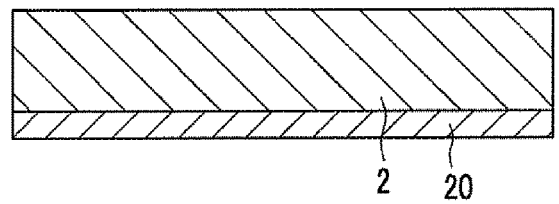
FIG. 3A is a schematic cross-sectional view for explaining a manufacturing process of the inorganic member according to the first embodiment.

First, in the masking process S10, the substrate 2 is covered by attaching a masking member 20 in the area where the phosphor layer 3 is not to be formed, as shown in FIG. 3A. In this embodiment, lower surface of the substrate 2 is covered with the masking member 20.

The masking member 20 used may be a pressure sensitive tape or a pressure sensitive sheet of a resin such as polyimide, polytetrafluoroethylene, or polyolefin. Alternatively, the masking may be conducted by coating a resin material such as an acryl resin, a silicone resin, or an epoxy resin, or by the patterning using a resin masking member 20 for the photoresist. The masking using a photolithography technique is useful when the substrate 2 is covered in a fine shape. An adequate masking material and process may be selected according to the temperature and atmosphere used as well as the object of the masking.

In this embodiment, the lower surface of the substrate 2 is covered with the masking member 20 to thereby form the phosphor layer 3 on the upper and side surfaces of the substrate 2. However, the phosphor layer 3 may be formed in any desired area by changing the area covered by the masking member 20.

(Phosphor Layer Forming Process (Inorganic Particle Layer Forming Process))

Figure 3B:
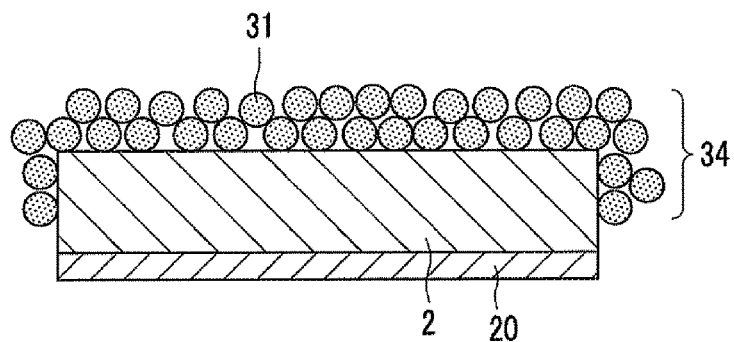
FIG. 3B is a schematic cross-sectional view for explaining a manufacturing process of the inorganic member according to the first embodiment.
Figure 3C:
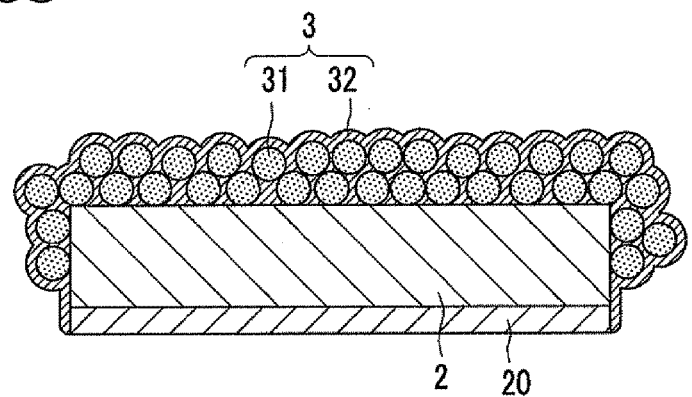
FIG. 3C is a schematic cross-sectional view for explaining a manufacturing process of the inorganic member according to the first embodiment.

Next, in the phosphor layer forming process S11, a layer 34 of the particles which are the agglomerates of the inorganic phosphor 31 is formed on the upper and the side surfaces of the substrate 2 as shown in FIG. 3B. In this embodiment, the particle layer 34 of the inorganic phosphor 31 is formed by electrodeposition.

When inorganic particles such as inorganic filler particles or electroconductive particles are added to the phosphor layer 3, the particle layer 34 includes the agglomerates of the particles of the inorganic phosphor 31 and the inorganic particles.

In the electrodeposition, the substrate 2 which is one electrode and a counter electrode which is another electrode are immersed in a dispersion of the particulate inorganic phosphor 31 in an electrodeposition tank at room temperature, and a voltage is applied between the electrodes. The voltage of the polarity different from the polarity which the inorganic phosphor 31 is charged is applied to the side of the substrate 2 to thereby deposit the particles of the inorganic phosphor 31 on the substrate 2 by electrophoresis. Thickness of the particle layer 34 of the inorganic phosphor 31 may be controlled by adjusting electric quantity in coulomb determined by the electric current and time of the electrodeposition.

The solvent used in the electrodeposition is not particularly limited. Exemplary solvents include alcohol solvents such as IPA (isopropyl alcohol).

An inorganic binder is preferably added to the dispersion for the binding of the particles of the inorganic phosphor 31 with the substrate 2 and the particles of the inorganic phosphor 31 with each other. The inorganic binder is added to thereby prevent dissipation of the particles of the inorganic phosphor 31 deposited by the electrodeposition until the cover layer 32 is formed in the subsequent cover layer forming process S12. The inorganic binder used may be an alkaline earth metal ion such as Mg ion, Ca ion, or Sr ion. The alkaline earth metal ion added deposits as a hydroxide or a carbonate to function as a binder. Since the deposited hydroxide and carbonate salt are colorless and transparent, the color conversion efficiency is not affected even if these hydroxide and carbonate remain in the finished phosphor layer 3. In addition, the color conversion efficiency is not adversely affected with passage of time since the hydroxide and carbonate are inorganic substances.

An antistatic agent such as a metal salt is also added to the dispersion to facilitate efficient electrophoresis of the inorganic phosphor 31. Alternatively, the antistatic agent may be coated on the particles of the inorganic phosphor 31 instead of adding to the dispersion.

In this embodiment, the particle layer 34 of the inorganic phosphor 31 is formed in the phosphor layer forming process S11 by the electrodeposition. The method used is not limited, and electrostatic coating, for example, may be used by using the substrate 2 for one electrode. In addition, centrifugal sedimentation is applicable when the phosphor layer 3 is formed on the upper surface of the substrate 2.

Other applicable methods include pulsed spraying, and combination of any of the methods as described above.

(Cover Layer Forming Process)

Next, in the cover layer forming process S12, the cover layer 32 is formed to cover the particle layer 34 of the inorganic phosphor 31 formed in the phosphor layer forming process S11 and to securely bond the particles with each other. In this cover layer forming process S12, the cover layer 32 may be formed by ALD, MOCVD, or the like.

After the cover layer forming process S12, a layer of an inorganic material such as $SiO_2$ film may be formed on the surface of the phosphor layer 3 as a protective layer or a non-reflective coating layer. This layer may be formed, for example, by a method such as sputtering, CVD, ALD, and atmospheric pressure plasma process.

When a solid is filled as a filler material other than the air layer in the interstice 33, the process as described below may be carried out subsequent to the cover layer forming process S12. By the way, the interstice 33 immediately after the cover layer forming process S12 is filled with air.

The solid filler material may be provided by filling a dispersion of the solid in a solvent (a solid-containing liquid) in the interstice 33, volatilizing the solvent, and heating at a low temperature for solidification. For example, a solid-containing liquid such as solid glass or sol-gel material is supplied by dripping or coating of the solid-containing liquid on the phosphor layer 3 followed by pressure reduction to thereby remove the air filled in the interstice 33 from the interstice 33 and simultaneous filling of the interstice 33 with the solid-containing liquid. When the temperature is subsequently elevated to a temperature allowing volatilization of the solid-containing liquid, the solid filler material is filled in the interstice 33. The temperature used for volatilizing the solvent is preferably a relatively low temperature of up to about 300° C.

(Mask Removal Process)

Figure 3D:
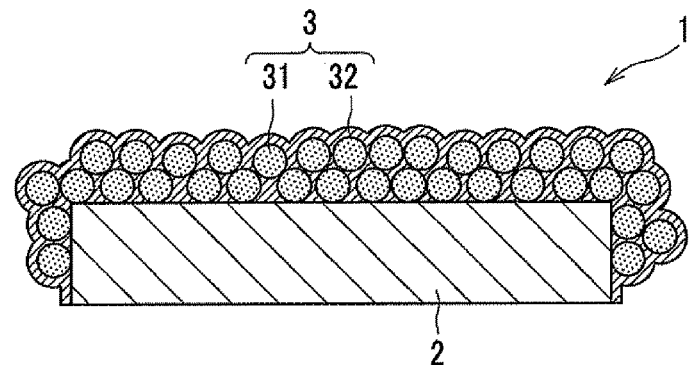
FIG. 3D is a schematic cross-sectional view for explaining a manufacturing process of the inorganic member according to the first embodiment.

Finally, the masking member 20 is removed in the mask removal process S13 as shown in FIG. 3D to thereby obtain an inorganic member 1 having a phosphor layer 3 formed on the upper and side surfaces of the substrate 2.

After the cover layer forming process S12, a layer of an inorganic material such as $SiO_2$ film may be formed on the surface of the phosphor layer 3 as a protective layer or a non-reflective coating layer. This layer may be formed, for example, by a method such as sputtering, CVD, ALD, and atmospheric pressure plasma process.

When a solid is filled as a filler material other than the air layer in the interstice 33, the process as described below may be carried out subsequent to the cover layer forming process S12. By the way, the interstice 33 immediately after the cover layer forming process S12 is filled with air.

The solid filler material may be provided by filling a dispersion of the solid in a solvent (a solid-containing liquid) in the interstice 33, volatilizing the solvent, and heating at a low temperature for solidification. For example, a solid-containing liquid such as solid glass or sol-gel material is provided by dripping or coating of the solid-containing liquid on the phosphor layer 3 followed by pressure reduction to thereby remove the air filled in the interstice 33 from the interstice 33 and simultaneous filling of the interstice 33 with the solid-containing liquid. When the temperature is subsequently elevated to a temperature allowing volatilization of the solid-containing liquid, the solid filler material is filled in the interstice 33. The temperature used for volatilizing the solvent is preferably a relatively low temperature of up to about 300° C.

(Cover Layer Forming Process by ALD)

Next, the cover layer forming process S12 conducted by ALD is described in detail by referring to FIG. 4. The cover layer forming process S12 in this embodiment includes a prebaking process S121, a specimen installing process S122, a storing process S123 before the film formation, a first material supplying process S124, a first discharge process S125, a second material supplying process S126, and a second discharge process S127, and the process S of the first material supplying process S124 to the second discharge process S127 are repeated for predetermined number of times.

(Prebaking Process)

First, in the prebaking process S121, a specimen wherein the substrate 2 has the particle layer 34 of the inorganic phosphor 31 formed on its upper and side surfaces is subjected to baking by heating in an oven.

In this embodiment, $H_2O$ (water) is used as a first material and TMA (trimethyl aluminum) is used as a second material, and an $Al_2O_3$ film is formed as the cover layer 32. Accordingly, moisture and other components in the specimen are preferably removed as far as possible by evaporation before the film deposition to thereby enable adequate film deposition.

The baking may be carried out, for example, by heating the specimen in an oven at 120° C. for about 2 hours.

(Specimen Placement Process)

Next, in the specimen placement process S122, the specimen is placed in a reaction vessel (not shown) for the subsequent deposition of the cover layer 32. This reaction vessel is connected to a first material supplying line, a second material supplying line, a nitrogen gas supplying line, and a vacuum line (all not shown).

(Storage Process Before the Film Formation)

Next, in the storage process S123 before the film formation, pressure of the interior of the reaction vessel storing the specimen is reduced by a rotary pump connected by a vacuum line to thereby stabilize conditions in the interior of the reaction vessel. Simultaneously, nitrogen gas is introduced in the reaction vessel to discharge air and other unnecessary components from the reaction vessel.

The pressure in the reaction vessel is reduced, for example, to the range of about 0.1 torr to 10 torr (133 Pa to 13332 Pa), and the nitrogen gas is introduced at a flow rate of about 20 sccm ($33 \times 10^{-3}$ Pa·m³/s). This condition is maintained for about 10 minutes for the stabilization.

The temperature in the reaction vessel may be maintained, for example, at about 100° C., and the film deposition temperature may be freely selected in the range of 50° C. to 500° C. The temperature after the start of the film deposition is typically maintained at the same level. However, it is also possible to design the process so that the temperature is changed in the course of the film deposition.

As described above, the temperature during the film deposition may be adequately determined, and more specifically, the temperature is preferably within the range of about 50° C. to 500° C. and more preferably 100° C. to 200° C. in view of the heat resistance of the inorganic phosphor 31. The film deposition by ALD can be conducted at a lower temperature than the film deposition by molding, sintering, or MOCVD, and manufacturing of the inorganic member 1 using the red light-emitting inorganic phosphor 31 of CASN, SCASN, or the like with low heat resistance is thereby enabled.

(First Material Supplying Process)

Next, in the first material supplying process S124, $H_2O$ which is the first material is introduced in the reaction vessel. The $H_2O$ is introduced in the form of vapor at normal temperature. After the introduction of the H₂O, the operation is stopped for a predetermined time until the TMA has spread over the entire surface of the specimen so that the reaction proceeds on the entire surface of the specimen. The H₂O is introduced to the reaction vessel in a quite short period compared to the time required for the first material supplying process S124, for example, in 0.001 to 1 second.

The time required for the introduction of the material may be adequately determined according to surface area of the specimen, volume of the device, and amount of the material introduced per unit time. After the introduction of the material, that is, H₂O, the reaction is allowed to proceed for a time necessary for the completion of the reaction of the entire surface of the specimen.

(First Discharge Process)

Next, in the first discharge process S125, a vacuum line is connected to the reaction vessel, and simultaneously, nitrogen gas is introduced in the reaction vessel to discharge the excessive H₂O which failed to contribute for the reaction and the side products from reaction vessel. The side product in this process is methane gas.

(Second Material Supplying Process)

Next, in the second material supplying process S126, TMA which is the second material is introduced in the reaction vessel, and the TMA is introduced in the form of vapor at normal temperature. After the introduction of the TMA, the operation is stopped for a predetermined time until the TMA has spread over the entire surface of the specimen. The introduction of the TMA may be conducted in the same manner as the H₂O as described above.

The time required for the introduction of the material may be adequately determined according to surface area of the specimen, volume of the device, and amount of the material introduced per unit time. After the introduction of the material, that is, TMS, the reaction is allowed to proceed for a time necessary for the completion of the reaction of the entire surface of the specimen.

(Second Discharge Process)

Next, in the second discharge process S127, a vacuum line is connected to the reaction vessel, and simultaneously, nitrogen gas is introduced in the reaction vessel to discharge the excessive TMA which failed to contribute for the reaction and the side products from reaction vessel.

In the film deposition process of this embodiment, the first material supplying process S124 to the second discharge process S127 constitute basic cycle of the film deposition, and this basic cycle is repeated for a predetermined number of times. Accordingly, whether the predetermined number of the cycle has been completed or not is determined (in process S128) after the completion of the second discharge process S127, and if the predetermined number of the cycle is not completed ("No" in process S128), the process goes back to the first material supplying process S124 to repeat the cycle as described above. On the other hand, when the predetermined number of the cycle is completed ("Yes" in process S128), the cover layer forming process is completed.

In the case of the ALD, one basic cycle of the film deposition results in the deposition of the one atomic layer of the cover layer 32. This in turn means that the thickness of the cover layer 32 can be freely controlled by selecting the number of the basic cycle repeated.

In other words, the cover layer 32 is deposited by repeatedly depositing the atomic layer one by one, and therefore, the stepped part of the surface such as projection, depression, and other surface unevenness is sufficiently covered by the cover layer 32. The resulting cover layer 32 is a compact film having a uniform thickness with extremely reduced number of pin holes.

Provision of the cover layer 32 having an adequate thickness also prevents complete filling of the gaps of the particles of the inorganic phosphor 31, and the interstices 33 (see FIG. 1B) are left in the phosphor layer 3.

The compact cover layer 32 formed by ALD uniformly covers the particles of the inorganic phosphor 31, and therefore, use of a phosphor such as fluoride phosphor which is subject to deterioration by moisture is enabled.

It is to be noted that, when a phosphor such as fluoride phosphor which is easily deteriorated by moisture is used in the manufacturing of the inorganic member 1, the inorganic member 1 is preferably produced by preliminarily providing the surface of the particles of the inorganic phosphor 31 with a water-resistant coating by various coating method; forming the particle layer 34 on the surface of the substrate 2 in a short time by using the inorganic phosphor 31 provided with the water-resistant coating by electrodeposition, electrostatic coating, or the like; and depositing the cover layer 32 by ALD to form an integrate bulk of the substrate 2 and the particle layer 34 to thereby produce the inorganic member 1 while preventing the adverse effects of the moisture in the manufacturing process. The inorganic member 1 produced by this procedure is less likely to undergo the deterioration since it is well-protected from the atmosphere including the moisture by the cover layer 32.

<Modification of the First Embodiment>

Next, constitution of the inorganic member according to the modification of the first embodiment is described by referring to FIG. 5.

The inorganic member 1 according to the first embodiment shown in FIG. 1 includes the plate substrate 2 and a phosphor layer 3 on the substrate 2. In this embodiment, the phosphor layer 3 is formed by attaching the particulate inorganic phosphor 31 to the substrate 2 and securing the particulate inorganic phosphor 31 by the cover layer 32, and accordingly, the substrate 2 is not substantially limited for its shape.

Figure 5A:
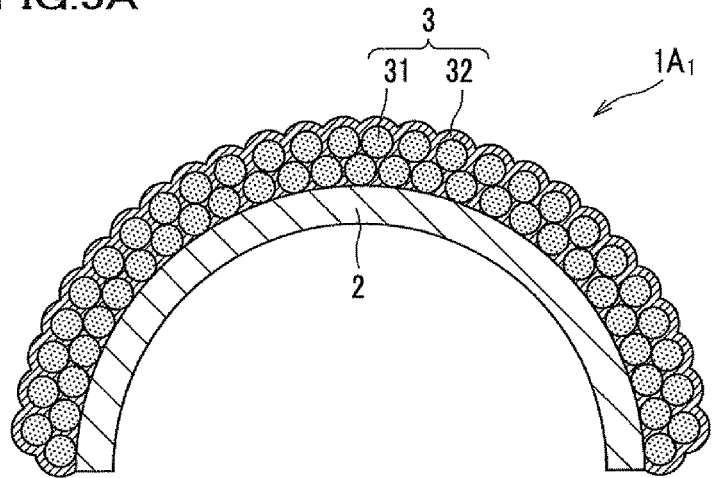
FIG. 5A is a schematic cross-sectional view showing constitution of a dome-shape inorganic member according to a modification of the first embodiment.
Figure 5B:
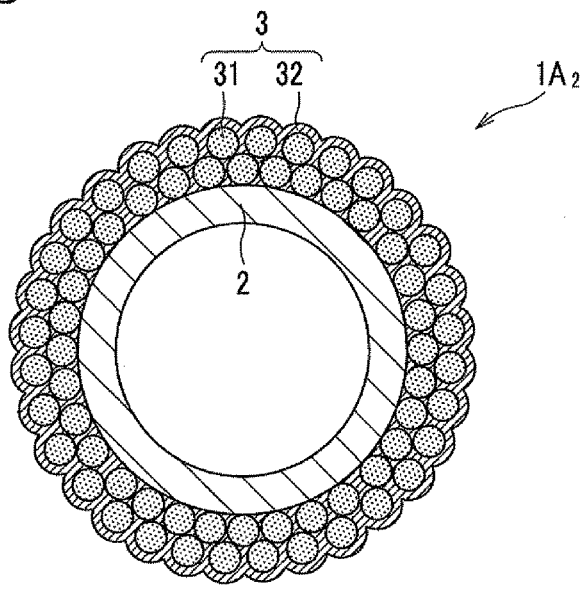
FIG. 5B is a schematic cross-sectional view showing constitution of a tube-shape inorganic member according to a modification of the first embodiment.
Figure 5C:
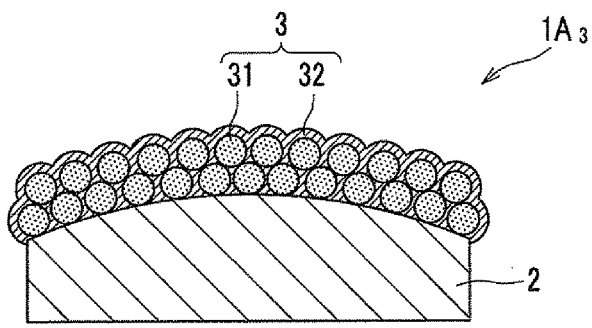
FIG. 5C is a schematic cross-sectional view showing constitution of a lens-shape inorganic member according to a modification of the first embodiment.

For example, the inorganic member $1A_1$ shown in FIG. 5A includes a dome-shaped (semispherical) substrate 2 and a phosphor layer 3 formed on the surface of the substrate 2. The inorganic member $1A_2$ shown in FIG. 5B includes a tubular substrate 2 and a phosphor layer 3 formed on the surface of the substrate 2. The inorganic member $1A_3$ shown in FIG. 5C includes a convex lens-shaped substrate 2 and a phosphor layer 3 formed on the convex surface of the substrate 2. Shape of the substrate 2 is not limited to such embodiments, and a substrate 2 having even more complicated shape may also be used. Indication of the interstices 33 is omitted in the embodiment shown in FIG. 5.

Other modifications include provision of the phosphor layer 3 on a substrate (substrate) in the shape of wire or net.

The inorganic members $1A_1$ to $1A_3$ according to this modification can be produced by a method similar to the inorganic member 1 according to the first embodiment except that the substrate 2 is different from the inorganic member 1. Accordingly, explanation of the manufacturing method is omitted.

<Second Embodiment>

Next, the inorganic member according to the second embodiment is described.

[Constitution of the Inorganic Member]

Figure 6:
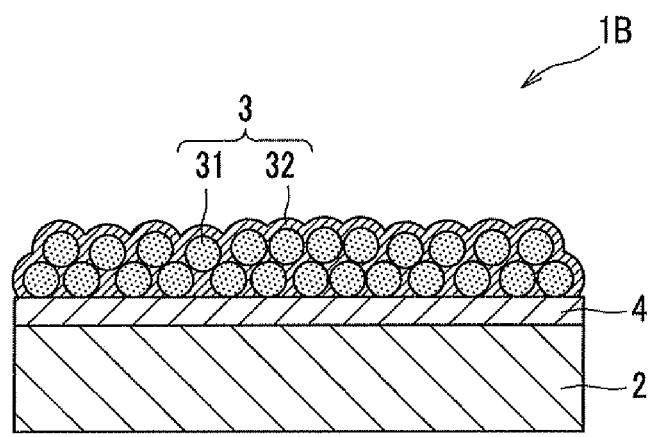
FIG. 6 is a schematic cross-sectional view showing constitution of an inorganic member according to second embodiment.

First, constitution of the inorganic member according to the second embodiment is described by referring to FIG. 6. The inorganic member 1B according to the second embodiment includes the substrate 2, a reflective layer 4 on the upper surface of the substrate 2, and the phosphor layer 3 above the substrate 2 with the intervening reflective layer 4. The inorganic member of this embodiment is similar to the inorganic member 1 according to the first embodiment shown in FIG. 1 except that the reflective layer 4 is provided, and that the phosphor layer 3 is provided only on the upper surface of the substrate 2. Description of the same constituents is omitted by using the same reference numeral. Indication to the interstice 33 is omitted in FIG. 6.

(Reflective Layer)

In this embodiment, a metal layer having a reflectance to the light introduced in the phosphor layer 3 for the purpose of the color conversion and the light whose color has been converted by the phosphor layer 3 higher than that of the material constituting the substrate 2 is formed on the upper surface of the substrate 2 as a reflective layer 4. Preferable examples of such metal having a high reflectance to the light in visible light range include Al, Ag, and alloys containing such metal. The substrate 2 may be prepared by using a metal as in the case of the inorganic member 1 according to the first embodiment.

In addition, when Cu having a high heat conductivity is used for the substrate 2, and Al or Ag having a high reflectance is used for the reflective layer 4, the heat dissipation and the color conversion efficiency can be improved at once. The reflective layer 4 is not limited to the one including single layer, and the one having a multi layer structure may also be used. In addition, an intermediate layer may be formed between the substrate 2 and the reflective layer 4 to improve the bonding of the substrate 2 and the reflective layer 4.

The inorganic member 1B according to this embodiment may also be used as a reflective-type color conversion member wherein color of the light introduced from upper direction in FIG. 6 is converted in the phosphor layer 3, and reflected upward by the reflective layer 4 for the emission of the color converted light from the inorganic member 1B.

In this embodiment, the substrate 2 is not limited to the one made of a metal since the reflective layer 4 is provided, and the inorganic member 1B which is used as a reflective-type color conversion member can be produced by providing the substrate 2 of a light transmissible material such as a glass or resin.

The phosphor layer 3 is similar to the phosphor layer 3 in the inorganic member 1 according to the first embodiment, and accordingly, detailed explanation of the phosphor layer 3 is omitted.

In this embodiment, the phosphor layer 3 is provided above the upper surface of the substrate 2 with the intervening reflective layer 4. The provision of the phosphor layer 3 is not limited to this embodiment, and the phosphor layer 3 may be provided above the upper and side surfaces, above the lower surface, or above a part of the upper surface of the substrate 2 with the intervening reflective layer 4. In addition, the shape of the substrate 2 is not limited to the plate shape, and as shown in FIG. 5, the substrate may have any desired shape.

Figure 7:
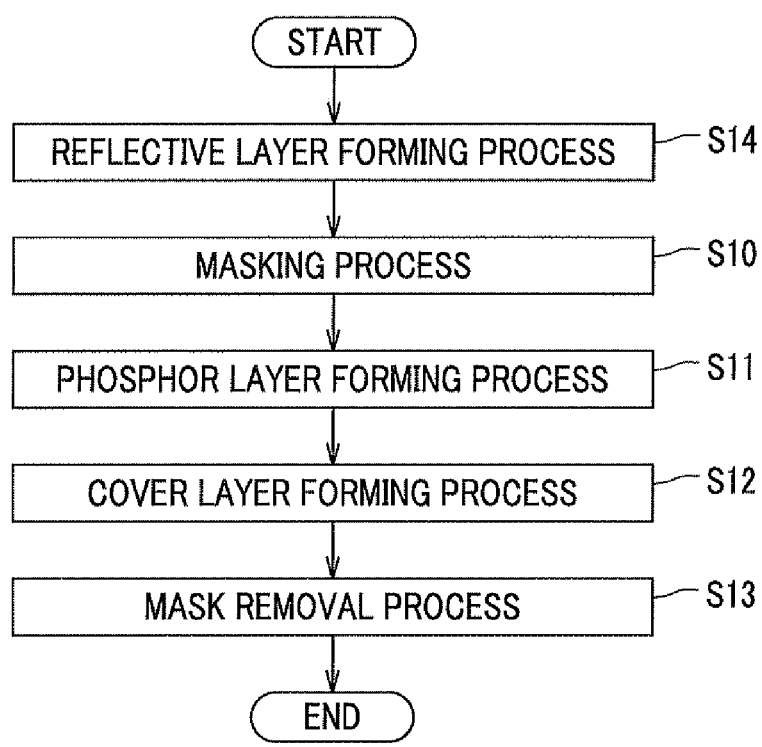
FIG. 7 is a flow chart showing a manufacturing method of the inorganic member according to the second embodiment.

Next, manufacturing method of the inorganic member 1B according to the second embodiment is described by referring to FIG. 7 (if desired, see also FIG. 6).

The manufacturing method of the inorganic member 1B according to the second embodiment includes a reflective layer forming process S14, the masking process S10, the phosphor layer forming process S11, the cover layer forming process S12, and the mask removal process S13, which are conducted in this order.

The manufacturing method of the inorganic member 1B according to the second embodiment is similar to the manufacturing method of the inorganic member 1 according to the first embodiment shown in FIG. 2 except that the reflective layer forming process S14 is conducted as the first process. Accordingly, the corresponding process is indicated by the same reference numeral and the explanation is omitted as appropriate.

(Reflective Layer Forming Process)

First, the reflective layer 4 is formed on the substrate 2 in the reflective layer forming process S14. The reflective layer 4 may be formed by depositing a metal material such as Al, Ag, or an alloy containing such metal which constitutes the reflective layer 4 on the substrate 2 by sputtering or vapor deposition. After the formation of the reflective layer 4 on the substrate 2, the surface may be mirror finished to improve the reflectance.

(Phosphor Layer Forming Process)

In the phosphor layer forming process S11, the particle layer 34 of the inorganic phosphor 31 is formed on the reflective layer 4 by electrodeposition or electrostatic coating using the reflective layer 4 for the electrode.

The formation of the particle layer 34 of the inorganic phosphor 31 on the reflective layer 4 by electrodeposition or electrostatic coating can be conducted even if the substrate 2 was an electrical insulator since the reflective layer 4 is made of an electroconductive metal.

The masking process S10, the cover layer forming process S12, and the mask removal process S13 are similar to the manufacturing method of the inorganic member 1 according to the first embodiment, and accordingly, detailed explanation is omitted.

<Third Embodiment>

Next, the inorganic member according to the third embodiment is described.

[Constitution of the Inorganic Member]

Figure 8:
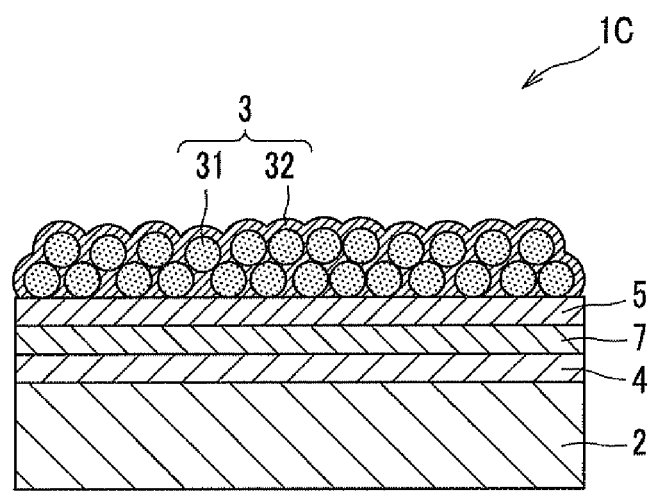
FIG. 8 is a schematic cross-sectional view showing an inorganic member according to third embodiment.

First, constitution of the inorganic member according to the third embodiment is described by referring to FIG. 8. The inorganic member 1C according to the third embodiment includes the substrate 2, the reflective layer 4, a dielectric layer 7, and a light transmissible layer 5 on the upper surface of the substrate 2 in this order, and the phosphor layer 3 above the substrate 2 with the intervening reflective layer 4, dielectric layer 7, and light transmissible layer 5. The inorganic member of this embodiment is similar to the inorganic member 1B according to the second embodiment shown in FIG. 6 except that the dielectric layer 7 and the light transmissible layer 5 are disposed between the reflective layer 4 and the phosphor layer 3. Description of the same constituent is omitted by using the same reference numeral. Indication of the interstice 33 is omitted in FIG. 8.

(Dielectric Layer)

The dielectric layer 7 is disposed between the reflective layer 4 and the phosphor layer 3 with the intervening light transmissible layer 5. Provision of the dielectric layer 3 enables reflection of the light diffused by the phosphor layer 3 at higher efficiency. This in turn results in the higher light extraction efficiency from the inorganic member 1C.

The dielectric layer 7 is not limited to the one including a single layer, and the dielectric layer 7 may also include a multi-layer film, and two or more dielectric layers each having a different refractive index deposited one on another can function as a reflective layer. The wave-length region of the light reflected by the dielectric multi-layer film may be arbitrarily determined in the range of 350 nm to 800 nm depending on the combination of the refractive index of the dielectric film constituting the multi-layer film and the film thickness. The number of the layers constituting such dielectric multi-layer film may be in the range of 2 to about 100, and total film thickness may be in the range of 0.1 µm to 20 µm.

The light extraction efficiency can be further improved by choosing the reflection bandwidth of the dielectric layer 7 so that the light of the wavelength not sufficiently reflected solely by the reflective layer 4 is reflected by the dielectric layer 7.

The dielectric layer 7 is preferably prepared by using at least one material selected from $SiO_2$, $Al_2O_3$, $Nb_2O_5$, $ZrO_2$, AlN, $TiO_2$, SiON, and SiN. When the dielectric layer 7 is a multi-layer film, two types of film each made of a material selected from those as mentioned above having a refractive index greatly different from the other material may be laminated one on another. Exemplary combinations of the materials having greatly different refractive index include $SiO_2$ and $ZrO_2$, as well as $SiO_2$ and $Nb_2O_5$. The wavelength region of the light reflected by the dielectric layer 7 is preferably 400 nm to 800 nm when a white light is to be reflected. In view of the heat dissipation and the reflectance, the number of layers in the multi-layer film is preferably 6 to 50, and the total film thickness is preferably 1 µm to 5 µm.

(Light Transmissible Layer)

The light transmissible layer 5 may be the electroconductive layer 6 (see FIG. 10D) formed by electrodeposition or electrostatic coating for use as the electrode in forming the particle layer 34 of the inorganic phosphor 31 on the substrate 2 in the phosphor layer forming process S11 as described below (see FIG. 9) which has been made transparent, or a transparent electroconductive layer. Accordingly, the light transmissible layer 5 is prepared by using a material which has electroconductivity in the manufacturing process as described above and which can be made transparent in the subsequent process S, or an electroconductive light transmissible material.

Examples of the material which has electroconductivity and which can be subsequently made transparent include metal materials containing at least one member selected from Al, Si, Zn, Sn, Mg, and In. For example, Al can be oxidized by exposure to a hot water of about 90° C. for the change into light transmissible $Al_2O_3$, and use of Al is preferable since Al can be oxidized and be made transparent by the oxidation at a relatively low temperature. In this case, an $Al_2O_3$ film is formed as the light transmissible layer 5. When an $Al_2O_3$ film is formed as the cover layer 32, the cover layer 32 will be firmly bonded to the light transmissible layer since these layers are made of the same material. As a consequence, the inorganic phosphor 31 will be sufficiently protected from the atmosphere such as moisture, and peeling of the phosphor layer 3 from the substrate 2C is prevented. In the case of the material other than the Al, use of the same material for the light transmissible layer 5 and the cover layer 32 is preferable since such use realizes good adhesion between light transmissible layer 5 and the cover layer 32.

Another method of converting the electroconductive layer 6 to the light transmissible layer 5 is treatment by aqueous ammonia. For example, when Al or Z is used for the material of the electroconductive layer 6, the aqueous ammonia treatment converts Al and Z to light transmissible $Al(OH)_3$ (aluminum hydroxide) and $Zn(OH)_2$ (zinc hydroxide), respectively. Since these hydroxides are gel, they are also expected to function as a binder between the particles of the inorganic phosphor 31.

Examples of the electroconductive light transmissible material include electroconductive metal oxides containing least one element selected from the group consisting of Zn (zinc), In (indium), Sn (tin), Ga (gallium), and Mg (magnesium), and more specifically, electroconductive metal oxides such as ZnO, AZO (Al-doped ZnO), IZO (In-doped ZnO), GZO (Ga-doped ZnO), $In_2O_3$, ITO (Sn-doped $In_2O_3$), IFO (F-doped $In_2O_3$), $SnO_2$, ATO (Sb-doped $SnO_2$), FTO (F-doped $SnO_2$), CTO (Cd-doped $SnO_2$), and MgO.

When an electroconductive light transmissible material is used, the transparent conductive layer forming process S17 (see FIG. 9) can be omitted in the manufacturing method as described below.

In this embodiment, the phosphor layer 3 is formed only above the upper surface of the substrate 2 with the intervening reflective layer 4, dielectric layer 7, and light transmissible layer 5. The constitution is not limited to such embodiment, and the phosphor layer 3 may be formed above the upper and side surfaces, or alternatively, only above some parts of the upper surface of the substrate 2, with the intervening reflective layer 4, dielectric layer 7, and light transmissible layer 5. Furthermore, the shape of the substrate 2 is not limited to the plate shape, and as shown in FIG. 5, the substrate may have any desired shape.

Alternatively, a highly heat-conductive layer such as a carbon nanotube layer or a diamond-like carbon layer may be formed between the substrate 2 and the reflective layer 4. In addition, when the substrate 2 is a reflective layer, the dielectric layer 7 may be directly formed on the substrate 2 without forming the reflective layer 4.

[Manufacturing Method of the Inorganic Member]

Figure 9:
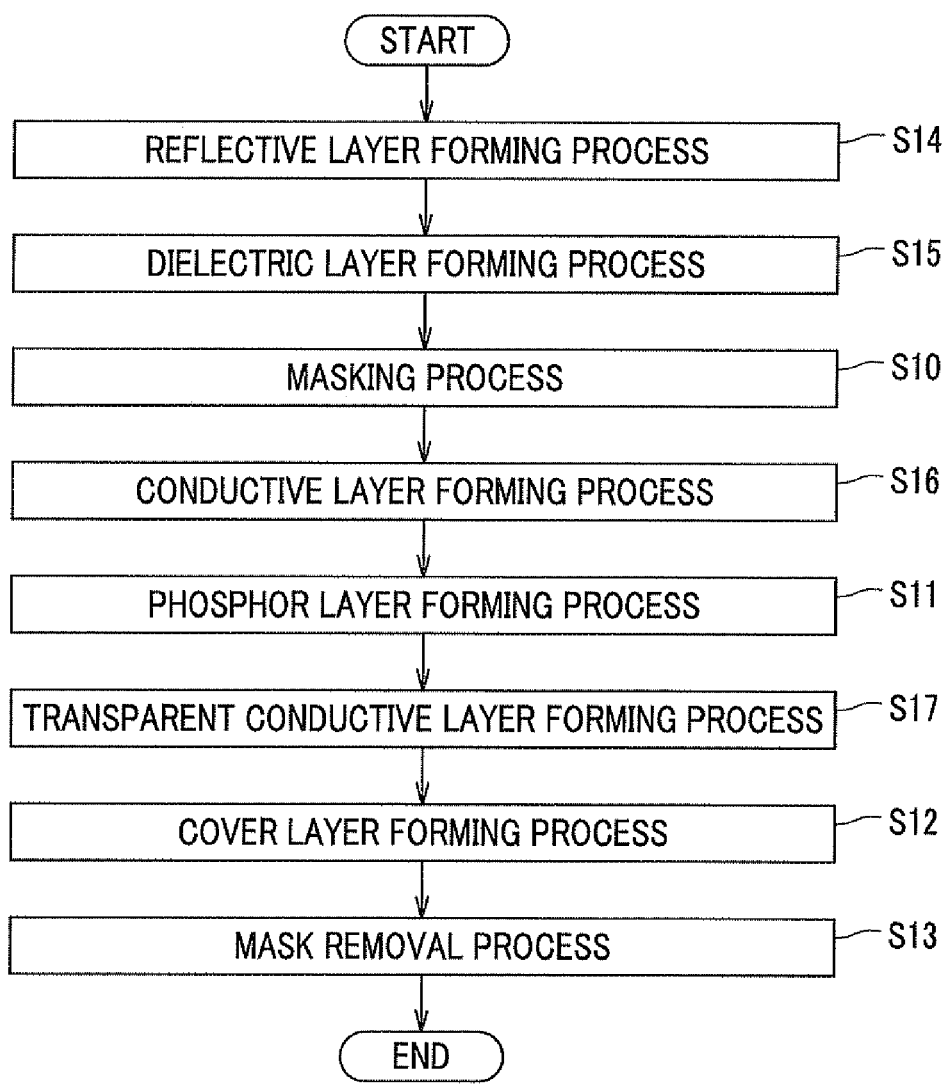
FIG. 9 is a flow chart showing a manufacturing method of the inorganic member according to the third embodiment.

Next, manufacturing method of the inorganic member according to the third embodiment is described by referring to FIG. 9.

As shown in FIG. 9, the manufacturing method of the inorganic member according to the third embodiment includes the reflective layer forming process S14, a dielectric layer forming process S15, the masking process S10, an electroconductive layer forming process S16, the phosphor layer forming process S11, a transparent conductive layer forming process S17, the cover layer forming process S12, and the mask removal process S13, which are conducted in this order.

Next, each process is hereinafter described in detail by referring to FIGS. 10A to 10D and FIGS. 11A to 11D (and if desired, also FIGS. 8 and 9).

(Reflective Layer Forming Process)

Figure 10A:
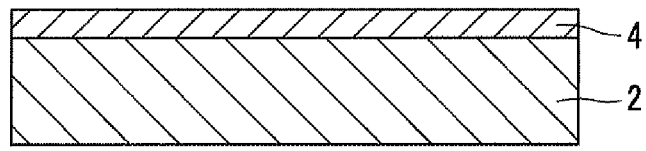
FIG. 10A is a schematic cross-sectional view for explaining a manufacturing process of the inorganic member according to the third embodiment.

First, the reflective layer 4 is formed on the substrate 2 as shown in FIG. 10A in the reflective layer forming process S14. The reflective layer forming process S14 in this embodiment is similar to the reflective layer forming process S14 in the second embodiment, and accordingly, detailed explanation is omitted.

(Dielectric Layer Forming Process)

Figure 10B:
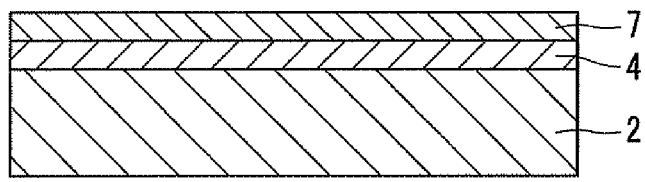
FIG. 10B is a schematic cross-sectional view for explaining a manufacturing process of the inorganic member according to the third embodiment.

Next, in the dielectric layer forming process S15, the dielectric layer 7 is formed on the reflective layer 4 as shown in FIG. 10B. The dielectric layer 7 may be formed by depositing a light transmissible dielectric material such as $SiO_2$, $Al_2O_3$, $Nb_2O_5$, $ZrO_2$, AlN, $TiO_2$, SiON, and SiN on the reflective layer 4. When the dielectric layer 7 is constituted from a dielectric multi-layer film, a combination of two types of materials selected from the above mentioned dielectric materials having greatly different refractive index may be selected (for example, a combination of $SiO_2$ and $ZrO_2$ and a combination of $SiO_2$ and $Nb_2O_5$), and these materials may be alternately deposited on another.

(Masking Process)

Figure 10C:
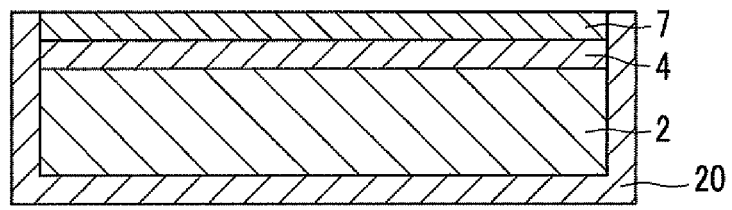
FIG. 10C is a schematic cross-sectional view for explaining a manufacturing process of the inorganic member according to the third embodiment.

Next, in the masking process S10, the upper surface of the dielectric layer 7 is masked except for the area where the phosphor layer 3 is provided by using a masking member 20 such as a tape or a photoresist as shown in FIG. 10C. The masking process S10 of this embodiment is similar to the masking process S10 in the first embodiment except that the part masked is different, and accordingly, detailed explanation is omitted.

(Electroconductive Layer Forming Process)

Figure 10D:
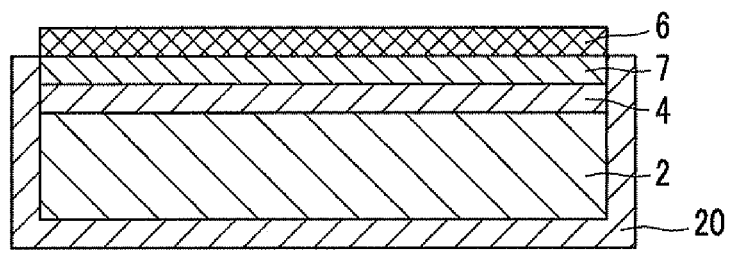
FIG. 10D is a schematic cross-sectional view for explaining a manufacturing process of the inorganic member according to the third embodiment.

Next, in the electroconductive layer forming process S16, the electroconductive layer 6 of an electroconductive material is formed on the dielectric layer 7 as shown in FIG. 10D. The electroconductive layer 6 may be formed by using a material which can be made transparent in the subsequent process, namely, in the transparent conductive layer forming process S17, such as Al, and the electroconductive layer 6 may be formed by sputtering, vapor deposition, plating, or the like.

The electroconductive layer 6 may also be formed by using a light transmissible material such as ITO and ZnO as described above by a method such as a physical method such as sputtering or vapor deposition, spraying, or a chemical method such as CVD (chemical vapor deposition). When the electroconductive layer 6 is formed by using a light transmissible material, the transparent conductive layer forming process S17 can be omitted.

(Phosphor Layer Forming Process)

Figure 11A:
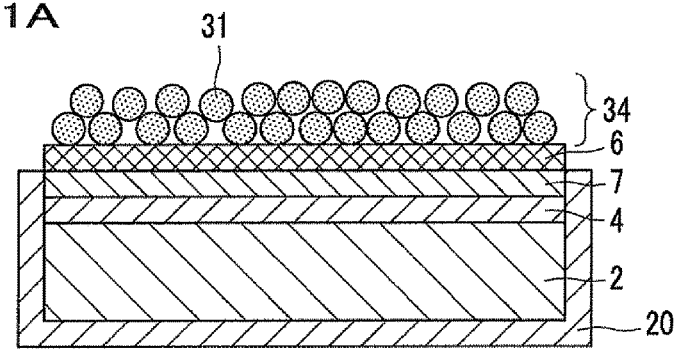
FIG. 11A is a schematic cross-sectional view for explaining a manufacturing process of the inorganic member according to the third embodiment.

Next, in the phosphor layer forming process S11, the particle layer 34 of the inorganic phosphor 31 is formed above the upper surface of the substrate 2 with the intervening reflective layer 4, dielectric layer 7, and electroconductive layer 6 as shown in FIG. 11A by using the electroconductive layer 6 as an electrode in electrodeposition or electrostatic coating. The phosphor layer forming process S11 of this embodiment is similar to the phosphor layer forming process S11 in the first embodiment, and accordingly, detailed explanation is omitted.

Formation of the electroconductive layer 6 is not required when the particle layer 34 of the inorganic phosphor 31 is formed by centrifugal sedimentation or pulsed spraying, and in such a case, the electroconductive layer formation process S16 and the transparent conductive layer forming process S17 can be omitted. In such a case, the inorganic member formed has the constitution wherein the phosphor layer 3 is directly formed on the dielectric layer 7 without forming the light transmissible layer 5 in the inorganic member 1C shown in FIG. 8.

(Transparent Conductive Layer Forming Process)

Figure 11B:
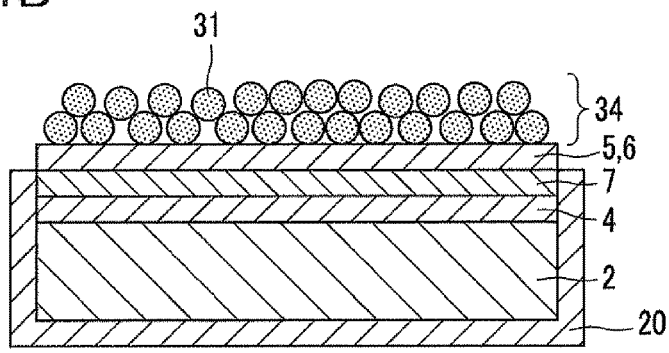
FIG. 11B is a schematic cross-sectional view for explaining a manufacturing process of the inorganic member according to the third embodiment.

Next, in the transparent conductive layer forming process S17, the electroconductive layer 6 is converted into the light transmissible layer 5 by making the electroconductive layer 6 transparent as shown in FIG. 11B. When the electroconductive layer 6 is formed by using an Al film, the Al may be oxidized by exposing to hot water of about 90° C. for conversion into the light transmissible $Al_2O_3$ film.

When the electroconductive layer 6 is formed by using an Al film, it may also be treated with aqueous ammonia to thereby convert the Al to the light transmissible $Al(OH)_3$.

Alternatively, the electroconductive layer 6 may be removed by dissolving the metal forming the electroconductive layer 6. In other words, a process of removing the conductive layer may be carried out instead of the transparent conductive layer forming process S17. The method used for the removal of the electroconductive layer 6 may be dissolution by an acid, and exemplary acids include aqueous solution of an inorganic or organic acid such as HCl (hydrochloric acid), $H_2SO_4$ (sulfuric acid), or $HNO_3$ (nitric acid). When Al is used for the material of the electroconductive layer 6, the Al can be removed by immersing in an aqueous solution of an acid for dissolution of the Al in the acid solution and conversion to the $Al^{3+}$.

When an amphoteric metal such as Al, Zn, or Sn is used as the material for the electroconductive layer 6, the electroconductive layer 6 may be removed by dissolution in an alkaline aqueous solution such as NaOH (sodium hydroxide) and KOH (potassium hydroxide). For example, when Al, Zn, or Sn is used as the material for the electroconductive layer 6, reaction with aqueous solution of sodium hydroxide results in the formation of a complex ion such as $Na[Al(OH)_4]$, $Na_2[Zn(OH)_4]]$, or $Na_2[Sn(OH)_4]$, respectively, and the metal is removed by dissolution in the alkaline aqueous solution.

When the electroconductive layer 6 is removed, the inorganic member formed has the constitution such that the phosphor layer 3 is directly formed on the dielectric layer 7 without forming the light transmissible layer 5 in the inorganic member 1C according to the third embodiment shown in FIG. 8.

(Cover Layer Formation Process)

Figure 11C:
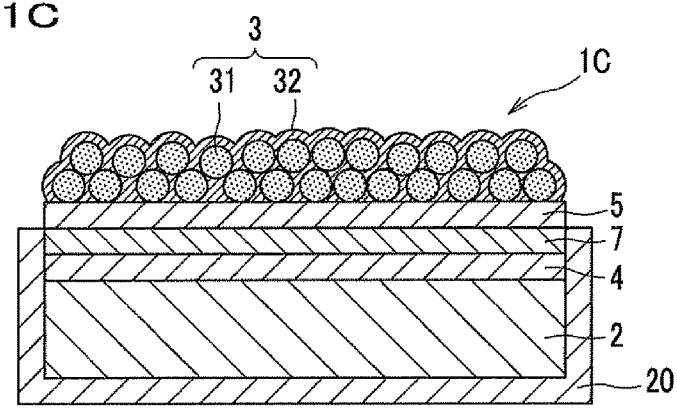
FIG. 11C is a schematic cross-sectional view for explaining a manufacturing process of the inorganic member according to the third embodiment.

Next, in the cover layer formation process S12, the cover layer 32 covering the particles of the inorganic phosphor 31 is formed, for example, by ALD as shown in FIG. 11C. The particles of the inorganic phosphor 31 is covered by the cover layer 32, and the cover layer 32 also firmly bonds the particles of the inorganic phosphor 31 with the light transmissible layer 5 and the particles of the inorganic phosphor 31 with each other, thereby providing an integral inorganic member 1C.

When the light transmissible layer 5 and the cover layer 32 are formed by using the same material, good adhesion between the phosphor layer 3 and light transmissible layer 5 is realized, and the inorganic phosphor 31 in contact with the light transmissible layer 5 obtains good barrier against the atmosphere such as moisture, and the phosphor layer 3 has less tendency to be peeled from the inorganic member 1C.

The cover layer formation process S12 of this embodiment is similar to the cover layer formation process S12 in the first embodiment, and accordingly, detailed explanation is omitted.

(Mask Removal Process)

Figure 11D:
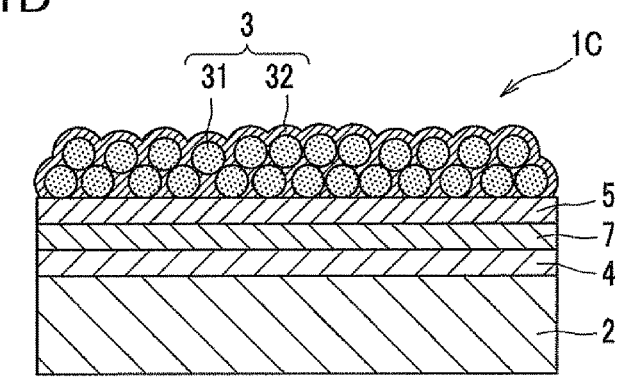
FIG. 11D is a schematic cross-sectional view for explaining a manufacturing process of the inorganic member according to the third embodiment.

Finally, the masking member 20 is removed in the mask removal process S13 as shown in FIG. 11D to thereby obtain the inorganic member 1C having the reflective layer 4, the dielectric layer 7, the light transmissible layer 5, and the phosphor layer 3 disposed on the upper surface of the substrate 2.

<Fourth Embodiment>

Next, the inorganic member according to the fourth embodiment is described.

[Constitution of the Inorganic Member]

Figure 12:
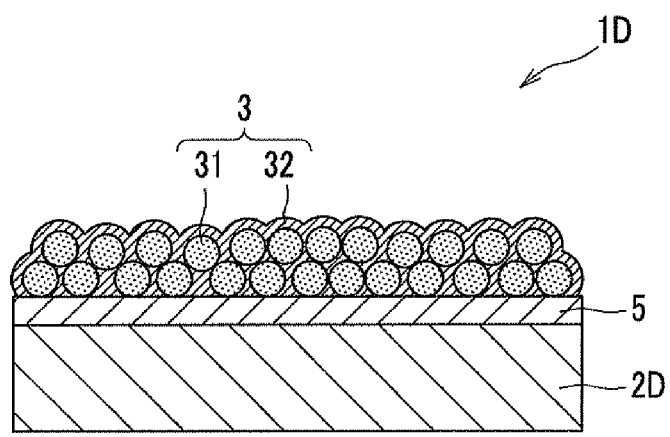
FIG. 12 is a schematic cross-sectional view showing constitution of an inorganic member according to fourth embodiment.

First, constitution of the inorganic member according to the fourth embodiment is described by referring to FIG. 12. The inorganic member 1D according to the fourth embodiment includes a light transmissible substrate 2D, a light transmissible layer 5 formed on the upper surface of the light transmissible substrate 2D, and the phosphor layer 3. The phosphor layer 3 is provided above the substrate 2D with the intervening light transmissible layer 5.

The inorganic member 1D according to the fourth embodiment is different from the inorganic member 1 according to the first embodiment shown in FIG. 1 in that a light transmissible substrate 2D is used instead of the metal substrate 2, that a light transmissible layer 5 is formed on the upper surface of the substrate 2D, and that the phosphor layer 3 is provided only above the upper surface of the substrate 2D. The inorganic member 1D according to the fourth embodiment functions as a transmission color conversion member wherein the light that has entered in the phosphor layer 3 is emitted from the surface opposite to the incident surface after the color conversion.

(Substrate (Base Body))

The substrate 2D is a light transmissible member which has the function of supporting the phosphor layer 3, controlling the light, efficiently dissipating the heat, and the like. The substrate 2 may be formed by using a material which has been adequately selected according to the intended use.

The substrate 2D may be formed by using a transparent inorganic material such as glass, an oxide such as $Al_2O_3$ or $SiO_2$ or a complex oxide, a nitride such as AlN or GaN or a oxynitride, a carbide such as SiC or a carbonitride, a halide, or a light transmissible carbon. The material used for the substrate 2D is selected from those having a light transmission for the incident light and the light emitted by the phosphor layer 3 of at least 50%, preferably at least 70%, and more preferably at least 90%. Light transmissible materials are generally electrically insulated. However, such material may be provided with electroconductivity by depositing a light transmissible electroconductive material on its surface, or by forming the entire substrate 2D from a light transmissible electroconductive material so that electrodeposition and other means may be used in the phosphor layer 3 formation process as described below.

Also, the light transmissible substrate 2D may be provided with optical control ability so that it can transmit, diffuse, absorb, shield, or convert certain type of light. As an example, an attempt to reduce risk of the leakage of the light of the first color emitted from the LD is described. In the light-emitting device of this attempt, the inorganic member 1D is provided on the upper surface of an LD (laser diode) so that the light from the LD enters from the side of the phosphor layer 3. When the light of the first color emitted from the LD enters the phosphor layer 3, both the light of the second color whose color has been converted by the phosphor layer 3 and the light of the first color whose color has not been converted by the phosphor layer 3 enter the substrate 2D. If the material of the substrate 2 is selected to have a wavelength selectivity so that the light of the second color passes through the substrate 2D while the light of the first color is shielded or absorbed by the substrate 2D, direct emission from the other side (on the side of the substrate 2D) of the light of the first color originally from the LD will be prevented. In the embodiment of such constitution, the substrate 2D may be prepared by using Pyrex glass or by providing a dielectric reflective layer on the surface of the substrate 2D.

Alternatively, the light transmissible substrate 2D may be prepared so that the light is diffused in the interior or on the surface of the substrate 2D. Uniformity of the color conversion will be improved by this constitution.

The substrate 2D may also be prepared by using a material having optical conversion function such as a phosphor ceramics, a light-emitting glass, or a glass containing a nano material. For example, the substrate 2D may be constituted by using a YAG phosphor, and the phosphor layer 3 prepared by using a red phosphor may be provided on this substrate 2D. Efficiency of the color conversion by the inorganic member 1D will be improved by this constitution.

The substrate 2D may be preferably made of a material having high heat conductivity for efficient dissipation of the heat which is generated by Stokes loss of the light converted by the phosphor layer 3 through the substrate 2D. More specifically, the material used for the substrate 2D may have a heat conductivity of at least 5 W/m·K, and more preferably at least 100 W/m·K. An exemplary such light transmissible material having the heat conductivity is AlN.

Furthermore, the shape of the substrate 2D is not limited to the plate shape as long as it supports the phosphor layer 3 as a structural member, and the substrate 2 may also have a three dimensional structure facilitating assembly in a light-emitting device or having a light gathering function. For example, a glass substrate 2 may be fabricated to function as a lens, and the phosphor layer 3 may be directly formed on the lens-shaped substrate 2D to produce a color conversion inorganic member 1D including a lens integrally formed with a phosphor layer 3 which is the color conversion substance. Such constitution facilitates optical control.

(Light Transmissible Layer)

The light transmissible layer 5 may be the electroconductive layer 6 (see FIG. 14B) formed by electrodeposition or electrostatic coating for use as the electrode in forming the particle layer 34 of the inorganic phosphor 31 on the substrate 2 in the phosphor layer formation process S21 as described below (see FIG. 13), which has been made transparent, or a transparent electroconductive layer. Accordingly, the light transmissible layer 5 is prepared by using a material which has electroconductivity in the manufacturing process as described above and which can be made transparent in the subsequent process S, or an electroconductive light transmissible material.

Examples of the material which has electroconductivity and which can be subsequently made transparent include metal materials containing at least one member selected from Al, Si, Zn, Sn, Mg, and In. For example, Al can be oxidized by exposure to a hot water of about 90° C. for the change into light transmissible $Al_2O_3$, and use of Al is preferable since Al can be oxidized and be made transparent by the oxidation at a relatively low temperature. In this case, an $Al_2O_3$ film is formed as the light transmissible layer 5. When an $Al_2O_3$ film is formed as the cover layer 32, the cover layer 32 will be firmly bonded to the light transmissible layer since these layers are made of the same material. As a consequence, the inorganic phosphor 31 will be sufficiently protected from the atmosphere such as moisture, and peeling of the phosphor layer 3 from the substrate 2D is prevented. In the case of the material other than the Al, use of the same material for the light transmissible layer 5 and the cover layer 32 is preferable since such use realizes good adhesion between light transmissible layer 5 and the cover layer 32.

Another method of converting the electroconductive layer 6 to the light transmissible layer 5 is treatment by aqueous ammonia. For example, when Al or Z is used for the material of the electroconductive layer 6, the aqueous ammonia treatment converts Al and Z to light transmissible $Al(OH)_3$ (aluminum hydroxide) and $Zn(OH)_2$ (zinc hydroxide), respectively. Since these hydroxides are gel, they are also expected to function as a binder between the particles of the inorganic phosphor 31.

Examples of the electroconductive light transmissible material include electroconductive metal oxides containing at least one element selected from the group consisting of Zn (zinc), In (indium), Sn (tin), Ga (gallium), and Mg (magnesium), and more specifically, electroconductive metal oxides such as ZnO, AZO (Al-doped ZnO), IZO (In-doped ZnO), GZO (Ga-doped ZnO), $In_2O_3$, ITO (Sn-doped $In_2O_3$), IFO (F-doped $In_2O_3$), $SnO_2$, ATO (Sb-doped $SnO_2$), FTO (F-doped $SnO_2$), CTO (Cd-doped $SnO_2$), and MgO.

When an electroconductive light transmissible material is used, the transparent conductive layer forming process S22 (see FIG. 13) can be omitted in the subsequent manufacturing method.

The inner constitution of the phosphor layer 3 is similar to that of the phosphor layer 3 in the inorganic member 1 according to the first embodiment shown in FIG. 1B, and accordingly, indication of the interstice 33 is omitted in FIG. 12.

[Manufacturing Method of the Inorganic Member]

Figure 13:
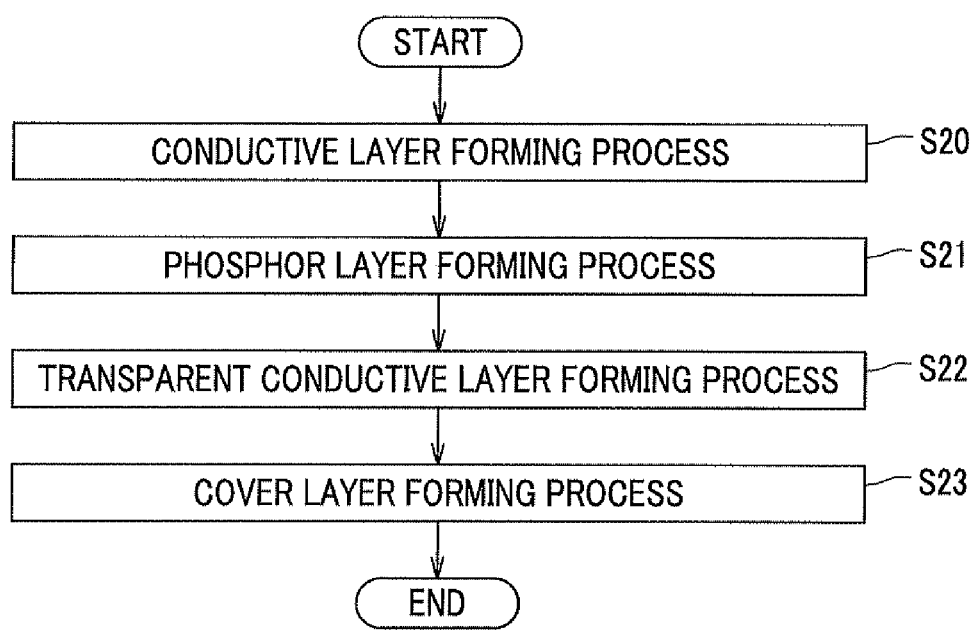
FIG. 13 is a flow chart showing a manufacturing method of the inorganic member according to the fourth embodiment.

Next, manufacturing method of the inorganic member according to the fourth embodiment is described by referring to FIG. 13.

The manufacturing method of the inorganic member according to the fourth embodiment includes an electroconductive layer formation process S20, a phosphor layer formation process S21, a transparent conductive layer forming process S22, and a cover layer formation process S23, which are conducted in this order.

Next, each process is hereinafter described in detail by referring to FIGS. 14A to 14D (and if desired, also FIGS. 12 and 13).

(Electroconductive Layer Formation Process)

Figure 14A:
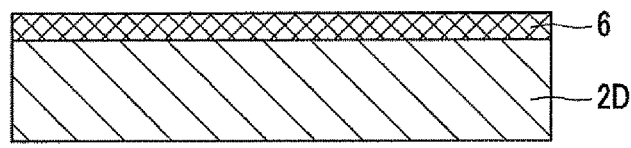
FIG. 14A is a schematic cross-sectional view for explaining a manufacturing process of the inorganic member according to the fourth embodiment.

First, in the electroconductive layer formation process S20, the electroconductive layer 6 of an electroconductive material is formed on the upper surface of the substrate 2D in the area where the phosphor layer 3 is to be formed as shown in FIG. 14A. The electroconductive layer 6 may be formed by using a material which can be made transparent in the subsequent process, namely, in the transparent conductive layer forming process S22, such as Al, and the electroconductive layer 6 may be formed by sputtering, vapor deposition, plating, or the like. It is to be noted that, before the formation of the electroconductive layer 6, the area other than the area where the phosphor layer 3 is to be provided is masked with a tape or a photoresist.

The electroconductive layer 6 may also be formed by using a light transmissible material such as ITO and ZnO as described above by a method such as a physical method such as sputtering or vapor deposition, spraying, or a chemical method such as CVD (chemical vapor deposition). When the electroconductive layer 6 is formed by using a light transmissible material, the transparent conductive layer forming process S22 can be omitted.

(Phosphor Layer Forming Process)

Figure 14B:
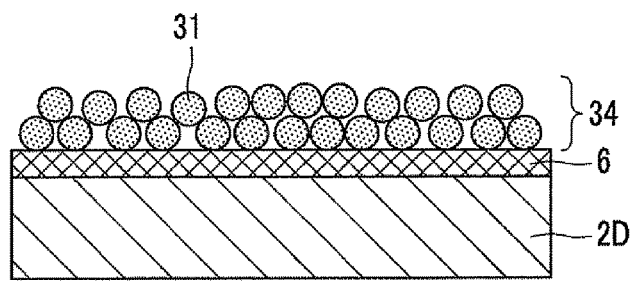
FIG. 14B is a schematic cross-sectional view for explaining a manufacturing process of the inorganic member according to the fourth embodiment.

Next, in the phosphor layer forming process S21, the particle layer 34 of the inorganic phosphor 31 is formed above the upper surface of the substrate 2D with the intervening electroconductive layer 6 as shown in FIG. 14B by using the electroconductive layer 6 as an electrode in electrodeposition or electrostatic coating. The phosphor layer formation process S21 of this embodiment is similar to the phosphor layer formation process S11 in the first embodiment, and accordingly, detailed explanation is omitted.

Formation of the electroconductive layer 6 is not required when the particle layer 34 of the inorganic phosphor 31 is formed by centrifugal sedimentation or pulsed spraying, and in such a case, the electroconductive layer formation process S20 and the transparent conductive layer forming process S22 can be omitted. In such a case, the inorganic member formed has the constitution wherein the phosphor layer 3 is directly formed on the non-electroconductive light transmissible substrate 2D without forming the light transmissible layer 5 in the inorganic member 1D shown in FIG. 12.

(Transparent Conductive Layer Forming Process)

Figure 14C:
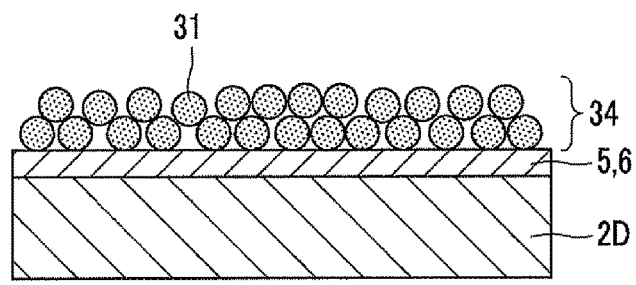
FIG. 14C is a schematic cross-sectional view for explaining a manufacturing process of the inorganic member according to the fourth embodiment.

Next, in the transparent conductive layer forming process S22, the electroconductive layer 6 is converted into the light transmissible layer 5 by being made transparent the electroconductive layer 6 as shown in FIG. 14C. When the electroconductive layer 6 is formed by using an Al film, the Al may be oxidized by exposing to hot water of about 90° C. for conversion into the light transmissible $Al_2O_3$ film.

When the electroconductive layer 6 is formed by using an Al film, it may also be treated with aqueous ammonia to thereby convert the Al to the light transmissible Al $(OH)_3$.

Alternatively, the electroconductive layer 6 may be removed by dissolving the metal forming the electroconductive layer 6. The method used for the removal of the electroconductive layer 6 may be dissolution by an acid, and exemplary acids include aqueous solution of an inorganic or organic acid such as HCl (hydrochloric acid), $H_2SO_4$ (sulfuric acid), or $HNO_3$ (nitric acid). When Al is used for the material of the electroconductive layer 6, the Al can be removed by immersing in an aqueous solution of an acid for dissolution of the Al in the acid solution and conversion to the $Al^{3+}$.

When an amphoteric metal such as Al, Zn, or Sn is used as the material for the electroconductive layer 6, the electroconductive layer 6 may be removed by dissolution in an alkaline aqueous solution such as NaOH (sodium hydroxide) and KOH (potassium hydroxide). For example, when Al, Zn, or Sn is used as the material for the electroconductive layer 6, reaction with aqueous solution of sodium hydroxide results in the formation of a complex ion such as Na[Al$(OH)_4$], $Na_2[Zn(OH)_4]]$, or $Na_2[Sn(OH)_4]$, respectively, and the metal is removed by dissolution in the alkaline aqueous solution.

When the electroconductive layer 6 is removed, the inorganic member formed has the constitution such that the phosphor layer 3 is directly formed on the non-electroconductive light transmissible substrate 2D without forming the light transmissible layer 5 in the inorganic member 1D according to the fourth embodiment shown in FIG. 12.

(Cover Layer Forming Process)

Figure 14D:
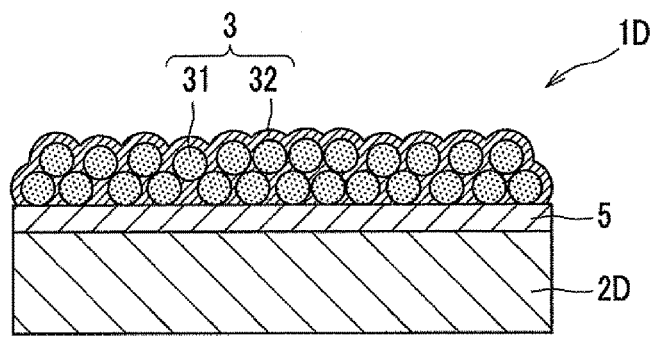
FIG. 14D is a schematic cross-sectional view for explaining a manufacturing process of the inorganic member according to the fourth embodiment.

Next, in the cover layer forming process S12, the cover layer 32 covering the particles of the inorganic phosphor 31 is formed, for example, by ALD as shown in FIG. 14D. The particles of the inorganic phosphor 31 is covered by the cover layer 32, and the cover layer 32 also firmly bonds the particles of the inorganic phosphor 31 with the light transmissible layer 5 and the particles of the inorganic phosphor 31 with each other, thereby providing an integral inorganic member 1D.

When the light transmissible layer 5 and the cover layer 32 are formed by using the same material, good adhesion between the phosphor layer 3 and light transmissible layer 5 is realized, and the inorganic phosphor 31 in contact with the light transmissible layer 5 obtains good barrier against the atmosphere such as moisture, and the phosphor layer 3 has less tendency to be peeled from the substrate 2D.

The cover layer formation process S23 is similar to the cover layer forming process S12 in the first embodiment, and accordingly, detailed explanation is omitted.

As a modification of this embodiment, a ceramics containing a phosphor may be used for the substrate 2D. For example, a sintered plate of a LAG (lutetium-aluminum-garnet) phosphor ceramics prepared by sintering may be used for the substrate 2D, and the phosphor layer 3 containing a phosphor different from the one in the substrate may be formed on the substrate 2D. This enables manufacturing of the integral color conversion member which contains two or more types of phosphor layers without using the intervening adhesive layer.

In another modification, a substrate formed with a semiconductor light emitting device may be used for the substrate 2D. For example, the phosphor layer 3 may be formed in contact with the substrate of an LED device on the surface opposite to the side on which the semiconductor layer has been formed and on the side surface. This enables manufacturing of a light-emitting device having a phosphor layer without using the intervening adhesive layer.

In further modification, a reflective layer of a metal or a dielectric multi-layer film may be formed on the surface of the phosphor layer 3 to there by produce an inorganic member which is used as a reflective-type color conversion member wherein color of the light which has entered from the lower surface of the substrate 2D is converted and the light having its color converted is reflected by the reflective layer for emit from the lower surface of the substrate 2D. In addition, the shape of the substrate 2D is not limited to the plate shape, and as shown in FIG. 5, the substrate may have any desired shape.

<Fifth Embodiment>

Next, the inorganic member according to the fifth embodiment is described.

[Constitution of the Inorganic Member]

Figure 15:
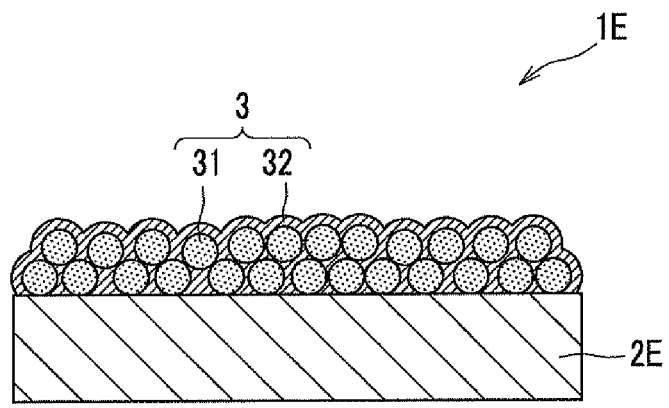
FIG. 15 is a schematic cross-sectional view showing constitution of an inorganic member according to fifth embodiment.

First, constitution of the inorganic member according to the fifth embodiment is described by referring to FIG. 15. The inorganic member 1E according to the fifth embodiment includes an electroconductive light transmissible substrate 2E and a phosphor layer 3 on the upper surface of the substrate 2E.

The inorganic member 1E according to the fifth embodiment is different from the inorganic member 1D according to the fourth embodiment shown in FIG. 12 in that an electroconductive light transmissible substrate 2E is used instead of the light transmissible substrate 2D, and the phosphor layer 3 is formed directly on the upper surface of the substrate 2E. The inorganic member 1E according to the fifth embodiment functions as a transmission color conversion member wherein the light that has entered in the phosphor layer 3 is emitted from the surface opposite to the incident surface after the color conversion as in the case of the inorganic member 1D according to the fourth embodiment.

(Substrate (Base Body))

The substrate 2E is a light transmissible metal plate for supporting the phosphor layer 3. The substrate 2E is produced by using a material which has light transmissibility as well as electroconductivity. Such materials include electroconductive metal oxides containing at least one element selected from the group consisting of Zn (zinc), In (indium), Sn (tin), Ga (gallium), and Mg (magnesium), and more specifically, electroconductive metal oxides such as ZnO, AZO (Al-doped ZnO), IZO (In-doped ZnO), GZO (Ga-doped ZnO), $In_2O_3$, ITO (Sn-doped $In_2O_3$), IFO (F-doped $In_2O_3$), $SnO_2$, ATO (Sb-doped $SnO_2$), FTO (F-doped $SnO_2$), CTO (Cd-doped $SnO_2$), and MgO.

In addition, the shape of the substrate 2E is not limited to the plate shape, and as shown in FIG. 5, the substrate may have any desired shape.

The inner constitution of the phosphor layer 3 is similar to that of the phosphor layer 3 in the inorganic member 1 according to the first embodiment shown in FIG. 1B, and accordingly, indication of the interstice 33 is omitted in FIG. 15.

[Production Method of the Inorganic Member]

Figure 16:
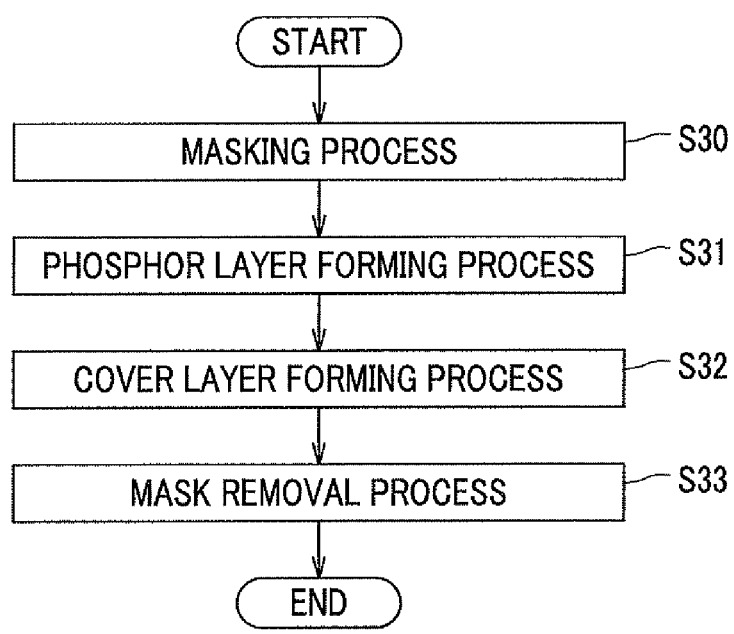
FIG. 16 is a flow chart showing a manufacturing method of the inorganic member according to the fifth embodiment.

Next, production method of the inorganic member according to the fifth embodiment is described by referring to FIG. 16.

The production method of the inorganic member according to the fifth embodiment includes a masking process S30, a phosphor layer forming process S31, a cover layer forming process S32, and a mask removal process S33, which are conducted in this order.

Next, each process is described in detail by referring to FIGS. 17A to 17D (and if desired, also FIGS. 15 and 16).

(Masking Process)

Figure 17A:
FIG. 17A is a schematic cross-sectional view for explaining a manufacturing process of the inorganic member according to the fifth embodiment.

First, in the masking process S30, the substrate 2E is masked by attaching the masking member 20 as shown in FIG. 17A except for the part where the phosphor layer 3 is to be formed. In this embodiment, the lower and side surfaces of the substrate 2E is covered.

The masking member 20 used may be a pressure sensitive tape or a pressure sensitive sheet of a resin such as polyimide, polytetrafluoroethylene, or polyolefin. Alternatively, the masking may be conducted by coating with a resin material such as an acryl resin, a silicone resin, or an epoxy resin, or by the patterning using a resin masking member 20 for the photoresist. The masking using a photolithography technique is useful when the substrate 2 is covered in a fine shape. An adequate masking material and process may be selected according to the temperature and atmosphere used as well as the object of the masking.

In this embodiment, the lower and side surfaces of the substrate 2E is covered with the masking member 20 to thereby form the phosphor layer 3 on the upper surface of the substrate 2E. However, the phosphor layer 3 may be formed in any desired area by changing the area covered by the masking member 20.

(Phosphor Layer Forming Process)

Figure 17B:
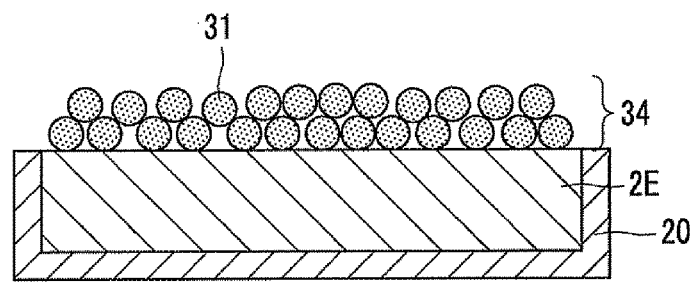
FIG. 17B is a schematic cross-sectional view for explaining a manufacturing process of the inorganic member according to the fifth embodiment.

Next, in the phosphor layer forming process S31, the particle layer 34 formed by depositing the particles of the inorganic phosphor 31 is formed on the upper surface of the substrate 2E as shown in FIG. 17B. The phosphor layer forming process S31 may be conducted in a similar manner as the phosphor layer forming process S11 of the first embodiment, and accordingly, detailed explanation is omitted.

(Cover Layer Forming Process)

Figure 17C:
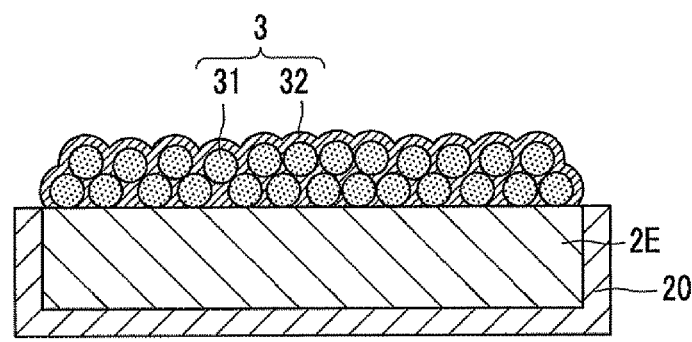
FIG. 17C is a schematic cross-sectional view for explaining a manufacturing process of the inorganic member according to the fifth embodiment.

Next, in the cover layer forming process S32, the particle layer 34 (see FIG. 17B) of the inorganic phosphor 31 formed in the phosphor layer forming process S31 is covered as shown in FIG. 17C with the cover layer 32, which firmly binds the particles with each other. The cover layer forming process S32 can be conducted by the procedure similar to the cover layer forming process S13 of the first embodiment, and accordingly, detailed explanation is omitted.

(Mask Removal Process)

Figure 17D:
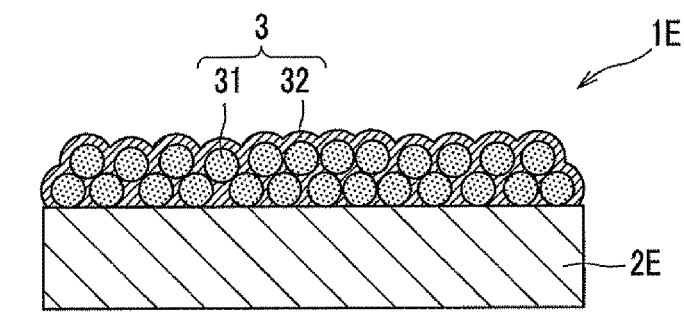
FIG. 17D is a schematic cross-sectional view for explaining a manufacturing process of the inorganic member according to the fifth embodiment.

Finally, the masking member 20 (see FIG. 17C) is removed in the mask removal process S33 as shown in FIG. 17D to thereby obtain the inorganic member 1E having the phosphor layer 3 disposed on the upper surface of the substrate 2E.

<Sixth Embodiment>

Next, the light-emitting device according to the sixth embodiment is described.

The light-emitting device according to the sixth embodiment is a light-emitting device produced by using the inorganic member 1 according to the first embodiment for the color conversion member.

[Constitution of the Light-Emitting Device]

Figure 18A:
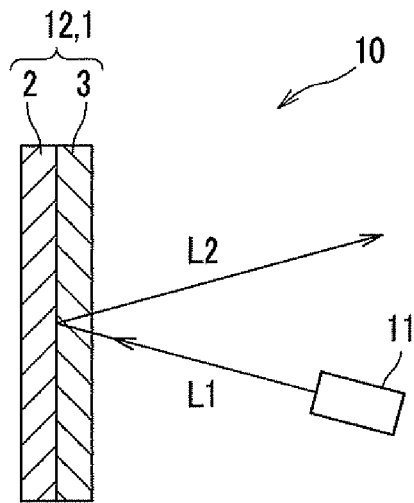
FIG. 18A is a schematic view showing constitution of a light emitting device according to sixth embodiment.

First, constitution of a light-emitting device 10 is described by referring to FIG. 18A (and if desired, FIG. 1).

As shown in FIG. 18A, the light-emitting device 10 is constituted to have the light source 11 and the color conversion member 12. The light-emitting device 10 has been constituted by using the inorganic member 1 according to the first embodiment for the reflective-type color conversion member 12.

In the light-emitting device 10 shown in FIG. 18A, the light emitted by the light source 11 enters the color conversion member 12, and color of the incident light L1 is converted by the phosphor layer 3 for emission of the reflective light L2 having a color different from the incident light.

(Light Source)

The light source 11 used may be, for example, an LD (laser diode) or an LED (light emitting diode) which is a semiconductor light emitting device. The semiconductor material and the device structure used for the light emitting device are not particularly limited, and preferable examples include semiconductor light emitting devices using a nitride semiconductor such as gallium nitride semiconductor light emitting devices since a device emitting a bright light in the wavelength range of ultraviolet to blue light can be obtained.

The light source 11 may also be constituted so that light source includes an optical system which adequately condenses, diffuses, or reflects the light emitted by the light emitting device in addition to the light emitting device such as LD or LED. Light sources of other types such as high pressure mercury lamp and xenon lamp are also candidates for the light source.

(Color Conversion Member (Wavelength Conversion Inorganic Member))

The color conversion member 12 is a reflective-type color conversion inorganic member which receives an incident light L1 from the light source 11, converts the color, and emits a reflective light L2 of the converted color different from the incident light L1. This embodiment uses the inorganic member 1 according to the first embodiment shown in FIG. 1.

It is to be noted that the phosphor layer 3 in the color conversion member 12 should be formed at least in the area where the incident light L1 from the light source 11 is irradiated, and an embodiment wherein the phosphor layer 3 is provided only on the upper surface of the substrate 2 in the inorganic member 1 shown in FIG. 1A, is also acceptable.

[Operation of the Light-Emitting Device]

Next, operation of the light-emitting device 10 is described by also referring to FIG. 18A (and if desired, also, FIG. 1).

This embodiment is described for the case in which a semiconductor light emitting device which emits a blue light is used for the light source 11. The color conversion member 12 used is the inorganic member 1 having the inorganic phosphor 31 which converts a blue light to a yellow light.

The light source 11 emits a blue light as the incident light L1 which enters the color conversion member 12 (inorganic member 1) from the surface where the phosphor layer 3 is provided. The blue incident light L1 is propagated through the phosphor layer 3 while it is scattered by the interstices 33 in the phosphor layer 3 (see FIG. 1B), reflected by the upper surface of the substrate 2 which is the reflective surface (the right surface in FIG. 18A), and emitted from the side the same as the side where the incident light L1 had entered. This reflective light L2 is the light emitted from the light-emitting device 10.

The blue light which has entered the phosphor layer 3 is partly absorbed by the inorganic phosphor 31 before it is emitted from the phosphor layer 3 after the reflection by the reflective surface. The inorganic phosphor 31 is excited by the absorbed blue light and radiates (emits) a yellow light. In other words, the inorganic phosphor 31 converts the blue light to a yellow light.

Both the yellow light emitted by the inorganic phosphor 31 and the blue light which went through and back the phosphor layer 3 without being absorbed by the inorganic phosphor 31 are emitted from the surface of the side where the phosphor layer 3 is provided. The reflective light L2 emitted includes both the yellow light whose color has been converted by the phosphor layer 3 and the blue light whose color has not been converted, and the reflective light L2 is a mixture of these lights. The light emitted by the light-emitting device 10 can be adjusted to be a white light by adjusting thickness of the inorganic phosphor 31 and proportion of the interstices 33 in the phosphor layer 3 so that the blue light and the yellow lights would be at an adequate ratio.

It is to be noted that this embodiment is not limited to the white light, and the entire incident light L1 may be converted to the yellow light for emission of the yellow light. Alternatively, the embodiment can be constituted by using an inorganic phosphor 31 which converts the incident light L1 to a green light or a red light. In addition, various colors may be emitted by constituting the phosphor layer 3 from a lamination or mixture of different types of inorganic phosphors 31 and conducting the color conversion.

The light-emitting device 10 shown in FIG. 18A may also be constituted by using the inorganic member 1B according to the second embodiment shown in FIG. 6 or the inorganic member 1C according to the third embodiment shown in FIG. 8 instead of the inorganic member 1 for the color conversion member 12. The light-emitting device 10 having a higher light-emitting efficiency is produced in the case of the inorganic member 1B according to the second embodiment, by providing a reflective layer 4 having a reflectance higher than the substrate 2, and in the inorganic member 1C according to the third embodiment, by providing the dielectric layer 7 in addition to the reflective layer 4.

<Seventh Embodiment>

Next, the light-emitting device according to the seventh embodiment is described.

The light-emitting device according to the seventh embodiment is a light-emitting device prepared by using a plurality of reflective-type color conversion members each converting the light into different colors.

[Constitution of the Light-Emitting Device]

Figure 18B:
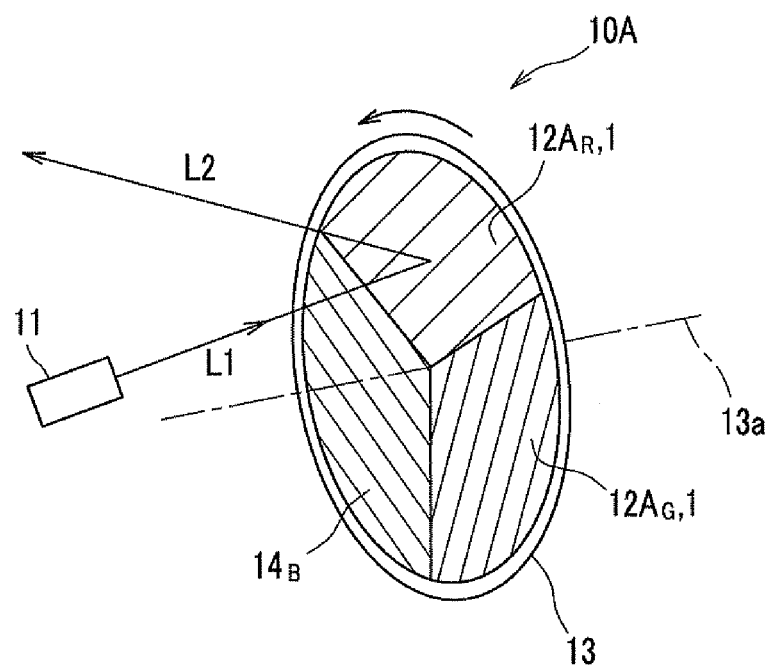
FIG. 18B is a schematic view showing constitution of a light emitting device according to seventh embodiment.

First, constitution of the light-emitting device 10A is described by referring to FIG. 18B (and if desired, FIG. 1). The light-emitting device 10A is constituted from the light source 11 and a color wheel 13. The color wheel 13 has two types of color conversion members $12A_R$ and $12A_G$, and a reflector $14_B$.

The light-emitting device 10A according to this embodiment has a color wheel 13, and with the rotation of the color wheel 13, the incident light L1 from the light source 11 is sequentially emitted as the reflective light L2 having three different colors. This light-emitting device 10A may be used, for example, as a light source device of a projector.

(Light Source)

The light source 11 may be a semiconductor light emitting device such as LD or LED, or a light source of other system such as high pressure mercury lamp or xenon lamp, and accordingly, detailed explanation is omitted.

In this embodiment, the light source 11 emits a blue light.

(Color Wheel)

The color wheel 13 has a disk shape, and it rotates around a rotation axis 13a. The device is constituted so that the incident light L1 from the light source 11 is irradiated from the predetermined direction. The color wheel 13 is divided into three sectors, namely, color conversion members $12A_R$ and $12A_G$, and a reflector member $14_B$ with the rotation axis 13a at the center. The color wheel 13 rotates around the rotation axis 13a so that the incident light L1 consecutively irradiates the color conversion members $12A_R$ and $12A_G$ and the reflector $14_B$, and the reflected light L2 is emitted from the light-emitting device 10A. The central angles of the three sectors may be equal with or different from each other.

(Color Conversion Member (Wavelength Conversion Inorganic Member))

The color conversion members $12A_R$ and $12A_G$ are reflective-type color conversion members which convert the incident light L1 from the light source 11 and emit the reflected light L2 having a color different from the incident light L1. In this embodiment, the inorganic member 1 according to the first embodiment is used for the color conversion members $12A_R$ and $12A_G$, and the color conversion members $12A_R$ and $12A_G$ respectively include the phosphor layer 3 each containing the inorganic phosphor 31 which converts the blue light to a red light or a green light.

The phosphor layer 3 should be provided at least in the area where the incident light L1 is irradiated, and accordingly, provision of the phosphor layer 3 in the interior of the color wheel 13 near its center may not be required while it should provided in the peripheral area in circular zone.

(Reflector Member)

The reflector member $14_B$ is a member which does not carry out the color conversion, and this member includes the inorganic member 1 according to the first embodiment wherein a layer of inorganic particles not containing the inorganic phosphor 31 but containing a colorless inorganic filler is provided instead of the phosphor layer 3.

[Operation of the Light-Emitting Device]

Next, operation of the light-emitting device 10A is described by referring to FIG. 18B (and if desired, also FIG. 1).

During the period when the incident light L from the light source 11 irradiates the part of the color wheel 13 where the color conversion member $12A_R$ is provided, the blue incident light L1 is converted by the phosphor layer 3 of the color conversion member $12A_R$ to a red light, and the red reflected light L2 is emitted from the light-emitting device 10A.

When the color wheel 13 has rotated in the direction of the arrow and the incident light L1 from the light source 11 irradiates the part of the color wheel 13 where the color conversion member $12A_G$ is provided, the blue incident light L1 is converted by the phosphor layer 3 of the color conversion member $12A_G$ to a green light, and the green reflected light L2 is emitted from the light-emitting device 10A.

When the color wheel 13 has further rotated in the direction of the arrow and the incident light L1 from the light source 11 irradiates the part of the color wheel 13 where the reflector member $14_B$ is provided, the blue incident light L1 is reflected with no color conversion, and the blue reflected light L2 is emitted from the light-emitting device 10A.

In other words, the light-emitting device 10A periodically emits the red light, the green light, and the blue light with the rotation of the color wheel 13.

In this embodiment, the incident light L1 from the light source 11 is a blue light. The incident light L1, however, is not limited to such blue light. For example, the incident light L1 from the light source 11 may be an ultraviolet light; the inorganic member 1 according to the first embodiment may be used for the color conversion members $12A_R$ and $12A_G$ and the reflector member $14_B$; the color conversion member $12A_R$ may be provided with the phosphor layer containing the inorganic phosphor 31 which converts the ultraviolet light to a red light; the color conversion member $12A_G$ may be provided with the phosphor layer 3 containing the inorganic phosphor 31 which converts the ultraviolet light to a green light; and the reflector member $14_B$ may be provided with the phosphor layer containing the inorganic phosphor 31 which converts the ultraviolet light to a blue light.

Combination of the color of the incident light L1 and the color of the reflected light L2 may also be freely designed, and the device may also be designed to consecutively emit the reflected lights L2 of two colors or 4 or more colors.

In this embodiment, the color conversion members 12A and $12A_G$ have been described for the case where all of the blue incident light L1 is absorbed by these members for conversion into the red and the green lights, respectively. However, the embodiment may also be constituted so that a part of the incident light L1 is absorbed by these members for color conversion, and the color converted light is emitted as a mixture with the original blue light.

<Eighth Embodiment>

Next, the light-emitting device according to the eighth embodiment is described.

The light-emitting device according to the eighth embodiment is a light-emitting device prepared by using the inorganic member 1C according to the third embodiment for the color conversion member.

[Constitution of the Light-Emitting Device]

Figure 19A:
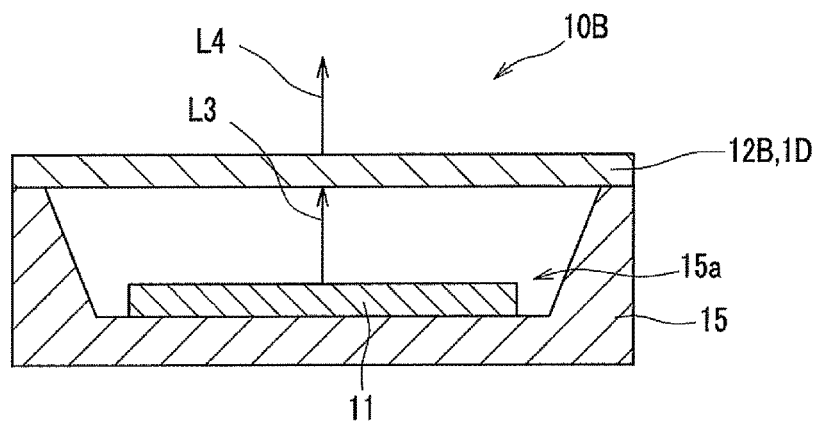
FIG. 19A is a schematic view showing constitution of a light emitting device according to eighth embodiment.

First, constitution of light-emitting device 10B is described by referring to FIG. 19A (and if desired, also FIG. 12). The light-emitting device 10B is constituted from the light source 11, a color conversion member 12B, and a submount 15. The light-emitting device 10B has been constituted by using the inorganic member 1D according to the fourth embodiment for the transmission color conversion member 12B.

(Light Source)

The light source 11 may be a semiconductor light emitting device such as LD or LED, or a light source of other system such as high pressure mercury lamp or xenon lamp, and accordingly, detailed explanation is omitted.

The light source 11 of this embodiment is provided in a submount 15 in its recess 15a, and the light source 11 emits the light (L3) to a color conversion member 12B provided at the opening above the recess 15a.

(Color Conversion Member (Wavelength Conversion Inorganic Member))

The color conversion member 12B is a transmission color conversion member provided at the opening of the recess 15a of the submount 15 to cover the recess 15a. The color conversion member 12B converts the incident light L3 from the light source 11 provided on the bottom surface of the recess 15a, and it emits from its upper surface the light L4 (the transmitted light L4) whose color has been converted to a color different from the incident light L3. In this embodiment, the inorganic member 1 according to the first embodiment shown in FIG. 1 is used for the color conversion member 12B.

Figure 19B:
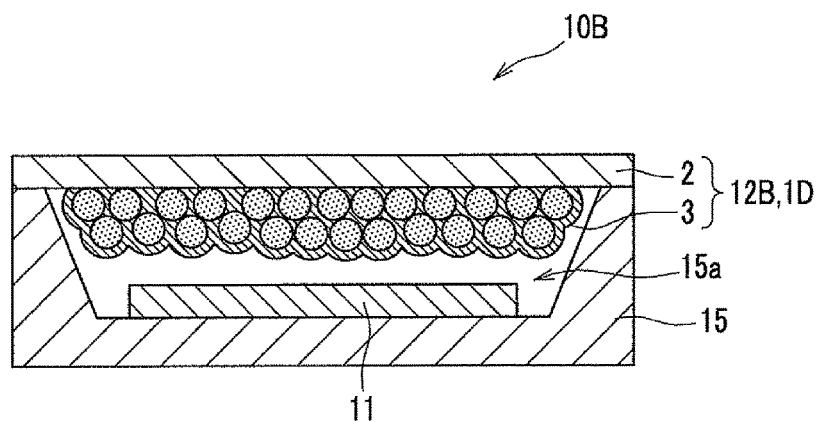
FIG. 19B is a schematic view showing the constitution of the light emitting device according to the eighth embodiment having a phosphor layer disposed on the interior side.
Figure 19C:
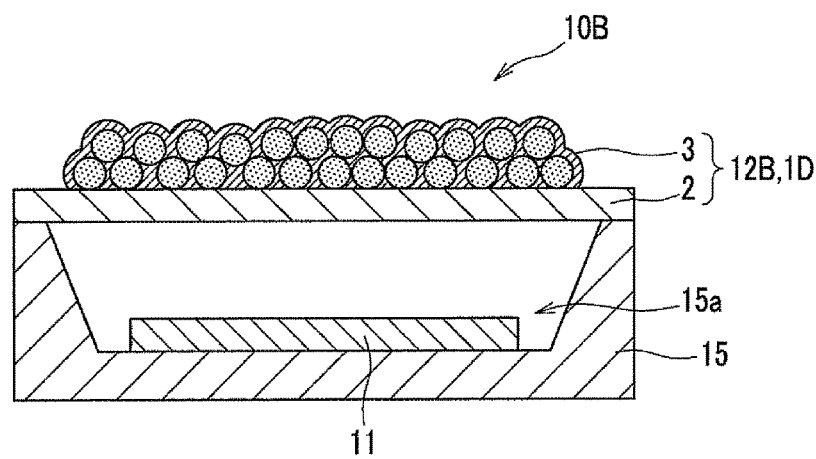
FIG. 19C a schematic view showing the constitution of the light emitting device according to the eighth embodiment having the phosphor layer disposed on the exterior side.

The transmission inorganic member 1 which is the color conversion member 12B may be provided such that the surface having the phosphor layer 3 deposited thereon is on the lower side (the side in the interior of the submount 15)

as shown in FIG. 19B, or on the upper side (the side in the exterior of the submount 15) as shown in FIG. 19C.

In the case of the conventional phosphor member prepared by using a resin, the resin has the risk of coloring and deterioration when the phosphor member is provided with the phosphor layer 3 facing the interior side of the submount 15 as in the case of the embodiment of FIG. 19B since the phosphor layer 3 is exposed to the light in sealed condition. On the other hand, the phosphor member also has the risk of decrease in the color conversion efficiency when the phosphor member is provided with the phosphor layer 3 facing exterior of the submount 15 as in the case of the embodiment of FIG. 19C since the resin may undergo deterioration by oxidation or moisture in the atmosphere.

The color conversion member 12B (inorganic member 1D) of this embodiment is entirely constituted form inorganic materials, and therefore, the member is free from the risk of deterioration that the member prepared by using a resin material suffers. Accordingly, the color conversion member 12B can be provided in the light-emitting device 10B at any desired position suitable in view of the function of the light-emitting device 10B or the substrate 2D with no restriction, and constitution of the light-emitting device 10B having a high color conversion efficiency well adapted for the intended use is thereby enabled.

For example, the constitution shown in FIG. 19C, namely, the constitution in which the surface provided with the inorganic phosphor 31 having the surface unevenness corresponding to the shape of the particles of the inorganic phosphor 31 on the upper side (the side of the light emission) is preferable since light extraction efficiency from the color conversion member 12B is increased. On the other hand, when the light emitting device (the light source 11) is an ultraviolet LD and the constitution shown in FIG. 19B is adopted, leakage of the light having the color of the light emitted from the light source 11 from the light-emitting device 10B can be reduced by providing a dielectric layer which reflects the UV light on the upper surface (the surface of the light emission) of the substrate 2D, and the light-emitting device 10B will have a higher eye safety.

The color conversion member 12B may be provided either at a considerable distance from the light source 11, or in close contact with the light source 11 since the color conversion member 12B has high heat dissipation properties.

(Submount)

The submount 15 is a packaging substrate for packaging the light source 11 such as an LD or an LED. The submount 15 has the recess 15a for packaging the light source 11, and the recess 15a is open in the upper direction. The color conversion member 12B is provided at the opening of the recess 15a to cover the opening.

[Operation of the Light-Emitting Device]

Next, operation of the light-emitting device 10B is described by referring to FIG. 19A (and if desired, FIG. 12).

This embodiment is described for the case in which a semiconductor light emitting device which emits a blue light is used for the light source 11. The color conversion member 12B used is the inorganic member 1D having the inorganic phosphor 31 which converts a blue light to a yellow light.

The light source 11 emits a blue light as the incident light L3 which enters the color conversion member 12B (inorganic member 1D) from the surface where the phosphor layer 3 is provided. The blue incident light L3 is propagated through the phosphor layer 3 while it is scattered by the interstices 33 in the phosphor layer 3 (see FIG. 1B), and passes through the color conversion member 12B (as the transmitted light L4) and emitted from the upper surface as the output light from the light-emitting device 10B.

The blue light which has entered the phosphor layer 3 is partly absorbed by the inorganic phosphor 31 before it is emitted from the phosphor layer 3 after its transmission through the phosphor layer 3. The inorganic phosphor 31 is excited by the absorbed blue light and radiates (emits) a yellow light. In other words, the inorganic phosphor 31 converts the blue light to a yellow light.

Both the yellow light emitted by the inorganic phosphor 31 and the blue light which has transmitted through the phosphor layer 3 without being absorbed by the inorganic phosphor 31 are emitted from the surface opposite to the surface from which the incident light L3 has entered as the transmitted light L4. The transmitted light L4 includes both the yellow light whose color has been converted by the phosphor layer 3 and the blue light whose color has not been converted, and the transmitted light L4 is a mixture of these lights. The light emitted by the light-emitting device 10B can be adjusted to be a white light by adjusting thickness of the inorganic phosphor 31 and proportion of the interstices 33 (see FIG. 1B) in the phosphor layer 3 so that the blue light and the yellow lights would be at an adequate ratio.

It is to be noted that this embodiment is not limited to the white light, and the entire incident light L3 may be converted to the yellow light for emission of the yellow light. Alternatively, the embodiment can be constituted by using an inorganic phosphor 31 which converts the incident light L1 to a green light or a red light. In addition, various colors may be emitted by constituting the phosphor layer 3 from a lamination or mixture of different types of inorganic phosphors 31 and conducting the color conversion.

The light-emitting device 10B shown in FIG. 19A may also be constituted by using the inorganic member 1E according to the fifth embodiment shown in FIG. 15 instead of the inorganic member 1D for the color conversion member 12B.

<Ninth Embodiment>

Next, the light-emitting device according to the ninth embodiment is described.

The light-emitting device according to the ninth embodiment is the light-emitting device prepared by using a plurality of transmission color conversion members each converting the light into different colors.

[Constitution of the Light-Emitting Device]

Figure 20:
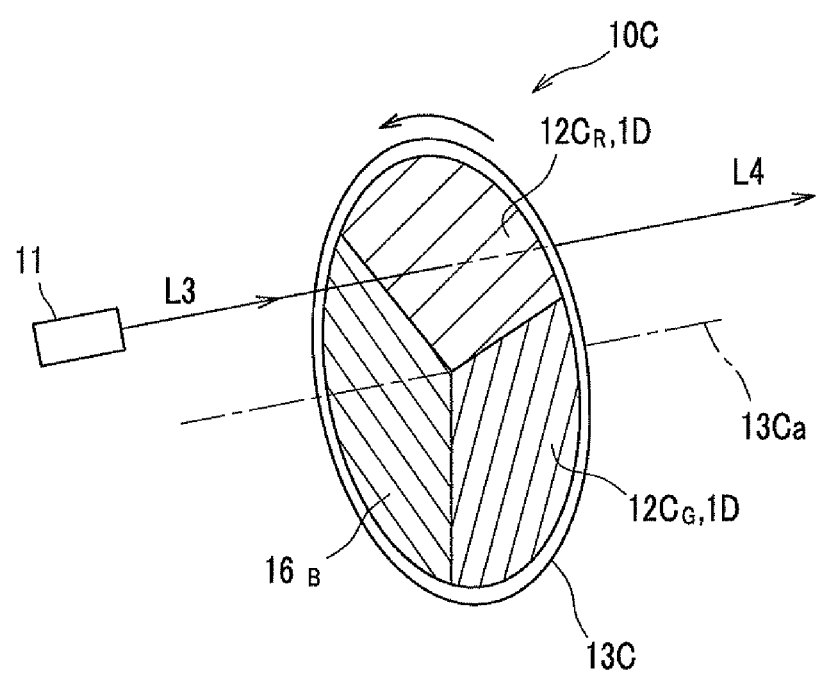
FIG. 20 is a schematic view showing constitution of a light emitting device according to ninth embodiment.

First, constitution of the light-emitting device 10C is described by referring to FIG. 20 (and if desired, also FIG. 12). The light-emitting device 10C has a light source 11 and a color wheel 13C.

The light-emitting device 10C according to this embodiment has a color wheel 13, and with the rotation of the color wheel 13, the incident light L3 from the light source 11 is sequentially converted and emitted as the transmitted light L4 having three different colors. This light-emitting device 10C may be used, for example, as a light source device of a projector.

(Light Source)

The light source 11 may be a semiconductor light emitting device such as LD or LED, or a light source of other system such as high pressure mercury lamp or xenon lamp, and accordingly, detailed explanation is omitted.

In this embodiment, the light source 11 emits a blue light.

(Color Wheel)

The color wheel 13C has a disk shape, and it rotates around a rotation axis 13Ca. The device is constituted so that the incident light L3 from the light source 11 is irradiated from the predetermined direction. The color wheel 13C is divided into three sectors, namely, including fan-shaped color conversion members $12C_R$ and $12C_G$, and a reflector member $16_B$ with the rotation axis 13Ca at the center. The color wheel 13C rotates around the rotation axis 13Ca so that the incident light L3 consecutively irradiates the color conversion members $12C_R$ and $12C_G$ and the reflector $16_B$, and the transmitted light L4 is emitted from the light-emitting device 10C. The central angles of the three sectors may be equal with or different from each other.

(Color Conversion Member (Wavelength Conversion Inorganic Member))

The color conversion members $12C_R$ and $12C_G$ are transmission-type color conversion members which convert the incident light L3 from the light source 11 and emit the transmitted light L4 having a color different from the incident light L3. In this embodiment, the inorganic member 1C according to the third embodiment is used for the color conversion members $12C_R$ and $12C_G$, and the color conversion members $12C_R$ and $12C_B$ respectively include the phosphor layer 3 each containing the inorganic phosphor 31 which converts the blue light to a red light or a green light.

The phosphor layer 3 should be provided at least in the area where the incident light L3 is irradiated, and accordingly, provision of the phosphor layer 3 in the interior of the color wheel 13C near its center may not be required while it should provided in the peripheral area in circular zone.

(Light Transmissible Member)

The light transmissible member $16_B$ is a member which does not carry out the color conversion, and this member includes the inorganic member 1C according to the third embodiment wherein a ceramic layer not containing the inorganic phosphor 31 but containing a colorless inorganic filler is provided instead of the phosphor layer 3.

The color conversion members $12C_R$ and $12C_G$ may be provided either with the surface of the phosphor layer 3 on the side of the light incidence or the light emission. However, provision of the color conversion members with surface of the side where the inorganic phosphor 31 is provided having the surface unevenness corresponding to the shape of the particles of the inorganic phosphor 31 on the side of the light emission is preferable in view of improving the light extraction efficiency from the color conversion members $12C_R$ and $12C_G$. Similarly, the light transmissible member $16_B$ is preferably provided such that the surface having the ceramics layer having the surface unevenness corresponding to the shape of the inorganic filler particles is on the side of the light emission.

[Operation of the Light-Emitting Device]

Next, operation of the light-emitting device 10C is described by referring to FIG. 20 (and if desired, also FIG. 12).

During the period when the incident light L3 from the light source 11 irradiates the part of the color wheel 13C where the color conversion member $12C_R$ is provided, the blue incident light L3 is converted by the phosphor layer 3 of the color conversion member $12C_R$ to a red light, and the red transmitted light L4 is emitted from the light-emitting device 10C.

When the color wheel 13C has rotated in the direction of the arrow and the incident light L3 from the light source 11 irradiates the part of the color wheel 13C where the color conversion member $12C_G$ is provided, the blue incident light L3 is converted by the phosphor layer 3 of the color conversion member $12C_G$ to a green light, and the green transmitted light L4 is emitted from the light-emitting device 10C.

When the color wheel 13C has further rotated in the direction of the arrow and the incident light L3 from the light source 11 irradiates the part of the color wheel 13 where the light transmissible member $16_B$ is provided, the blue incident light L3 is reflected with no color conversion, and the blue transmitted light L4 is emitted from the light-emitting device 10C.

In other words, the light-emitting device 10C periodically emits the red light, the green light, and the blue light with the rotation of the color wheel 13C.

In this embodiment, the incident light L3 from the light source 11 is a blue light. The incident light L3, however, is not limited to such blue light. For example, the incident light L3 from the light source 11 may be an ultraviolet light; the inorganic member 1D according to the fourth embodiment may be used for the color conversion members $12C_R$ and $12C_G$ and the light-emitting member $16_B$; the color conversion member $12C_R$ may be provided with the phosphor layer 3 containing the inorganic phosphor 31 which converts the ultraviolet light to a red light; the color conversion member $12C_G$ may be provided with the phosphor layer 3 containing the inorganic phosphor 31 which converts the ultraviolet light to a green light; and the light-emitting member $16_B$ may be provided with the phosphor layer 3 containing the inorganic phosphor 31 which converts the ultraviolet light to a blue light.

Combination of the color of the incident light L3 and the color of the transmitted light L4 may also be freely designed, and the device may also be designed to consecutively emit the transmitted lights L4 of two colors or 4 or more colors.

In this embodiment, the color conversion members 12C and $12C_G$ have been described for the case that all of the blue incident light L3 is absorbed by these members for conversion into the red and the green lights, respectively. However, the embodiment may also be constituted so that a part of the incident light L3 is absorbed by these members for color conversion, and the color converted light is emitted as a mixture with the original blue light.

Next, an embodiment of the inorganic member having two or more types of color conversion phosphors is described.

For example, when a light of daylight color with high color rendering property is required, combination of three light components, namely, red, blue, and green components is preferable. This has been realized in the prior art by a complicated constitution such as simultaneous use of two or more light emitting devices each emitting different color or combination of two or more color conversion phosphors. However, in the case of the LED used in high-output, high-load applications, the phosphors available for such applications were limited because high heat resistance or high water resistance was required in such application.

In view of such situation, the inorganic members according to the embodiments as described below are not much restricted for their shape and the inorganic phosphors used for their production, and these inorganic members have improved color conversion efficiency and compact structure.

<10th Embodiment>

[Constitution of the Inorganic Member]

Figure 24A:
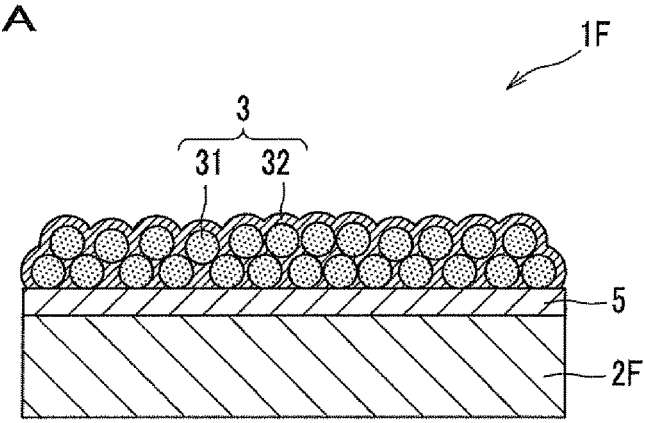
FIG. 24A is a schematic cross-sectional view showing constitution of an inorganic member according to 10th embodiment.

Structure of the inorganic member according to the 10th embodiment is described by referring to FIG. 24A.

The inorganic member 1F according to the 10th embodiment includes a light transmissible substrate 2F, a light transmissible layer 5 on the upper surface of the light transmissible substrate 2F, and a phosphor layer (inorganic particle layer) 3 above the upper surface of the substrate 2F with the intervening light transmissible layer 5. The light transmissible substrate 2F contains an inorganic phosphor (wavelength conversion substance) of a first inorganic material (not shown). In other words, the inorganic member 1F according to the 10th embodiment is the inorganic member 1D according to the fourth embodiment shown in FIG. 12 wherein the substrate 2F is used instead of the substrate 2D. Since the constitution other than the substrate 2F is similar to the constitution of the fourth embodiment, detailed description is omitted as appropriate to avoid redundancy.

In FIG. 24A, indication of the interstice 33 (see FIG. 1B) formed in the interior of the phosphor layer 3 is omitted. Indication of the interstice 33 is also omitted in FIG. 24B and FIG. 24C respectively showing constitution of the inorganic member 1G according to the 11th embodiment and the inorganic member 1H according to the 12th embodiment.

In the inorganic member 1F according to the 10th embodiment, the substrate 2F and a light transmissible layer 5 are constituted by using a light transmissible material, and therefore, the light irradiated from upper or lower direction and the light which has undergone the color conversion by the color conversion member are transmissible through the substrate 2F and the light transmissible layer 5.

When the light enters into the inorganic member 1F according to this embodiment from the side of the phosphor layer 3, a part of the incident light is absorbed by the particulate second inorganic material in the phosphor layer 3 and converted into a light having a color different from the color of the incident light, and the other part of the incident light is absorbed in the first inorganic material in the substrate 2F and converted into a light having a color different from the color of the incident light, and both converted lights are emitted from the side of the substrate 2F which is opposite to the side where the incident light entered the substrate 2F.

On the other hand, when the light enters into the inorganic member 1F according to this embodiment from the side of the substrate 2F, a part of the incident light is absorbed by the first inorganic material in the substrate 2F and converted into a light having a color different from the color of the incident light, and the other part of the incident light is absorbed in the particulate second inorganic material in the phosphor layer 3 and converted into a light having a color different from the color of the incident light, and both converted lights are emitted from the side of the phosphor layer 3 which is opposite to the side where the incident light entered.

Accordingly, the inorganic member 1F according to this embodiment may be used as a transmission color conversion inorganic member.

Next, the constitution of the inorganic member 1F is described in detail.

(Substrate (Base Body))

The substrate 2F is a light transmissible member containing a color conversion member (not shown) of the first inorganic material, and the substrate 2F also has the function of supporting the phosphor layer 3. It may also have the function of regulating the light and efficiently dissipating the heat. The substrate 2F may be formed by using a material which has been adequately selected according to the intended use.

The substrate 2F transmits the incident light, the light whose color has been converted by the first inorganic material in the substrate 2F, and the light whose color has been converted by the second inorganic material in the phosphor layer 3. The light transmittance which is ratio of the amount of the transmitted light to the amount of incident light is used as a measure of the light transmission, and this light transmittance is at least 50%, preferably at least 70%, and more preferably at least 90%.

The substrate 2 may be formed by using a transparent inorganic material such as glass, an oxide such as $Al_2O_3$ or $SiO_2$ or a complex oxide, a nitride such as AlN or GaN or a oxynitride, a carbide such as SiC or a carbonitride, a halide, or a light transmissible carbon.

The substrate 2F contains an inorganic phosphor of the first inorganic material which emits a light having a color different from the incident light (not shown), and accordingly, the substrate 2F has a color conversion function whereby a part or all of the light which has entered from upper or lower direction is absorbed and a light which has a color different from the incident light emitted.

The light which has entered the substrate 2F is absorbed by the inorganic phosphor of the first inorganic material in the substrate 2F and a light having a color different from the incident light is thereby emitted.

The inorganic phosphor of the first inorganic material of the substrate 2F may be present in various forms. The inorganic phosphor of the first inorganic material may constitute the main ingredient of the substrate 2F, or it may constitute a part of the light transmissible material constituting the substrate 2F. Alternatively, the inorganic phosphor of the first inorganic material may form a thin layer on the surface or in the interior of the substrate 2F.

Main embodiments of the substrate 2F may be classified as described below.

(1) A substrate of a polycrystalline phosphor produced by sintering solely an inorganic phosphor. This substrate may be produced by sintering a crystalline inorganic phosphor powder such as an oxide such as YAG or a non-oxide such as nitride or sulfide.

(2) A substrate of inorganic phosphor single crystal or inorganic phosphor complex material produced by crystal growth from a melt.

(3) A substrate of a transparent inorganic material having phosphor fine particles dispersed therein. This substrate may be produced by mixing a transparent inorganic material such as glass, alumina, or silica with inorganic phosphor fine particles.

(4) A substrate of a light-emitting glass (5) A substrate having a transparent substrate and a phosphor thin film formed on the surface of the transparent substrate. The transparent substrate may be a sintered plate, a single crystal plate, a glass plate, a film, or the like. The single crystal plate used may be the one of a transparent inorganic compound such as sapphire, ZnO, $SiO_2$, GaN, or $Ga_2O_3$. The phosphor thin film may be formed by vapor deposition, thermal spraying, or sputtering.

(6) A substrate of a material prepared by sandwiching a layer of an inorganic phosphor between layers of a transparent inorganic compound These embodiments have been described by way of examples, and any desired embodiment may be selected depending on the properties of the inorganic phosphor and the intended object and use of the inorganic member 1F. For example, an inorganic phosphor having low heat resistance is unsuitable for use in the embodiment involving a heating process in the production.

An exemplary production method for each of the main embodiments of the substrate 2F as described above is described in detail.

(1) Substrate of Polycrystalline Phosphor Produced by Solely Sintering Inorganic Phosphor A YAG phosphor powder is pressed by using a press, a cold isostatic pressing (CIP) apparatus, or the like to produce a molded article for the sintering. This article is placed in a hot isostatic press (HIP) and sintered under the pressure at a temperature of 1500° C. or higher. Application of a high temperature and high pressure results in the melting of the phosphor powder surface and fusion of the particles, and a bulk phosphor sintered article is thereby produced. This sintered article is sliced into predetermined thickness, cut, polished, and then annealed in a weakly reductive atmosphere to produce a YAG phosphor sintered plate substrate. Substrates emitting lights of various colors can be produced by changing the composition of the YAG phosphor. Exemplary methods used for the sintering include HIP, spark plasma sintering (SPS), vacuum sintering, hot press sintering, and phosphor substrate of an oxide phosphor or phosphors of other composition can be produced by changing temperature, atmosphere, and pressure.

(2) Substrate of an Inorganic Phosphor Single Crystal Produced by Crystal Growth from a Melt The single crystal of the YAG phosphor may be produced, for example, by Czochralski method or Bridgman method. First, a melt containing the YAG phosphor component is produced, and the single crystal is produced by crystal growth from the melt by using the seed crystal as the nucleus. Then, a substrate of the single crystal of the YAG phosphor is produced by processing into the desired shape and size by considering the crystal orientation. By adding excessive alumina or silica to the metal, a substrate of a complex crystal of uniformly mixed YAG phosphor and excessive component may also be produced.

(3) Substrate of a Transparent Inorganic Material Having Phosphor Fine Particles Dispersed Therein The YAG phosphor powder and a glass powder such as a borosilicate glass or phosphate low-melting glass powder are pressed by a press or CIP to produce a molded article used for the sintering. This article is placed in a vacuum furnace, and sintered by heating to a temperature higher than the softening point of the glass material under a reduced pressure. Use of the reduced pressure enables production of the sintered article having the interstices between the particles filled. The substrate may be produced by processing the sintered article to the desired shape and size.

(4) Substrate of a Light-Emitting Glass

An activator rare earth element which will be the luminescent center and the glass component which will be the matrix are mixed to prepare a melt, and the glass is prepared by cooling and solidifying the melt. The light-emitting glass is prepared by a heat treatment conducted by regulating temperature and atmosphere as desired. The substrate may be produced by processing the glass to the desired shape and size.

(5) Substrate Having a Transparent Substrate and a Phosphor Thin Film Formed on its Surface A transparent alumina substrate is placed in a vapor deposition device, and the vapor deposition is conducted by using SrS, $Eu_2S_3$, and $Ga_2S_3$ for the vapor deposition material to thereby deposit a layer of $SrGaS_4$:Eu phosphor on the surface of the alumina substrate. After the vapor deposition, a heat treatment is conducted under predetermined conditions to develop and crystallize the phosphor particles and produce an alumina substrate having a phosphor thin film layer formed on its surface. The method used for the film deposition may be selected from sputtering, thermal spraying, MBE, CVD, and the like depending on the type of the phosphor.

(6) A Substrate of a Material Prepared by Sandwiching a Layer of an Inorganic Phosphor Between Layers of a Transparent Inorganic Compound In the case of a phosphor material having low durability against the exterior environment such as nano-size phosphor fine particles, such phosphor material may be dispersed in an inorganic adhesive or the like, and the dispersion may be sandwiched between two plates of a transparent inorganic compound such as glass plates for air-tight enclosure for use as the substrate.

Also, the light transmissible substrate 2F may be provided with optical regulation ability so that it has the function of selectively transmitting, diffusing, absorbing, or shielding the light. For example, leakage of the light emitted from a UV-emitting LD (laser diode) light source can be suppressed in a light-emitting device wherein the inorganic member 1F is provided on the upper surface of the LD so that the light from the LD enters from the side of the phosphor layer 3. More specifically, when the light emitted from the LD enters the phosphor layer 3, both the light after the color conversion in the phosphor layer 3 and the light before the color conversion in the phosphor layer 3 will enter the substrate 2F, and if the material of the substrate 2F is selected to have a wavelength selectivity so that the light after the color conversion in the phosphor layer 3 passes through the substrate 2F while the light as emitted from the LD before the color conversion in the phosphor layer 3 is shielded or absorbed by the substrate 2F, direct emission of the light emitted from the LD from the other side (on the side of the substrate 2F) will be prevented. In the embodiment of such constitution, the substrate 2F may be prepared by using Pyrex (registered trademark) glass which does not transmit the UV or a dielectric UV-reflecting layer may be provided on the surface of the substrate 2F.

Furthermore, an inorganic filler which irregularly reflects the light, for example, may be provided in the interior or on the surface of the light transmissible substrate 2F to provide the substrate with light diffusion property. Such constitution realizes improvement in the uniformity of the color conversion. Exemplary inorganic fillers which irregularly reflect the light include those having a refractive index considerably different from the substrate 2F, light transmissivity, and small particle size. Exemplary fillers which may be used when the glass used for the substrate 2F is the one having a refractive index of about 1.5 include $TiO_2$ having a refractive index of 2.5 to 2.7. When $SiO_2$ is used for the substrate 2, exemplary fillers include $TiO_2$, $Al_2O_3$, and C (diamond).

Light transmissible materials are generally electrically insulated. However, if electroconductivity is provided with the substrate 2F by providing a film of a light transmissible electroconductive material on the surface, by forming the substrate 2F from a light transmissible electroconductive material, or by adding a light transmissible electroconductive filler in the substrate 2F, a method such as electrodeposition or electrostatic coating can be used in the subsequent formation of the phosphor layer 3.

The substrate 2F may preferably include a material having high heat conductivity for efficient dissipation of the heat generated by Stokes loss of the light converted in the interior of the substrate 2F and the phosphor layer 3 through the substrate 2F. More specifically, the material used for the substrate 2F may have a heat conductivity of at least 5 W/m·K, and more preferably at least 100 W/m·K. An exemplary such light transmissible material having the heat conductivity is AlN. The heat conductivity of the substrate 2 can be improved also by adding an inorganic filler or the like having a high heat conductivity. Examples of the inorganic filler or the like having a high heat conductivity include AlN, SiC, and C (diamond).

Furthermore, the shape of the substrate 2F is not limited to the plate shape as long as it supports the phosphor layer 3 as a structural member, and the substrate 2 may also have a three dimensional structure for facilitating assembly in a light-emitting device or realizing a light gathering function. For example, a glass substrate 2 may be fabricated to function as a lens, and the phosphor layer 3 may be directly formed on the lens-shaped substrate 2F to produce a color conversion inorganic member 1F including a lens integrally formed with a phosphor layer which is the color conversion member. Such constitution facilitates optical regulation.
(Phosphor Layer (Inorganic Particle Layer))

The phosphor layer 3 of this embodiment has a constitution similar to the phosphor layer 3 of the inorganic member 1D according to the fourth embodiment shown in FIG. 12.
(Inorganic Phosphor (Wavelength Conversion Member))

The inorganic phosphor in the substrate 2F and the inorganic phosphor 31 in the phosphor layer 3 are respectively a color conversion member of the first inorganic material or the second inorganic material which absorbs the light and emit a light having a color different from the color of the light which have been absorbed.

The phosphor material used for the inorganic phosphor 31 is not particularly limited as long as it is a material which absorbs the incident light (excitation light) and conducts color conversion (wavelength conversion) of the absorbed light into a light having a color (wavelength) different from the absorbed light.

The inorganic phosphor in the substrate 2F and the inorganic phosphor 31 in the phosphor layer 3 may be the same type or different types.

When the same type of inorganic phosphor is used, the inorganic member 1F will have the same type of inorganic phosphor in both the substrate 2F and the phosphor layer 3, and as a consequence, probability of the exposure of this type of the inorganic phosphor to the light which has entered the inorganic member 1F from the light source or the like in the substrate 2F or the phosphor layer 3 will be increased, and this in turn enables increase in the light color conversion efficiently by the same type of inorganic phosphor.

On the other hand, when the inorganic phosphors of different types are used, the inorganic member 1F will have different types of inorganic phosphors in both the substrate 2F and the phosphor layer 3. As a consequence, a part of the light which has entered the inorganic member 1F from the light source or the like will be irradiated to the inorganic phosphor 4 in the substrate 2F, and different part of the light will be irradiated to the inorganic phosphor 31 in the phosphor layer 3. Accordingly, a mixture of the light emitted from the inorganic phosphor in the substrate 2F and the light emitted by the inorganic phosphor 31 in the phosphor layer 3 is emitted from the inorganic member 1F. In some cases, a part of the light emitted from the inorganic phosphor in the substrate 2F or the inorganic phosphor 31 in the phosphor layer 3 will be irradiated to the other type of inorganic phosphor, leading to the emission of a light having a different color.

Accordingly, when the inorganic phosphors of different types are used, a mixture of various different colors including the incident light which was not irradiated to the inorganic phosphors will be emitted from the inorganic member 1F.

The inorganic phosphor in the substrate 2F and the inorganic phosphor 31 in the phosphor layer 3 can be changed independently from each other, and accordingly, an inorganic member 1F having various combinations of inorganic phosphors of different types each having different particle diameter, content, form of inclusion, and the like can be designed as desired. As a consequence, lights having various spectra can be freely emitted, and an optimal combination can be selected and used from these combinations depending on the purpose and intended application.

For example, when the light source is a blue color, and the substrate 2F is prepared by using a substrate of a material having LAG (lutetium-aluminum-garnet) phosphor fine particles which convert the blue light to a green light dispersed in a transparent glass, and the inorganic phosphor 31 in the phosphor layer 3 is an inorganic phosphor which converts the blue light to a red light, a white light can be prepared by mixing these three colors including the light from the light source.

The inorganic member 1F of this embodiment may also be prepared by using different types of phosphors for each of the inorganic phosphor in the substrate 2F and the inorganic phosphor 31 in the phosphor layer 3. Use of such phosphors of different types as a mixture is effective for emission of special colors and production of a member with simple structure.

The inorganic member 1F of this embodiment may also have a constitution having two or more phosphor layers 3. For example, the inorganic member 1F may have two phosphor layers 3 on the front and rear side of the substrate 2F, or alternatively, two or more phosphor layers 3 formed on one side of the substrate 2F. Such constitution enables production of an inorganic member 1F having three or more different types of phosphors including the inorganic phosphor in the substrate 2F.

In this embodiment, an inorganic member can be produced without employing a complicated constitution as in the cases of prior art members produced by combining a plurality of light emitting devices each emitting the light of different color or combining a plurality of color conversion phosphors, and emission of a mixture of lights each having a color different from the incident light by one inorganic member 1F is enabled by a compact structure.

In addition, prior art inorganic members used a plurality of color conversion phosphors by laminating the plurality of color conversion phosphors by the use of a resin adhesive or by dispersing the plurality of color conversion phosphors in a resin. In contrast, this embodiment mainly includes inorganic materials, and use of resin materials which are inferior in heat conductivity, heat resistance, and light resistance is unnecessary, and this has enabled improvement in heat dissipation properties as well as the durability.

Next, the merits of using a plurality of different types of phosphors in one inorganic member 1F are further described in view of three features, namely, the light emitting efficiency, durability, and mixing of the color.
(Light Emitting Efficiency)

Conventional color conversion members containing a plurality of phosphors suffered from the problem of loss by secondary absorption, namely, loss of energy conversion efficiency of the LED. More specifically, in such color conversion members, the light emitted by a phosphor emitting a light with a shorter wavelength is absorbed by a phosphor emitting a light with a longer wavelength, and this conversion of the wavelength leads to gradual loss of the light energy, and hence, in substantial loss of the total amount of the light emitted from the LED, namely, loss of the energy conversion efficiency of the LED.

This problem of the loss by secondary absorption occurred, for example, in the case when a mixture of two or more different types of phosphors is used in the same phosphor layer of the inorganic member, or in the case when a phosphor emitting a light with a shorter wavelength is included in the phosphor layer nearer to the light source and a phosphor emitting a light with a shorter wavelength is included in the phosphor layer farther from the light source because of the properties of the phosphor.

However, in this embodiment, it is possible to place a phosphor (absorbing a light with a longer wavelength and) emitting a light with a longer wavelength in the substrate 2F or the phosphor layer 3 nearer to the light source, and a phosphor (absorbing a light with a shorter wavelength and) emitting a light with a shorter wavelength in the substrate 2F or the phosphor layer 3 farther from the light source to thereby reduce the loss by secondary absorption and improve the light emitting efficiency because the light emitting efficiency of the LED is generally improved when the phosphor used for the color conversion is used at a smaller amount and the color conversion is conducted at a lower frequency.

(Durability)

Some of the conventional color conversion members containing a plurality of phosphors have been those having a constitution such that a resin layer having dispersed therein a phosphor of the type different from the phosphor in the substrate is provided on one side or on both sides of a substrate having the color conversion function. However, the phosphor dispersed in the resin had no heat dissipation pathway provided therewith, and the resin did not have a particularly high gas barrier property, and therefore, the phosphor and the resin were easily deteriorated by the exterior environment, and this resulted in the problematic durability.

In contrast, the constitution of this embodiment is such that the phosphor layer 3 having the inorganic phosphor 31 is continuously connected with the substrate 2F having the color conversion function, and this facilitates heat dissipation of the inorganic phosphor 31 as well as improvement of the durability. Since the inorganic phosphor 31 is protected by the uniform cover layer 32 of an inorganic material having a high gas barrier property, the inorganic phosphor 31 is less likely to be deteriorated by the exterior environment, and the durability is also improved.

In addition, a phosphate low-melting glass having a melting point around 400° C., for example, was not used for the color conversion member because of its deliquescence. In this embodiment, however, the cover layer 32 of an inorganic material protects not only the inorganic phosphor 31 but also the substrate 2F from the exterior environment, and therefore, durability of the inorganic member 1F is thereby improved. This in turn means that use of a low-melting glass or a phosphor with low heat resistance which could not be used for the material constituting the inorganic member 1F in conventional constitution is enabled in this embodiment, and hence, a wider variety of phosphors can be used for the inorganic member.

(Color Mixing)

In conventional members, color mixing has been improved, for example, by adding a filler in the glass used for producing the substrate to thereby improve uniformity of color mixing of the inorganic member 1F. The type of the phosphor and the filler which can be added to the glass for realizing excellent color mixing, however, has been limited.

However, the member of this embodiment includes the substrate 2F which has the color conversion function and the inorganic particle layer 3 having the interstices 33 formed on the substrate 2F, and also, the surface of the inorganic particle layer 3 has unevenness, and therefore, uniformity of the color mixing is improved without significant loss of the light emitting efficiency.

The uniformity of the color mixing can also be improved by regulating constitution of the inorganic particle layer 3 such as porosity of the interstice 33, thickness the layer, type, particle size, content, shape, and the like of the inorganic phosphor 31.

The color mixing may also be improved by providing a reflective layer on apart or on the entire surface of the substrate 2F on the side opposite to the incidence of the light from the light emitting device.

As described above, use of different types of material for the inorganic phosphor in the substrate 2F and the inorganic phosphor 31 in the phosphor layer 3, namely, the first inorganic material and the second inorganic material is preferable in view of realizing various excellent effects.

In addition, the shape of the substrate 2F is not limited to the plate shape, and as shown in FIG. 5, the substrate may have any desired shape.

Other constituents are similar to the inorganic member 1D according to the fourth embodiment shown in FIG. 12, and accordingly, detailed explanation is omitted. In addition, the inorganic member 1F according to this embodiment can be prepared by using the substrate 2F instead of the substrate 2D in the production method of the inorganic member 1D according to the fourth embodiment shown in FIG. 13, and accordingly, detailed explanation is omitted.

<11th Embodiment>

Next, the inorganic member according to the 11th embodiment is described.

[Constitution of the Inorganic Member]

Figure 24B:
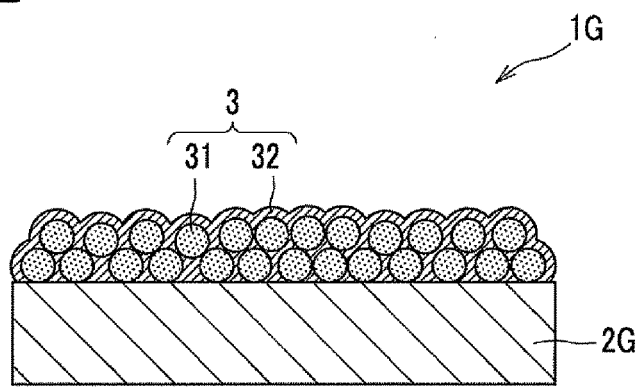
FIG. 24B is a schematic cross-sectional view showing constitution of an inorganic member according to 11th embodiment.

First, constitution of the inorganic member according to the 11th embodiment is described by referring to FIG. 24B. The inorganic member 1G according to the 11th embodiment includes an electroconductive light transmissible substrate 2G and a phosphor layer 3 disposed on the upper surface of the substrate 2G.

The inorganic member 1G according to the 11th embodiment is different from the inorganic member 1F according to the 10th embodiment shown in FIG. 24A in that an electroconductive light transmissible substrate 2G is used instead of the light transmissible substrate 2F, and the phosphor layer 3 is provided directly on the upper surface of the substrate 2G without providing the light transmissible layer 5. In addition, the inorganic member 1G according to the 11th embodiment has a constitution similar to that of the inorganic member 1E according to the fifth embodiment shown in FIG. 15 in that the a substrate 2G containing an inorganic phosphor (not shown) of the first inorganic material is used instead of the substrate 2E.

The inorganic member 1G according to the 11th embodiment is used, as in the case of the inorganic member 1F according to the 10th embodiment, as a transmission color conversion member which converts the color of the light that has entered from the side of the phosphor layer 3 or the substrate 2G, and emits the light from the surface opposite to its incidence.

(Substrate (Base Body))

The substrate 2G is a light transmissible plate member for supporting the phosphor layer 3, and it contains an inorganic phosphor (not shown) of the first inorganic material which emits a light having a color different from the incident light.

The material used for the substrate 2G has electroconductivity in addition to the light transmissibility. Exemplary such materials include electroconductive metal oxides containing at least one element selected from the group consisting of Zn (zinc), In (indium), Sn (tin), Ga (gallium), and Mg (magnesium), and more specifically, electroconductive metal oxides such as ZnO, AZO (Al-doped ZnO), IZO (In-doped ZnO), GZO (Ga-doped ZnO), $In_2O_3$, ITO (Sn-doped $In_2O_3$), IFO (F-doped $In_2O_3$), $SnO_2$, ATO (Sb-doped $SnO_2$), FTO (F-doped $SnO_2$), CTO (Cd-doped $SnO_2$), and MgO.

The substrate 2G may be constituted so that the entire substrate 2G has electroconductivity, or as described above, the substrate 2G may have a light transmissible electroconductive layer of ITO, ZnO, or the like formed on its upper surface.

In addition, the shape of the substrate 2G is not limited to the plate shape, and as shown in FIG. 5, the substrate may have any desired shape.

Other constituents are similar to those of the inorganic member 1F according to the 10th embodiment shown in FIG. 24A, and accordingly, detailed explanation is omitted. In addition, the inorganic member 1G according to this embodiment can be produced by repeating the production method of the inorganic member 1E according to the fifth embodiment shown in FIG. 16 except that the substrate 2G is used instead of the substrate 2E, and accordingly, detailed explanation is omitted.

<12th Embodiment>

Next, the inorganic member according to the 12th embodiment is described.

[Constitution of the Inorganic Member]

Figure 24C:
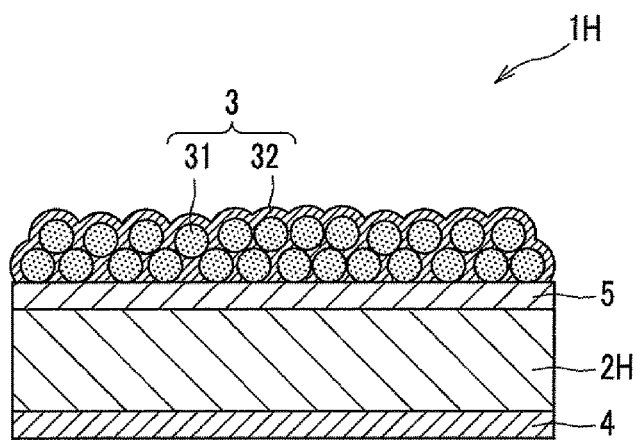
FIG. 24C is a schematic cross-sectional view showing constitution of an inorganic member according to 12th embodiment.

First, constitution of the inorganic member according to the 12th embodiment is described by referring to FIG. 24C. As shown in FIG. 9, the inorganic member 1H according to the 12th embodiment includes a light transmissible substrate 2H, a phosphor layer 3 and a light transmissible layer 5 disposed on the upper surface of the substrate 2H, and a reflective layer 4 on the lower surface of the light transmissible substrate 2H.

The inorganic member 1H according to the 12th embodiment is different from the inorganic member 1F according to the 10th embodiment shown in FIG. 24A in that a reflective layer 4 is provided on the lower surface of the substrate 2H. The inorganic member 1H according to the 12th embodiment is used as a reflective-type color conversion member in which color of the incident light from the side of the phosphor layer 3 is converted and the light is emitted from the same side as the light incidence in contrast to the inorganic member 1F according to the 10th embodiment.

In the inorganic member 1H according to this embodiment, a part of the incident light is converted by the first inorganic material in the substrate 2H to a light having a color different from the color of the incident light, and other part of the incident light is converted by the particulate second inorganic material in the phosphor layer 3 to a light having a color different from the color of the incident light and reflected by the reflective layer 4 on the side opposite from the side where the incident light has entered the substrate 2H to be emitted from the side the same as the light incidence.

Accordingly, the inorganic member 1H can be used as a reflective-type color conversion inorganic member.

The reflective layer 4 may be provided on the entire surface of the substrate 2H on the side opposite to the light incidence or only on the part where the light reaches.

[Production Method of the Inorganic Member]

The reflective layer 4 may be provided by forming a metal layer having a high reflectance for both the incident light and the light having a color converted by the phosphors in the phosphor layer 3 and the substrate 2H on the substrate 2H on the surface opposite to the side of the phosphor layer 3. Examples of the preferable metal having a high reflectance in the visible range include Al, Ag, and alloys containing such metals.

If desired, a layer of a dielectric material may be formed between the substrate 2H and the reflective layer 4. Provision of such layer of a dielectric material results in the more effective reflection by the reflective layer 4 and improvement in the light extraction efficiency from the inorganic member 1H. The dielectric material used is preferably at least one material selected from $SiO_2$, $Al_2O_3$, $Nb_2O_5$, $ZrO_2$, AlN, $TiO_2$, SiON, and SiN.

The reflective layer 4 may be formed by depositing a metal material such as Al or Ag on the substrate 2H by sputtering or vapor deposition.

The reflective layer 4 is preferably formed by providing a reflective layer forming process before the phosphor layer forming process in the flow charts of FIGS. 13 and 16 showing the flow of the production method of the inorganic member. The reflective layer is preferably formed before the masking process or the electroconductive layer forming process.

Since the reflective layer 4 functions as the reflection surface, the surface of the side of the substrate 2H where the reflective layer 4 is formed is preferably processed into a smooth surface before the formation of the reflective layer 4.

The inorganic member 1H according to this embodiment has a constitution similar to the inorganic member 1F according to the 10th embodiment or the inorganic member 1G according to the 11th embodiment except that the substrate 2H has a reflective layer 4, and accordingly, explanation of the constituent members other than the reflective layer 4 is omitted.

The inorganic member 1H according to this embodiment can be produced in a similar manner as the inorganic member 1F according to the 10th embodiment or the inorganic member 1G according to the 11th embodiment except that the substrate 2H has the reflective layer 4 formed, and accordingly, explanation of the production method is omitted.

In this embodiment, the light passes through the substrate 2H and the inorganic particle layer 3 at least twice, namely, just after the incidence into the member and after the reflection. Accordingly, a mixed light having higher uniformity of the light mixing can be obtained, and the inorganic phosphor can be used at a higher efficiency, which leads to the production of a thinner inorganic member 1H with improved heat dissipation property. In addition, the reflective layer 4 can be formed in some limited area of the surface of the substrate 2H for control of the amount of the light reflected and precise adjustment of the color tone.

A modification of this 12th embodiment may have the constitution of the inorganic member 1G having no light transmissible layer 5 according to the 11th embodiment (see FIG. 24B) wherein the reflective layer is formed on the substrate 2G on the surface opposite to the phosphor layer 3.

<13th Embodiment>

Next, the light-emitting device according to the 13th embodiment is described.

The light-emitting device according to the 13th embodiment is a light-emitting device prepared by using the inorganic member 1F according to the 10th embodiment for the color conversion member.

[Constitution of the Light-Emitting Device]

The light-emitting device according to the 13th embodiment is the one prepared by using the inorganic member 1F instead of the inorganic member 1D in the light emitting device 10B according to the eighth embodiment shown in FIG. 19. Other constitution is similar to the eighth embodiment, and accordingly, detailed explanation is omitted.

[Operation of the Light-Emitting Device]

Next, operation of the light-emitting device 10B prepared by using the inorganic member 1F for the color conversion member 12B is described by referring to FIG. 19A (and if desired, also FIG. 24A).

This embodiment is described for the case in which a semiconductor light emitting device which emits a blue light is used for the light source 11. The color conversion member 12B used is the inorganic member 1F in which the substrate 2F has an inorganic phosphor which converts a red light to a green light and the phosphor layer 3 contains the inorganic phosphor 31 which converts a blue light to a red light.

The light source 11 emits a blue light as the incident light L3 which enters the color conversion member 12B (inorganic member 1F) from the surface where the phosphor layer 3 is provided. The blue incident light L3 is propagated through the phosphor layer 3 while it is scattered by the interstices 33 in the phosphor layer (see FIG. 1B), and passes through the substrate 2F (as the transmitted light L4) and emitted from the upper surface as the output light from the light-emitting device 10B.

The blue light which has entered the color conversion member 12B is partly absorbed by the inorganic phosphor 31 before its emission after its transmission through the phosphor layer 3 and the substrate 2F. The blue light is also partly absorbed by the inorganic phosphor in the substrate 2F. The inorganic phosphor 31 is excited by the absorbed blue light and radiates (emits) a red light. In other words, the inorganic phosphor 31 converts the blue light to a red light. The inorganic phosphor 31 in the substrate 2F is excited by the absorbed blue light and radiates (emits) a green light. In other words, the inorganic phosphor 31 in the substrate 2F converts the blue light to a green light.

The red light emitted by the inorganic phosphor 31, the green light emitted by the inorganic phosphor in the substrate 2F, and the blue light which has transmitted through the phosphor layer 3 and the substrate 2F without being absorbed by the inorganic phosphors are emitted as the transmitted light L4 from the surface opposite to the surface from which the incident light L3 has entered. The transmitted light L4 includes the red light whose color has been converted in the phosphor layer 3, the green light whose color has been converted in the substrate 2F, and the blue light whose color has not been converted, and the transmitted light L4 has a color as a mixture of these lights. The light emitted by the light-emitting device 10B can be adjusted to be a white light by adjusting thickness of the inorganic phosphor 31 and proportion of the interstices 33 (see FIG. 1B) in the phosphor layer 3 as well as content of the inorganic phosphor in the substrate 2F so that the blue light, the green light, and the red lights would be at an adequate ratio.

It is to be noted that this embodiment is not limited to the white light, and the entire incident light L3 may be converted to the yellow light for emission of the yellow light. Alternatively, the embodiment can be constituted to conduct the color conversion for emitting a green or a red light.

In addition, various colors may be emitted by using different types of inorganic phosphors in the substrate 2F or the phosphor layer 3, or by constituting the substrate 2F or the phosphor layer 3 from a lamination or mixture of different types of inorganic phosphors 31 and conducting the color conversion.

The light-emitting device 10B shown in FIG. 19A may also be constituted by using the inorganic member 1G according to the 11th embodiment shown in FIG. 24B instead of the inorganic member 1F for the color conversion member 12B.

The light-emitting device 10 shown in FIG. 18A may also be constituted by using the inorganic member 1H according to the 12th embodiment shown in FIG. 24C instead of the inorganic member 1 according to the first embodiment for the color conversion member 12.

As described above, the color conversion inorganic members according to 10th to 12th embodiments have the structure that the inorganic particle layer includes the agglomerates of the particles of the color conversion material covered by the cover layer, and therefore, a high color conversion efficiency is realized by the increased content of the color conversion substance. The light diffusion effects of the interstices also contributes to the high color conversion efficiency. Also, the color conversion inorganic member has reduced restraints for the shape of the member and type of the color conversion material used.

Furthermore, the color conversion inorganic members according to 10th to 12th embodiment contain a plurality of color conversion materials (the first inorganic material and the second inorganic material) in the substrate and in the inorganic particle layer, and accordingly, they can emit a mixture of lights each having a color different from the incident light despite their compact structure.

<14th Embodiment>

[Constitution of the Light-Emitting Device]

Figure 25:
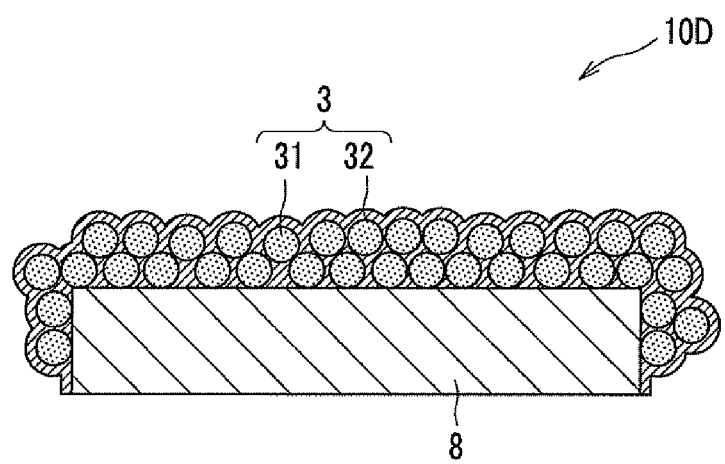
FIG. 25 is a schematic cross-sectional view showing constitution of a light emitting device according to 14th embodiment.

Next, structure of the light-emitting device according to the 14th embodiment is described by referring to FIG. 25.

As shown in FIG. 25, in the light-emitting device 10D according to the 14th embodiment, the phosphor layer (inorganic particle layer) 3 is provided both on the side surface of the semiconductor light emitting device 8 and on the upper surface of the semiconductor light emitting device 8. The phosphor layer 3 includes the particulate inorganic phosphor (wavelength conversion material) 31 and the cover layer 32 covering the inorganic phosphor 31.

In other words, the light-emitting device 10D according to the 14th embodiment employs the semiconductor light emitting device 8 instead of the inorganic member 1 or the like in other embodiments as described above (see, for example, FIG. 1) as the substrate supporting the phosphor layer 3. The semiconductor light emitting device 8 is also the light source. Accordingly, in the light-emitting device 10D according to this embodiment, the semiconductor light emitting device 8 plays the role of both the substrate supporting the phosphor layer 3 and the light source for the light-emitting device 10D.

The phosphor layer 3 has interstices 33 formed in its interior as in the case of the phosphor layer 3 of the first embodiment shown in FIG. 1B. In FIG. 25, however, indication of the interstice 33 has been omitted.

For the description convenience, the surface of the semiconductor light emitting device 8 in the upward direction in FIG. 5 is designated the upper surface. The light-emitting device 10D should have the phosphor layer 3 at least on its upper surface of the semiconductor light emitting device 8. The term "upper surface" is either one of the surface on the side of the substrate or the surface on the side of the semiconductor layer of the semiconductor light emitting device 8. More specifically, the phosphor layer 3 can be provided only on one of the surface on the side of the substrate and the surface on the side of the semiconductor layer of the semiconductor light emitting device 8 since the side of the semiconductor light emitting device 8 in contact with the jig or the insulated substrate in the production process can not be covered with the phosphor layer 3 as will be described with regard to the production method of the light-emitting device.

The term "at least on the upper surface" means that the phosphor layer 3 is provided at least on one of the upper surface and the side surface of the semiconductor light emitting device 8. While the phosphor layer 3 may not necessarily be provided on the side surface of the semiconductor light emitting device 8, the explanation will be made for the case in which the phosphor layer 3 is provided also on the side surface of the semiconductor light emitting device 8. When the phosphor layer 3 is provided also on the side surface of the semiconductor light emitting device 8, the color of the light which has entered from entering from the side surface will be converted to the color tone the same as the light which has entered from the upper surface, and the resulting semiconductor light emitting device 8 is capable of emitting light with uniform color tone.

When a phosphor is provided on the upper and side surfaces of the semiconductor light emitting device 8 by using conventional ceramic member containing an inorganic phosphor produced by sintering, the phosphor has to be processed in to a plate-shape phosphor and adhered to each surface. When a gap is present at the site of the adhesion, the blue light leaks from the gap and this results in the loss of the uniformity of the light emitted. The same problem of the loss of the light uniformity occurs when the plate disposed on the upper surface or the side surface is too long and extends beyond the surface in the side or upper direction with the excessive plate at the site of the juncture. However, the side surface of the semiconductor light emitting device 8 is the surface which has been generated by dicing or scribe breaking with insufficient surface flatness and parallelness. There is also variation in the size of the semiconductor light emitting device 8, and since the height of the semiconductor light emitting device 8 is several hundred micrometers at most, and the size of the plate-shaped phosphor adhered to its side surface is inevitably small, adhesion of the phosphor with no gap or excess is difficult, and hence, it has been difficult to obtain a uniform color tone.

There is an option that the plate-shaped phosphor is placed only on the upper surface, and the side surface is covered with a reflective material such as a resin containing a photoreflective filler. In this case, light loss increases since the light emitted from the side surface of the semiconductor light emitting device 8 is returned to the device, and production of a semiconductor light-emitting device having high efficiency is difficult.

Such problem will be solved if the phosphor layer 3 is provided also on the side surface of the semiconductor light emitting device 8.

The light-emitting device 10D according to this embodiment is a light-emitting device which has a transmission color conversion member which converts the color of a part or all of the light which has been emitted by the semiconductor light emitting device 8 and entered the phosphor layer 3 by the inorganic phosphor 31 of the phosphor layer 3 to a light having a color different from the incident light, and emits the light having the converted color.

Next, constitution of various constituents of the light-emitting device 10D is described in detail.

(Semiconductor Light Emitting Device)

Figure 26A:
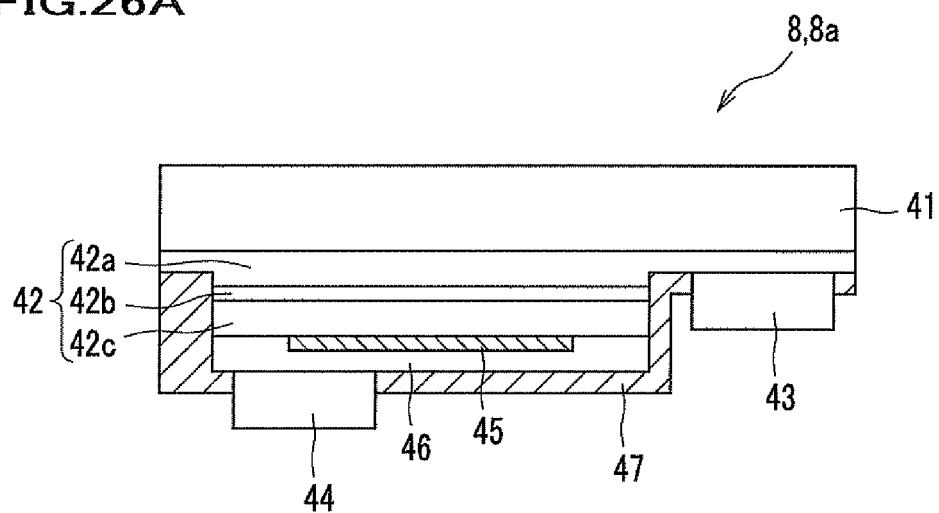
FIG. 26A is a schematic cross-sectional view showing constitution of a face-down packaged or face-up packaged semiconductor light emitting device.
Figure 26B:
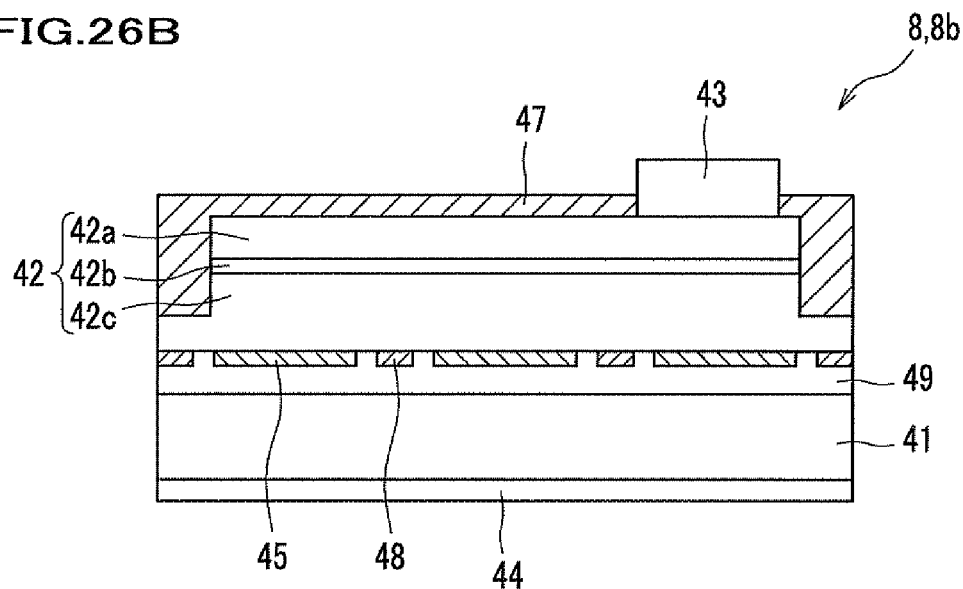
FIG. 26B is a schematic cross-sectional view showing constitution of a semiconductor light emitting device having a perpendicular structure.

The semiconductor light emitting device 8 is not particularly limited, and examples include device 8a for face down (FD) packaging or face up (FU) packaging shown in FIG. 26A and a device having a perpendicular structure shown in FIG. 26B.

As shown in FIG. 26A, the semiconductor light emitting device 8a has a substrate (supporting substrate) 41 and a semiconductor layer 42 on the supporting substrate 41 (in the downside in the drawing). This semiconductor layer 42 includes an n semiconductor layer 42a, an active layer 42b, and a p semiconductor layer 42c disposed in this order, and an electrode 43 is formed on the n semiconductor layer 42a. A p electrode 44 is formed above the p semiconductor layer 42c with an intervening reflective electrode (or transparent electrode) 45 and cover electrode 46. The semiconductor layer 42 (and cover electrode 46) of the semiconductor light emitting device 8a is covered by an insulated protective film 47.

As shown in FIG. 26B, the semiconductor light emitting device 8b has the supporting substrate 41 and the semiconductor layer 42 above the supporting substrate 41 with an intervening wafer adhesion layer (Au—Au bonding layer) 49. This semiconductor layer 42 includes the p semiconductor layer 42c, the active layer 42b, and an n semiconductor layer 42a disposed in this order, and the electrode 43 on the n side is formed on the n semiconductor layer 42a. The reflective electrode (Ag) 45 and a (dielectric) current blocker 48 are provided at a predetermined interval on the rear side of the p semiconductor layer 42c. The p electrode 44 is formed on the rear side of the supporting substrate 41. The semiconductor layer 42 of the semiconductor light emitting device 8a is covered by the insulated protective film 47.

The embodiments of the semiconductor light emitting device 8 are not limited to the semiconductor light emitting device 8a or 8b as described above, and exemplary embodiments include those not having the supporting substrate 41 or the wafer adhesion layer 49.

The semiconductor light emitting device 8 (8a, 8b) shown in FIGS. 26A and 26B is shown in simplified form in other drawings.

The semiconductor light emitting device 8 is preferably a light emitting diode, and the light emitting diode with any desired wavelength may be adequately selected. For example, the semiconductor light emitting device 8 emitting a blue light (a light having a wavelength of 430 nm to 490 nm) or a green light (a light having a having a wavelength of 490 nm to 570 nm) may be prepare by using ZnSe, nitride semiconductor ($In_1X_1Al_1Y_1Ga_11-X-Y_1N$ wherein $0 \leq X$, $0 \leq Y$, and $X+Y \leq 1$), GaP, or the like. The semiconductor light emitting device 8 emitting a red light (a light having a wavelength of 620 nm to 750 nm) may be prepare by using GaAlAs, AlInGaP, or the like. It is to be noted that when the light-emitting device 10D using a phosphor substance is used as in the case of this embodiment, use of a nitride semiconductor ($In_1X_1Al_1Y_1Ga_11-X-Y_1N$ wherein $0 \leq X$, $0 \leq Y$, and $X+Y \leq 1$) emitting a light having a short wavelength capable of efficiently exciting the phosphor substance is preferable. The wavelength of the light emitted can be selected by adjusting the material used for the active layer 42b or it mixed crystal. In addition, the semiconductor light emitting device 8 prepared by using other material may also be employed. The composition, the color emitted, size, and the like of the semiconductor light emitting device 8 used may be adequately selected depending on the intended application.

The semiconductor light emitting device 8 may also be the one emitting a UV light or infrared light.

(Phosphor Layer (Inorganic Particle Layer))

The phosphor layer 3 of this embodiment is similar to the phosphor layer 3 in other embodiments as described above, and accordingly, detailed explanation is omitted.

<15th Embodiment>

Figure 27:
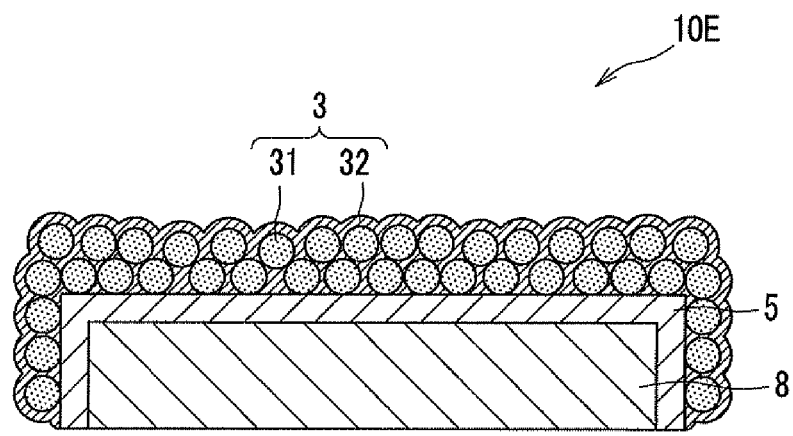
FIG. 27 is a schematic view showing constitution of a light emitting device according to 15th embodiment.

As the light-emitting device of another embodiment (15th embodiment), the light transmissible layer 5 may be provided at least on the upper surface of the semiconductor light emitting device 8 as shown in FIG. 27.

As shown in FIG. 27, the light-emitting device 10E has the light transmissible layer 5 on the side and the upper surfaces of the semiconductor light emitting device 8, and the phosphor layer 3 is provided on the side and the upper side with the intervening light transmissible layer 5. The phosphor layer 3 in the 15th embodiment has constitution similar to other embodiments. In FIG. 27, indication of the interstice 33 (see FIG. 1B) in the phosphor layer 3 has been omitted.

(Light Transmissible Layer)

The light transmissible layer 5 may be the electroconductive layer 6 (see FIG. 5B) formed by electrodeposition or electrostatic coating for use as the electrode in forming the particle layer 34 of the inorganic phosphor 31 on the semiconductor light emitting device 2 in the phosphor layer forming processes S44, S56, and S63 (see also FIGS. 28, 30, and 32) as described below which has been made transparent, or a transparent electroconductive layer. Accordingly, the light transmissible layer 5 is prepared by using a material which has electroconductivity in the production process as described above and which can be made transparent in the subsequent process S, or an electroconductive light transmissible material.

When an electroconductive light transmissible material is used, the transparent conductive layer forming process S45 and S57 (see FIGS. 28 and 30) can be omitted in the production method as described below.

The light transmissible layer 5 and its precursor, namely, the conductive layer 6 are similar to the light transmissible layer 5 and the conductive layer 6 in the fourth embodiment shown in FIGS. 12 and 14, and accordingly, detailed explanation is omitted.

[Production Method of the Light-Emitting Device]

Next, production methods of the light-emitting device according to the 14th and 15th embodiments are described by referring to FIGS. 28 to 33. Three types of production method are described.

(First Manufacturing Method)

Figure 28:
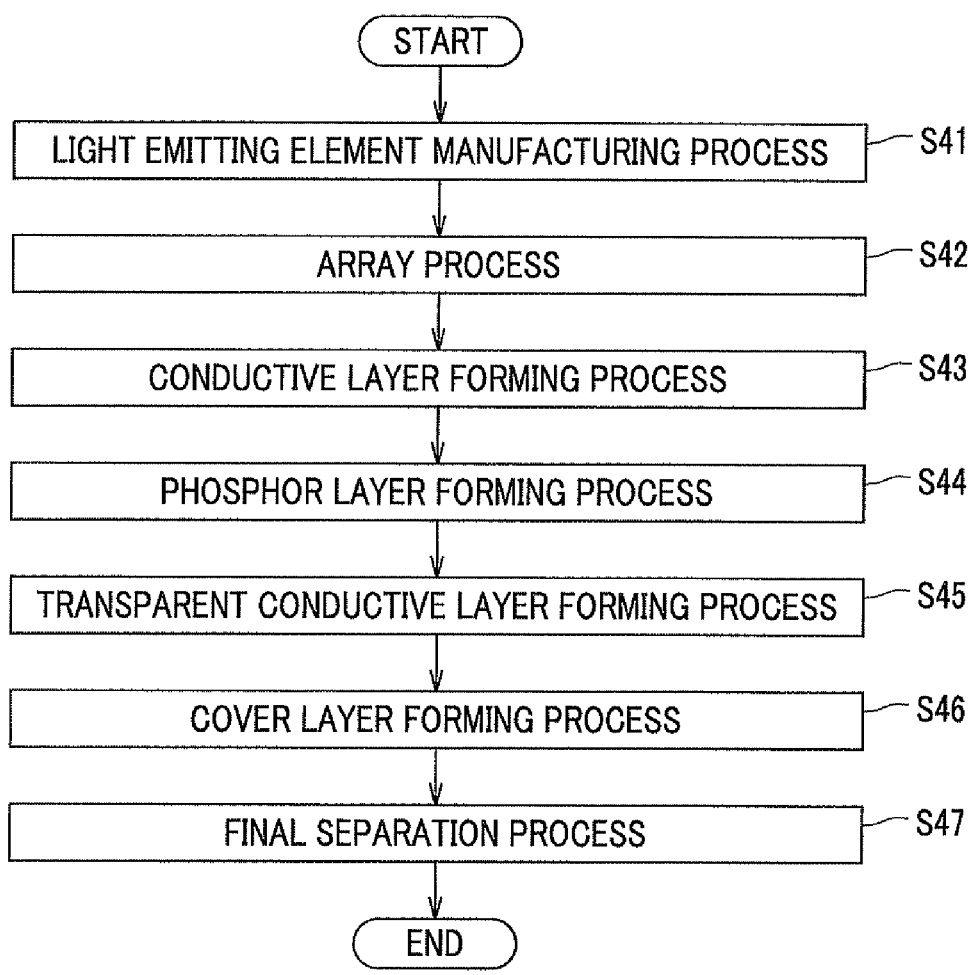
FIG. 28 is a flow chart showing a manufacturing method (first manufacturing method) of the light emitting device according to 15th embodiment.

The first manufacturing method is the manufacturing method of the light-emitting device 10E according to the 15th embodiment shown in FIG. 27, and as shown in FIG. 28, this method includes a semiconductor light emitting device manufacturing process S41, a array process S42, an electroconductive layer forming process S43, a phosphor layer forming process S44, a transparent conductive layer forming process S45, and a cover layer forming process S46, and a final separation (dicing) process S47, which are conducted in this order.

It is to be noted that the method is described for the production of a plurality of light-emitting device 10E, namely, as the method including the array process S42 and the final separation process S47. Also, as will be described below, the electroconductive layer forming process S43 and the transparent conductive layer forming process S45 can be omitted in some production conditions.

Figure 29:
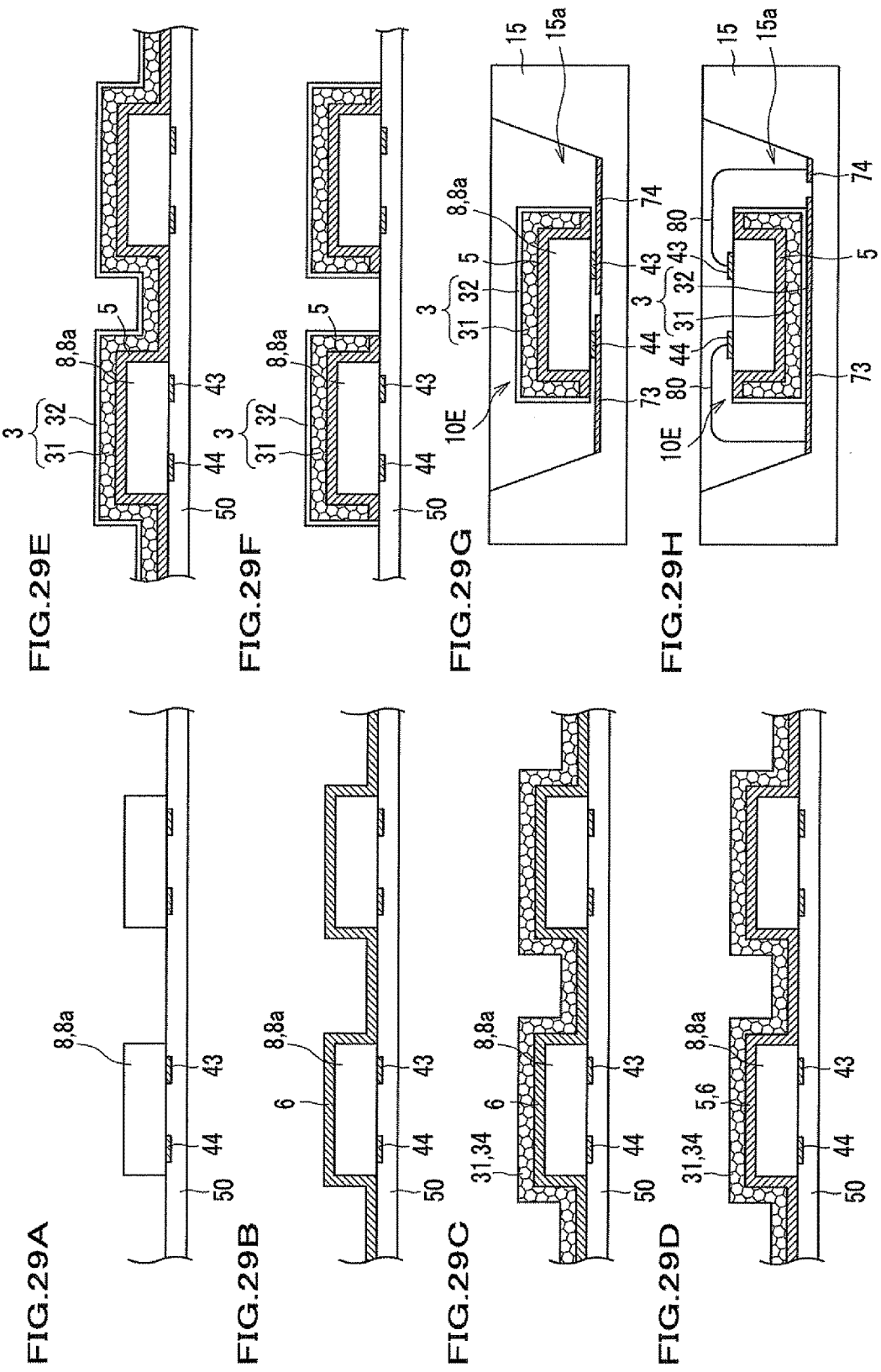
FIG. 29A is a schematic cross-sectional view for explaining a manufacturing process in the manufacturing method (first manufacturing method) of the light emitting device according to the 15th embodiment.
FIG. 29B is a schematic cross-sectional view for explaining a manufacturing process in the manufacturing method (first manufacturing method) of the light emitting device according to the 15th embodiment.
FIG. 29C is a schematic cross-sectional view for explaining a manufacturing process in the manufacturing method (first manufacturing method) of the light emitting device according to the 15th embodiment.
FIG. 29D is a schematic cross-sectional view for explaining a manufacturing process in the manufacturing method (first manufacturing method) of the light emitting device according to the 15th embodiment.
FIG. 29E is a schematic cross-sectional view for explaining a manufacturing process in the manufacturing method (first manufacturing method) of the light emitting device according to the 15th embodiment.
FIG. 29F is a schematic cross-sectional view for explaining a manufacturing process in the manufacturing method (first manufacturing method) of the light emitting device according to the 15th embodiment.
FIG. 29G is a schematic cross-sectional view for explaining a manufacturing process in the manufacturing method (first manufacturing method) of the light emitting device according to the 15th embodiment.
FIG. 29H is a schematic cross-sectional view for explaining a manufacturing process in the manufacturing method (first manufacturing method) of the light emitting device according to the 15th embodiment.

Next, each process is described in detail by referring to FIG. 29 (and if desired, also FIGS. 26 to 28).

(Manufacturing Process of the Semiconductor Light Emitting Element)

The semiconductor light emitting element manufacturing process S41 is the process of producing the individual semiconductor light emitting element. The semiconductor light emitting element 8a having the structure shown in FIG. 26A is produced by this process.

Production of this semiconductor light emitting element 8a may be conducted a method known in the art. For example, each of the nitride semiconductors for the n semiconductor layer 42a, the active layer 42b, and the p semiconductor layer 42c may be deposited in this order on the supporting substrate 41 of sapphire (C plane) by using MOVPE (Metal-Organic Vapor Phase Epitaxy) apparatus. (The substrate having the layers each of the nitride semiconductor is sometimes referred to as a wafer). Next, after forming a resist mask, conducting etching, and removing the resist, films constituting the reflective electrode (or a transparent electrode) 45 and the cover electrode 46 are deposited by sputtering. After forming a resist mask, etching, and removing the resist, the p side electrode 44 and the n-side electrode 43 are deposited by sputtering. The protective film 47 is then deposited by sputtering. After forming a resist mask, etching, and removing the resist, further etching is conducted to expose the p side electrode 44 and the n side electrode 43. The wafer is then separated, for example, by dicing.

(Array Process)

The array process S42 is the process in which the semiconductor light emitting elements 8 are arrayed on a plate jig at a predetermined interval.

In the array process S42, the semiconductor light emitting elements 8 produced in the semiconductor light emitting element manufacturing process S41 are arrayed on the jig 50 having a pressure sensitive sheet (not shown) adhered at a predetermined interval with the side of the electrodes 43 and 44 facing down as shown in FIG. 29A. In this process, bumps (not shown) may be provided on the electrodes 43 and 44 to adjust the height. The semiconductor light emitting elements 8 arrayed on the jig 50 are adhered to the jig 50 by the pressure sensitive sheet to retain their position.

In the array process S42, the semiconductor light emitting elements 8 may also be arrayed on the jig 50 by holding each semiconductor light emitting element 8 by a collet.

The jig 50 is a plate member for supporting an array of the semiconductor light emitting elements 8, and the jig 50 may be prepared by using a rigid plate member of ceramics, glass, metal, plastic, or the like.

(Electroconductive Layer Forming Process)

The electroconductive layer forming process S43 is the process between the array process S42 and the phosphor layer forming process S44, and in this process, the electroconductive layer 6 of a metal is formed on the surface of the semiconductor light emitting element 8.

In the electroconductive layer forming process S43, the electroconductive layer 6 of an electroconductive material (metal material) is formed on the surface of the jig 50 and the semiconductor light emitting elements 8 so that upper and side surfaces of the semiconductor light emitting elements 8 placed on the jig 50 are covered as shown in FIG. 29B. The electroconductive layer 6 may be formed by using a material which can be made transparent in the subsequent process, namely, in the transparent electroconductive layer forming process S45, such as Al, and the electroconductive layer 6 may be formed by sputtering, vapor deposition, plating, or the like.

The electroconductive layer 6 may also be formed by using a light transmissible material such as ITO and ZnO as described above by a method such as a physical method such as sputtering or vapor deposition, spraying, or a chemical method such as CVD (chemical vapor deposition). When the electroconductive layer 6 is formed by using a light transmissible material, the transparent electroconductive layer-forming process S45 can be omitted.

It is to be noted that the supporting substrate 41 of the semiconductor light emitting element 8 may be peeled to provide the element with electroconductivity by the electroconductive epitaxial layer.

(Phosphor Layer Forming Process (Inorganic Particle Layer Forming Process))

The phosphor layer forming process S44 is the process in which agglomerates (the particle layer 34) containing the particles of the color conversion material (inorganic phosphor 31) of the inorganic material which absorbs the light of the first color emitted by the semiconductor light emitting element 8 and emits the light of the second color which is different from the first color is provided above the surface of the semiconductor light emitting element 8.

In the phosphor layer forming process S44, the particle layer 34 of the inorganic phosphor 31 is formed above the surfaces (upper and side surfaces) of the semiconductor light emitting element 8 with the intervening electroconductive layer 6 as shown in FIG. 29C by electrodeposition or electrostatic coating using the electroconductive layer 6 as one electrode.

The formation of the particle layer 34 of the inorganic phosphor 31 by electrodeposition or electrostatic coating can be conducted even if the semiconductor light emitting element 8 was an electrical insulator since the electroconductive layer 6 includes an electroconductive metal and this layer can be used as an electrode.

The phosphor layer forming process S44 is similar to the phosphor layer forming process S21 of the fourth embodiment shown in FIG. 13, and accordingly, detailed explanation is omitted.

(Transparent Conductive Layer Forming Process)

The transparent conductive layer forming process S45 is the process in which the metal of the electroconductive layer 6 oxidized for being made transparent between the phosphor layer forming process S44 and the cover layer forming process S46.

In the transparent conductive layer forming process S45, the electroconductive layer 6 is converted into the light transmissible layer 5 by making the electroconductive layer 6 transparent as shown in FIG. 29D.

The transparent conductive layer forming process S45 is similar to the transparent conductive layer forming process S22 of the fourth embodiment shown in FIG. 13, and accordingly, detailed explanation is omitted.

(Cover Layer Forming Process)

The cover layer forming process S46 is the process of forming the cover layer 32 of an inorganic material continuously covering the surface of the semiconductor light emitting element 8 and the surface of the particles of the color conversion material (inorganic phosphor 31).

In the cover layer forming process S46, as shown in FIG. 29E, the cover layer 32 is formed to cover the particle layer 34 of the inorganic phosphor 31 formed in the phosphor layer forming process S44 thereby bonding the particles with each other. In the cover layer forming process S46, the cover layer 32 may be formed, for example, by ALD or MOCVD. The particles of the inorganic phosphor 31 thereby covered by the cover layer 32, and an integral light-emitting device wherein the particles of the inorganic phosphor 31, light transmissible layer 5, and the particles of the inorganic phosphor 31 are firmly bonded is obtained.

The cover layer forming process S46 is similar to the cover layer forming process S23 of the fourth embodiment shown in FIG. 13, and accordingly, detailed explanation is omitted.

(Final Separation (Dicing) Process)

The final separation process S47 is the process in which the semiconductor light emitting element 8 formed with the cover layer 32 is diced.

As shown in FIG. 29F, the light transmissible layer 5 and the phosphor layer 3 in the parts on the jig 50 where the semiconductor light emitting elements 8 formed with the cover layer 32 are not placed, namely, the light transmissible layer 5 and the phosphor layer 3 between the semiconductor light emitting elements 8 having the cover layer 32 formed thereon are removed by dicing and polishing, and then, the semiconductor light emitting element 8 formed with the cover layer 32 are peeled off the jig 50.

In FIG. 29, the phosphor layer 3, the light transmissible layer 5, and the electroconductive layer 6 are depicted as thick layers for the convenience of explanation, and as a consequence, in FIG. 29E, the cover layer 32 only partly covers the side surface of the semiconductor light emitting element 8. However, almost all of the side surface of the semiconductor light emitting element 8 can be covered with the cover layer 32 by adjusting the thickness of the phosphor layer 3.

In addition, the light transmissible layer 5 between the adjacent semiconductor light emitting elements 8 may be removed before forming the cover layer 32, or alternatively, the light transmissible layer 5 and the phosphor layer 3 between the adjacent semiconductor light emitting elements 8 may be removed after forming the cover layer 32, and the cover layer 32 may be formed on the entire side surface of the semiconductor light emitting element 2. In view of such situation, the phosphor layer 3 is depicted in FIGS. 29F to 29H as being formed on the entire side surface of the semiconductor light emitting element 8. The situation is similar for the phosphor layer 3, and the electroconductive layer 6 may be removed before forming the phosphor layer 3 to form the phosphor layer 3 on the entire side surface of the semiconductor light emitting element 8.

As shown in FIG. 29G, the resulting light-emitting device 10E is mounted in a recess 15a of a package 15. The package 15 is a packaging substrate for packaging of the light-emitting device 10E. The package 15 has the recess 15a for the packaging of the light-emitting device 10E and the recess 15a is open in the upper direction.

When the semiconductor light emitting element 8 is a FD device for face down packaging, the electrodes 43 and 44 are packaged on the electroconductive members 73 and 74 as shown in FIG. 29G. On the other hand, in the case of a FU device for face up packaging, the electrodes 43 and 44 are facing upward, and the supporting substrate 41 side is packaged on the electroconductive member 73 as shown in FIG. 29H, and the electrodes 43 and 44 are connected to the electroconductive members 73 and 74 by wires 80 and 80, respectively.

This light-emitting device 10E may be packaged, for example, by using a solder paste for the bonding member, or by using bumps formed by using a solder or the like.

(Second Production Method)

The second production method is another production method of the light-emitting device 10E according to the 15th embodiment shown in FIG. 27, and as shown in FIG. 7, this method includes a semiconductor light emitting element manufacturing process S51, an array process S52, an electroconductive layer forming process S53, an intermediate separation process S54, a preliminary packaging process S55, a phosphor layer forming process S56, a transparent conductive layer forming process S57, a cover layer forming process S58, and a final separation process S59, which are conducted in this order.

It is to be noted that the method is described for the production of a plurality of light-emitting device 10E, namely, as the method including the array process S52 and the final separation process S59. Also, as in the case of the first production method, the electroconductive layer forming process S53 and the transparent conductive layer forming process S57 can be omitted in some production conditions.

Figure 30:
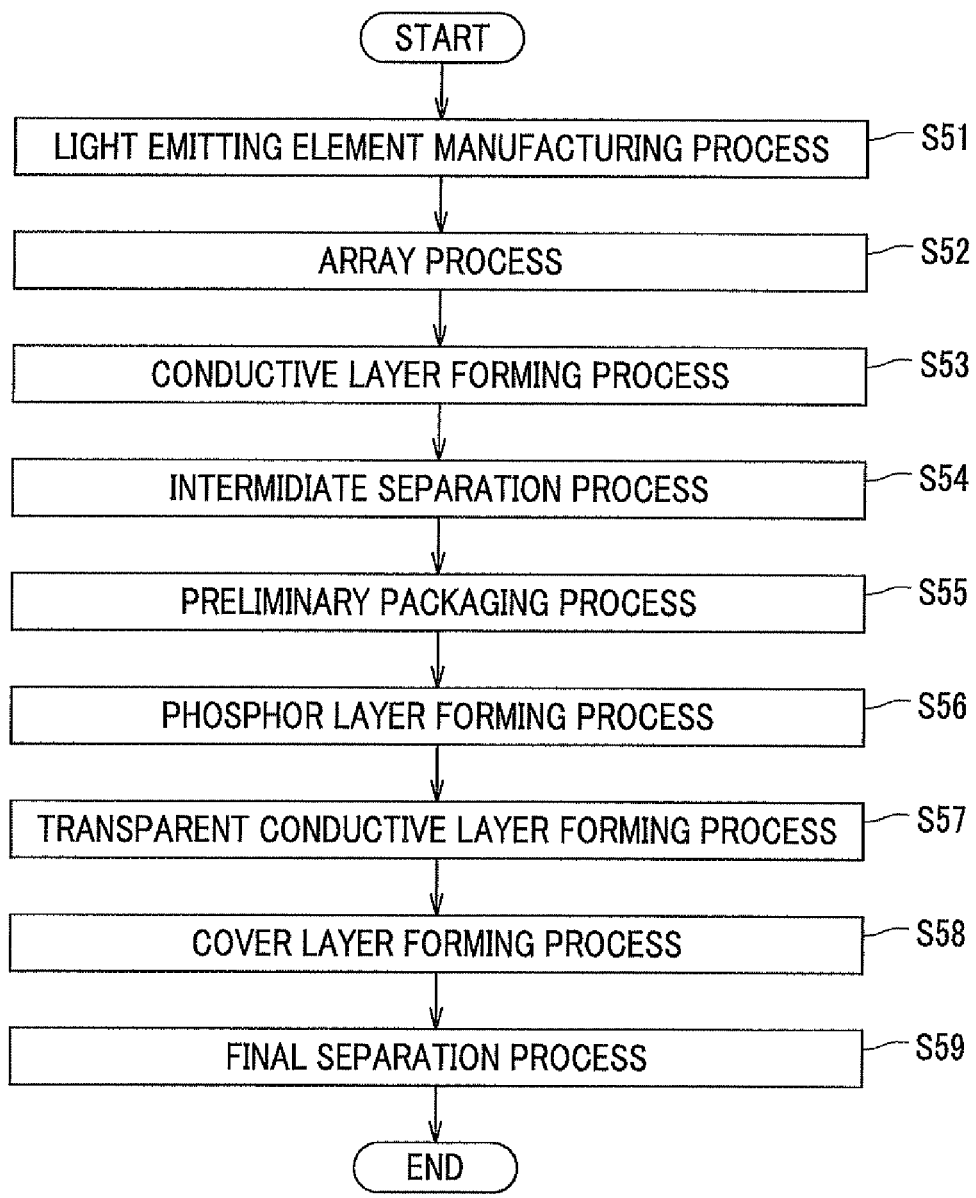
FIG. 30 is a flow chart showing another manufacturing method (second manufacturing method) of the light emitting device according to the 15th embodiment.
Figure 31:
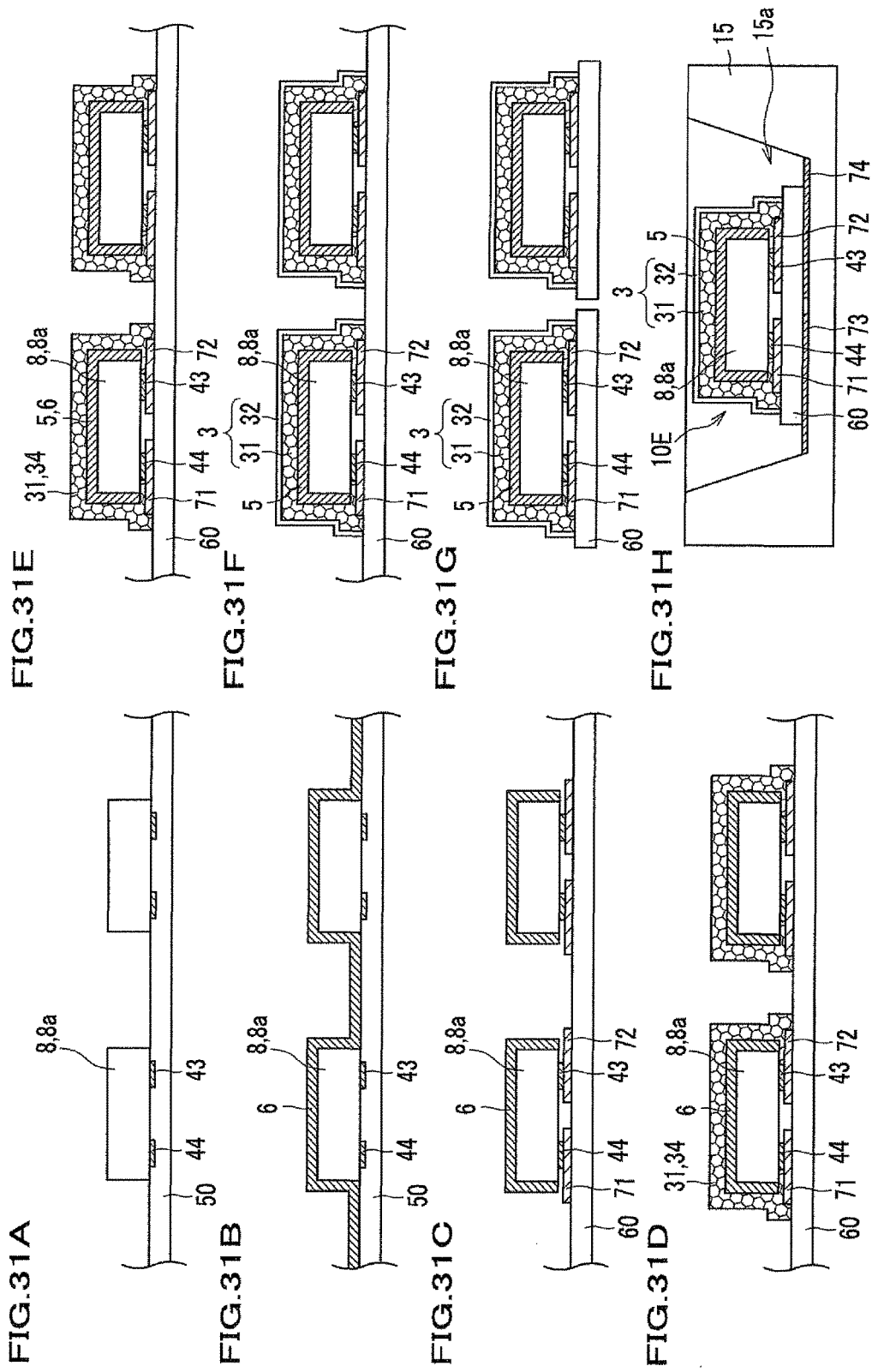
FIG. 31A is a schematic cross-sectional views for explaining a manufacturing process in the manufacturing method (second manufacturing method) of the light emitting device according to the 15th embodiment.
FIG. 31B is a schematic cross-sectional views for explaining a manufacturing process in the manufacturing method (second manufacturing method) of the light emitting device according to the 15th embodiment.
FIG. 31C is a schematic cross-sectional views for explaining a manufacturing process in the manufacturing method (second manufacturing method) of the light emitting device according to the 15th embodiment.
FIG. 31D is a schematic cross-sectional view for explaining a manufacturing process in the manufacturing method (second manufacturing method) of the light emitting device according to the 15th embodiment.
FIG. 31E is a schematic cross-sectional views for explaining a manufacturing process in the manufacturing method (second manufacturing method) of the light emitting device according to the 15th embodiment.
FIG. 31F is a schematic cross-sectional views for explaining a manufacturing process in the manufacturing method (second manufacturing method) of the light emitting device according to the 15th embodiment.
FIG. 31G is a schematic cross-sectional view for explaining a manufacturing process in the manufacturing method (second manufacturing method) of the light emitting device according to the 15th embodiment.
FIG. 31H is a schematic cross-sectional view for explaining a manufacturing process in the manufacturing method (second manufacturing method) of the light emitting device according to the 15th embodiment.

Next, each process is described in detail by referring to FIG. 31 (and if desired, also FIGS. 26 to 27 and FIG. 30).

(Manufacturing Process of the Semiconductor Light Emitting Element)

The semiconductor light emitting element manufacturing process S51 in the second production method is similar to the semiconductor light emitting element manufacturing process S41 in the first production method, and accordingly, detailed explanation is omitted.

(Array Process)

As shown in FIG. 31A, the array process S52 in the second production method is similar to the array process S42 in the first production method, and accordingly, detailed explanation is omitted.

(Electroconductive Layer Forming Process)

As shown in FIG. 31B, the electroconductive layer forming process S53 in the second production method is similar to the electroconductive layer forming process S43 in the first production method, and accordingly, detailed explanation is omitted.

(Intermediate Separation (Dicing) Process)

The intermediate separation process S54 is a process of in which the semiconductor light emitting elements 8 having the electroconductive layer 6 formed thereon are diced.

In the intermediate separation process S54, the parts on the jig 50 where the semiconductor light emitting elements 8 formed with the electroconductive layer 6 are not placed, namely, the electroconductive layer 6 between the semiconductor light emitting elements 8 having the electroconductive layer 6 formed thereon are removed by dicing and polishing, and then, the semiconductor light emitting element 8 formed with the electroconductive layer 6 are peeled off the jig 50.

(Preliminary Packaging Process)

The preliminary packaging process S55 is the process wherein semiconductor light emitting elements 8 are packaged on a plate insulated substrate 60 at a predetermined interval.

As shown in FIG. 31C, in the preliminary packaging process S55, the semiconductor light emitting elements 8 each having the electroconductive layer 6 thereon are placed with the surface having the electrodes 43 and 44 facing downward at a predetermined interval on the insulated substrate 60 with the intervening the electroconductive members 71 and 72 adhered to the insulated substrate 60. The semiconductor light emitting elements 8 packaged on the insulated substrate 60 are mounted on the electroconductive members 71 and 72, and their position is maintained.

This semiconductor light-emitting element 8 may be packaged, for example, by using a solder paste for the bonding member, or by using bumps formed by using a solder or the like.

In the preliminary packaging process S55, the semiconductor light emitting element 8 may be anchored one by one on the insulated substrate 60, for example, by using a collet.

In this method, the insulated substrate 60 is a plate-shaped member for electrically connecting the power source and the electrode after mounting in the package 15 as described below. More specifically, the insulated substrate 60 electrically connects the electroconductive member 73 with the electroconductive member 71 and the electroconductive member 74 with the electroconductive member 72, by an electroconductive member such as a lead, through its interior or side surface, after the mounting in the package 15 as described below. Alternatively, these members may be connected by wire bonding or other non-limited means. The insulated substrate 60 may be a plate-shaped ceramic member.

(Phosphor Layer Forming Process (Inorganic Particle Layer Forming Process))

As shown in FIG. 31D, the phosphor layer forming process S56 in the second production method is similar to the phosphor layer forming process S44 in the first production method, and accordingly, detailed explanation is omitted.

(Transparent Conductive Layer Forming Process)

As shown in FIG. 31E, the transparent conductive layer forming process S57 in the second production method is similar to the transparent conductive layer forming process S45 in the first production method, and accordingly, detailed explanation is omitted.

(Cover Layer Forming Process)

As shown in FIG. 31F, the cover layer forming process S58 in the second production method is similar to the cover layer forming process S46 in the first production method, and accordingly, detailed explanation is omitted.

It is to be noted that the cover layer 32 in the area on the insulated substrate 60 where the semiconductor light emitting element 8 having the cover layer 32 formed thereon is not placed, namely, the area between the adjacent semiconductor light emitting elements 8 having the cover layer 32 formed thereon may be removed by etching, or alternatively, a mask may be provided on such area to prevent formation of the cover layer 32.

(Final Separation (Dicing) Process)

The final separation process is the process in which the semiconductor light emitting element 8 formed with the cover layer 32 is diced.

As shown in FIG. 31G, the insulated substrate 60 is cut in this process, for example, by dicing to obtain the semiconductor light emitting element 8 formed with the cover layer 32, and the light-emitting device 10E shown in FIG. 27 is thereby produced.

As shown in FIG. 31H, the resulting light-emitting device 10E is provided in the recess 15a of the package 15 integrally with the electroconductive members 71 and 72 and the insulated substrate 60. In this process, the light-emitting device 10E is mounted above the electroconductive members 73 and in the recess 15a of the package 15 with the intervening electroconductive members 71 and 72 and the insulated substrate 60. The connection of the electroconductive member 73 with the electroconductive member 71, and the electroconductive member 74 with the electroconductive member 72 may be accomplished by using an electroconductive member such as lead, through the interior or side surface of the insulated substrate 60. Alternatively, these members may be connected by wire bonding or other non-limited means.

This light-emitting device 10E may be packaged, for example, by using a solder paste for the bonding member, or by using bumps formed by using a solder or the like.

(Third Manufacturing Method)

Figure 32:
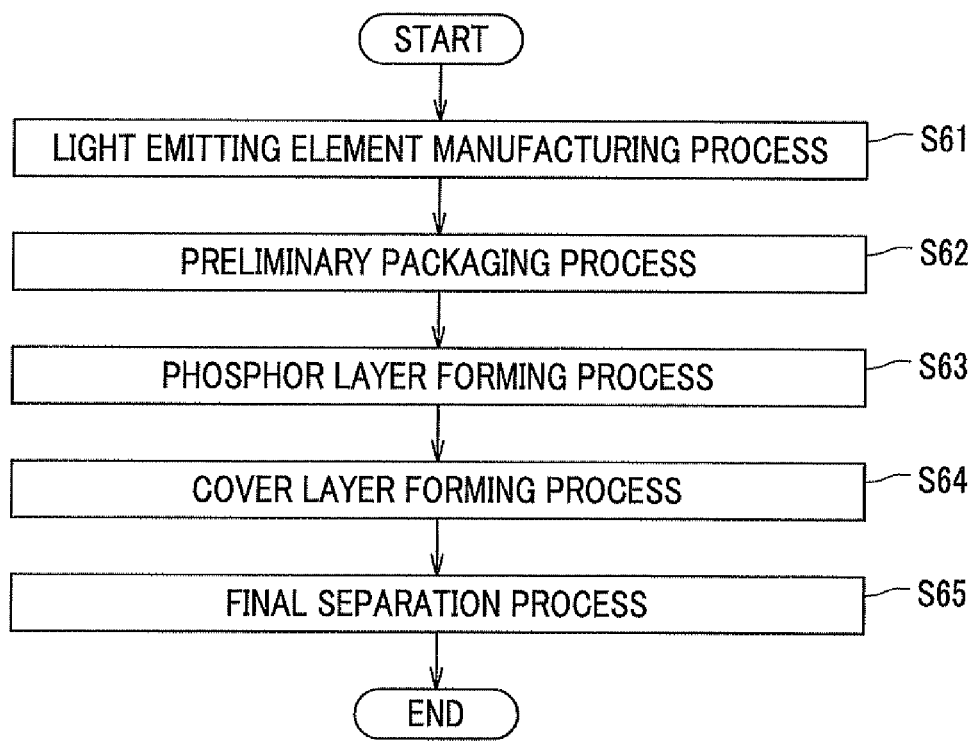
FIG. 32 is a flow chart showing a manufacturing method (third manufacturing method) of the light emitting device according to the 14th embodiment.

The third manufacturing method is the manufacturing method of the light-emitting device 10D according to the 14th embodiment shown in FIG. 25, and as shown in FIG. 32, this method includes a semiconductor light emitting element manufacturing process S61, a preliminary packaging process S62, a phosphor layer forming process S63, a cover layer forming process S64, and a final separation process S65, which are conducted in this order.

It is to be noted that the method is described for the production of a plurality of light-emitting device 10D, namely, as the method including the preliminary packaging process S62 and the final separation process S65.

Next, each process is described in detail by referring to FIG. 33 (and if desired, also FIGS. 25 to 26 and FIG. 32).

(Manufacturing Process of the Semiconductor Light Emitting Element)

The semiconductor light emitting element manufacturing process S61 is the process of producing the semiconductor light emitting element 2. The semiconductor light emitting element 8b having the structure shown in FIG. 26B is produced by this process.

Production of this semiconductor light emitting element 8b may be conducted a method known in the art. For example, nitride semiconductors for the n semiconductor layer 42a, the active layer 42b, and the p semiconductor layer 42c may be respectively deposited in this order on the substrate (not shown) of sapphire (C plane) by using MOVPE apparatus. The reflective electrode (Ag) 45 and the (dielectric) current blocker 48 are then provided by sputtering. The wafer adhesion layer 49 is then deposited by sputtering, and adhered to the electroconductive supporting substrate 41 of Si or the like by thermal pressing, or the like. The sapphire substrate is then peeled by laser lift off (LLO) method in which the laser is irradiated from the sapphire side. Then, after forming a resist mask, patterning of the semiconductor layer, and removing the resist, the n side electrode is deposited by sputtering. The protective film 47 is then deposited by sputtering, and after forming a resist mask, and etching, the resist is removed to expose the n side electrode 43. In the meanwhile, the p electrode 44 is deposited on the rear side of the supporting substrate 41 by the sputtering.

(Preliminary Packaging Process)

The preliminary packaging process S62 is the process wherein semiconductor light emitting elements 8 are arrayed on a plate insulated substrate 60 at a predetermined interval.

Figure 33D:
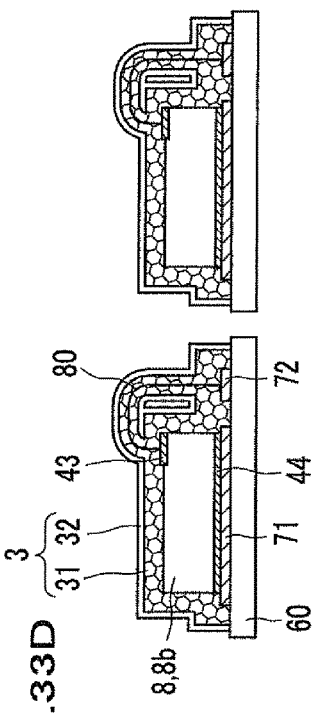
FIG. 33D is a schematic cross-sectional view for explaining a manufacturing process in the manufacturing method (third manufacturing method) of the light emitting device according to the 14th embodiment.
Figure 33E:
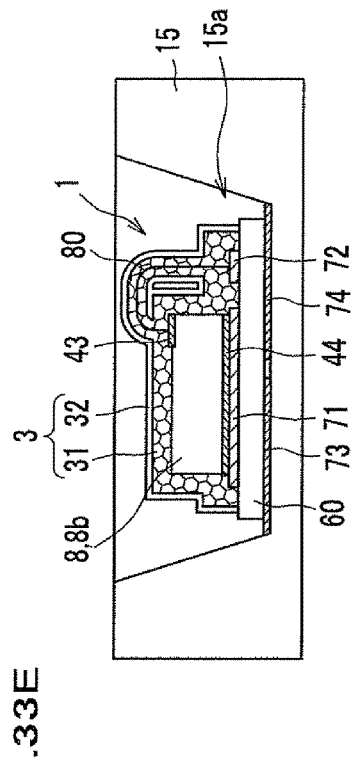
FIG. 33E is a schematic cross-sectional view for explaining a manufacturing process in the manufacturing method (third manufacturing method) of the light emitting device according to the 14th embodiment.
Figure 33A:
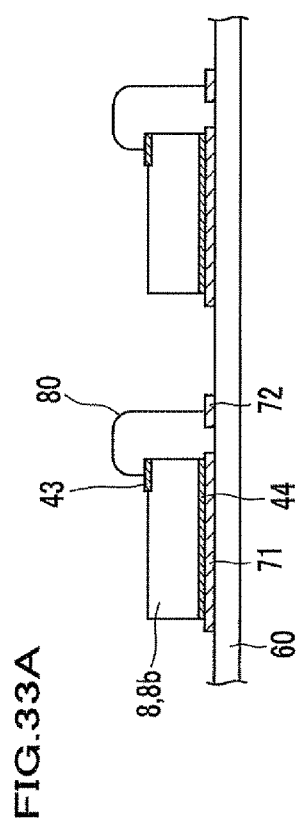
FIG. 33A is a schematic cross-sectional view for explaining a manufacturing process in the manufacturing method (third manufacturing method) of the light emitting device according to the 14th embodiment.

As shown in FIG. 33A, in the preliminary packaging process S62, the semiconductor light emitting elements 8 are placed with the surface having the p electrode 44 facing downward at a predetermined interval on the insulated substrate 60 with the intervening the electroconductive member 71 adhered to the insulated substrate 60. The semiconductor light emitting elements 8 packaged on the insulated substrate 60 are mounted on the electroconductive member 71, and their position is maintained.

This semiconductor light emitting element 8 may be packaged, for example, by using a solder paste for the bonding member, or by using bumps formed by using a solder or the like.

In the meanwhile, the n electrode 43 and the electroconductive member 72 provided on the insulated substrate 60 are connected by the wire 80.

I such semiconductor light emitting element 8b having a perpendicular structure, the side surface and the upper surface of the semiconductor light emitting element 8b are in continuity since the p electrode 44 and the n electrode 43 are electrically connected by the wire 80, and therefore, electrodeposition can be conducted without providing the electroconductive layer.

(Phosphor Layer Forming Process (Inorganic Particle Layer Forming Process))

Figure 33B:
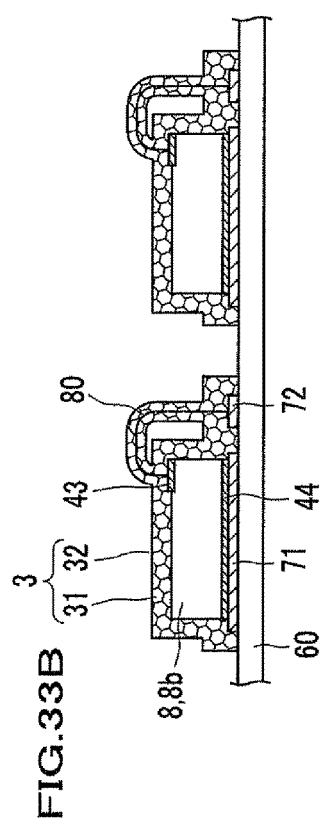
FIG. 33B is a schematic cross-sectional view for explaining a manufacturing process in the manufacturing method (third manufacturing method) of the light emitting device according to the 14th embodiment.

As shown in FIG. 33B, the phosphor layer forming process S63 in the third production method is similar to the phosphor layer forming process S44 in the phosphor layer forming process S63, and accordingly, detailed explanation is omitted. The particle layer 34 is also formed on the surface of the wire 80. Since the entire semiconductor layer functions as the electrode in the electrodeposition or the electrostatic coating, the particle layer 34 is formed on the exposed surface of the semiconductor layer.

(Cover Layer Forming Process)

Figure 33C:
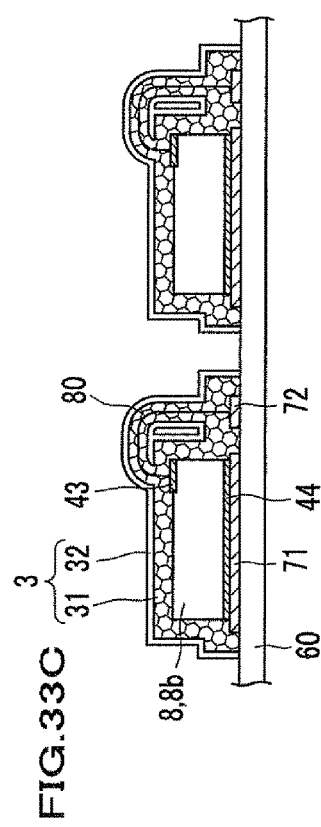
FIG. 33C is a schematic cross-sectional view for explaining a manufacturing process in the manufacturing method (third manufacturing method) of the light emitting device according to the 14th embodiment.

As shown in FIG. 33C, the cover layer forming process S64 in the third production method is similar to the cover layer forming process S46 in the first production method, and accordingly, detailed explanation is omitted. In this embodiment, the cover layer 32 is also formed on the surface of the wire 80.

(Final Separation (Dicing) Process)

As shown in FIG. 33D, the final separation process S65 in the third production method is similar to the final separation process S59 in the second production method, and accordingly, detailed explanation is omitted. It is to be noted that the dicing is conducted with the wire 80 provided, and the light-emitting device 10D shown in FIG. 25 is produced by the processes as described above. The wire is not shown in FIG. 25.

As shown in FIG. 33E, the resulting light-emitting device 10D is provided in the recess 15a of the package 15 integrally with the electroconductive members 71 and 72 and the insulated substrate 60. In this process, the light-emitting device 10D is mounted above the electroconductive members 73 and in the recess 15a of the package 15 with the intervening electroconductive members 71 and 72 and the insulated substrate 60. The connection of the electroconductive member 73 with the electroconductive member 71, and the electroconductive member 74 with the electroconductive member 72 may be accomplished by using an electroconductive member such as lead, through the interior or side surface of the insulated substrate 60. Alternatively, these members may be connected by wire bonding or other non-limited means.

This light-emitting device 10D may be packaged, for example, by using a solder paste for the bonding member, or by using bumps formed by using a solder or the like.

The production method of the light-emitting device according to the 14th and 15th embodiments and the production method of such light-emitting device are as described above. The production method, however, are not limited to the embodiments as described above, and other modifications are described by referring to FIGS. 34A and 34B.

Figure 34A:
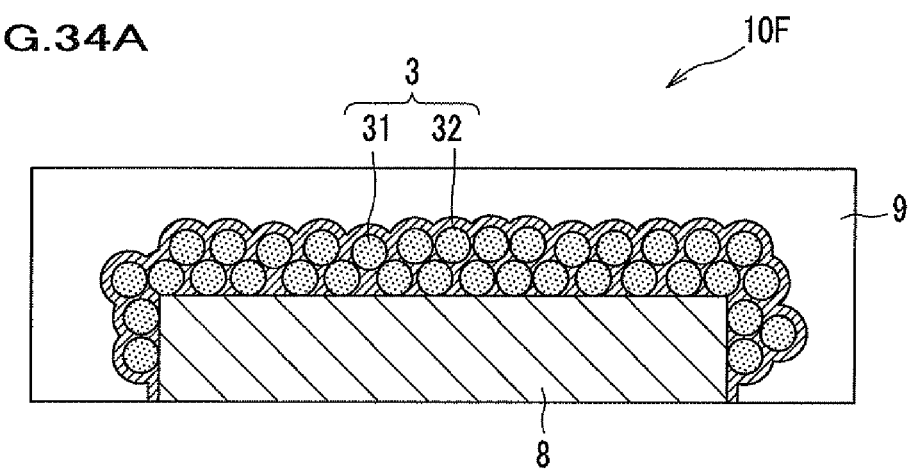
FIG. 34A is a schematic cross-sectional view showing constitution of a light emitting device having a protective layer according to a modification of the 14th embodiment.

As shown in FIG. 34A, in the light-emitting device 10F, a protective layer 9 is formed so that the protective layer 9 covers the phosphor layer 3. The protective layer 9 is a transparent layer including a film of oxide such as $SiO_2$.

Such constitution enables improvement in the strength and light extraction efficiency of the phosphor layer 3. The resulting semiconductor light emitting element 8 should undergo the subsequent process of dicing into the final shape, and the light emitting element 8 should have a strength required to endure such separation process. After the separation process, the semiconductor light emitting element 8 is used by joining with other members. In such process, the flatness of the surface is expected to affect the joining with other members, and the flatness of the surface can be improved by providing a protective layer 9 on the surface. If higher flatness is required, polishing, grinding, CMP, or the like can be conducted for this protective layer 9.

Next, the process of forming a protective layer for disposing this protective layer 9 is described.

The protective layer forming process is the process after the cover layer forming process and before the final separation process. In this process, the protective layer 9 including an oxide film is formed on the cover layer 32 including an inorganic material which continuously covers the surface of the semiconductor light emitting element 8 and the surface of the particles of the color conversion material (inorganic phosphor 31).

In this protective layer forming process, the protective layer is formed to cover the inorganic phosphor 31 and the cover layer 32 as shown in FIG. 34A. The protective layer 9 may be formed, for example, by CVD, atmospheric pressure plasma process, and sputtering. This enables decrease of the unevenness of the phosphor layer 3 as well as firm bonding of the member including the inorganic phosphor 31 and the cover layer 32.

The method as mentioned above can be used when the coverage by the film deposition material is low. Accordingly, it can form an outermost surface with reduced surface unevenness, and also, block interstices near the uppermost surface. When a more flat surface is required, for example, for juncture, this protective layer 9 (and not the phosphor layer 3) can be treated by grinding, polishing, CMP, or the like.

(Protective Layer Forming Process by CVD)

The protective layer forming process by CVD process is described. The CVD process includes the processes of evacuation, plasma treatment, and purging. The evacuation is conducted to the level of about 10 Pa, and after reaching such degree of vacuum, the member is stored at a high temperature of 200° C. After introducing TEOS and oxygen, and generating the plasma, the layer is formed by the unit of 2 μm to mitigate peeling and residual stress. The layer is deposited to a thickness of 16 μm, and the member is taken out of the vessel after recovery to the atmospheric pressure.

Figure 34B:
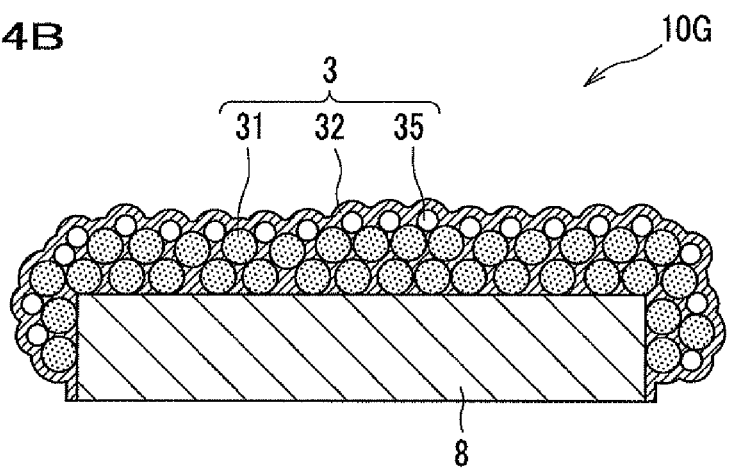
FIG. 34B is a schematic cross-sectional view showing constitution of a light emitting device having filler particles according to a modification of the 14th embodiment.

As shown in FIG. 34B, filler particles 35 having a refractive index different from the cover layer may be formed on the surface of the inorganic phosphor 31, and the cover layer 32 may be formed on the filler particles 35 to complete the light-emitting device 10G. Examples of the filler particles 35 include the inorganic filler as described above.

After the formation of the inorganic phosphor 31 and before the formation of the cover layer 32, the filler particles 35 having a refractive index different from that of the cover layer 32 may be placed on the surface of the inorganic phosphor 31 to improve light diffusion and extraction efficiencies. For example, when the cover layer 32 is an $Al_2O_3$ layer, $SiO_2$ or $TiO_2$ particles may be provided on the outermost surface of the inorganic phosphor 31, and the cover layer 32 is then formed. The filler particles 35 may be formed, for example, by the electrodeposition, electrostatic coating, pulsed spraying, centrifugal sedimentation, or a combination of these methods as described above.

In these modifications, the light transmissible layer (see FIG. 27) may also be provided on the surface of the semiconductor light emitting element 8.

[Operation of the Light-Emitting Device]

Next, operation of the light-emitting device 10D and 10E is described by referring to FIGS. 25 and 27.

These embodiments are described for the case in which a semiconductor light emitting element 8 which emits a blue light is used for the light source. The color conversion member used is the light-emitting device 10D or 10E having the inorganic phosphor 31 which converts a blue light to a yellow light.

The blue light emitted from the semiconductor light emitting element 8 is propagated through the phosphor layer 3 while it is scattered by the interstices 33 in the phosphor layer 3 (see FIG. 1B), and emitted from the light-emitting device 10D or 10E as an output light.

The blue light which has entered the phosphor layer 3 is partly absorbed by the inorganic phosphor 31 before it has transmitted through the phosphor layer 3 and emitted. The inorganic phosphor 31 is excited by the absorbed blue light and a yellow light is radiated (emitted). In other words, the inorganic phosphor 31 converts the blue light to a yellow light.

Both the yellow light emitted by the inorganic phosphor 31 and the blue light which was transmitted through the phosphor layer 3 without being absorbed by the inorganic phosphor 31 are emitted from the side and upper surface of the light-emitting device 10D or 10E as the transmitted light. The transmitted light includes both the yellow light whose color has been converted by the phosphor layer 3 and the blue light whose color has not been converted, and the reflective light L2 is a mixture of these lights. The light emitted by the light-emitting device 10D or 10E can be adjusted to be a white light by adjusting thickness of the inorganic phosphor 31 and proportion of the interstices 33 (see FIG. 1G) in the phosphor layer 3 so that the blue light and the yellow lights would be at an adequate ratio.

It is to be noted that this embodiment is not limited to the white light, and the entire light emitted from the semiconductor light emitting element 8 may be converted to the yellow light for emission of the yellow light. Alternatively, the embodiment can be constituted by using an inorganic phosphor 31 which converts the light to a green or a red light. In addition, various colors may be emitted by constituting the phosphor layer 3 from a lamination or mixture of different types of inorganic phosphors 31 and conducting the color conversion.

The light-emitting device 10F and 10G are similar to the light-emitting device 10D and 10E except for the presence of the protective layer 9 and the filler particles 35.

As described above, the light-emitting device according to the 14th and 15th embodiments and modifications thereof have the surface of the semiconductor light emitting element covered with an inorganic material, and therefore, the light-emitting device experiences reduced deterioration even when used at high current and high temperature. Also enabled is choice of an inorganic phosphor which is easily deteriorated at low current and low temperature, and this suppresses change in the output. Direct atomic layer deposition on the semiconductor light emitting element has enabled protection for the damage of the epitaxial layer, electrode layer exposed in the dicing, and other exposed layers.

In addition, since the inorganic material is covered, and coefficient of linear expansion of the material is low in contrast to the case when the inorganic phosphor is bonded by an intervening resin, change in the color of the light emitted by the light-emitting device due to the expansion or contraction of the material or change in the adhesion is reduced.

Next, Examples are described.

EXAMPLE 1

Production of the inorganic member 1B according to the second embodiment shown in FIG. 6 is described as Example 1.

(Reflective Layer Forming Process)

First, a copper plate substrate is polished for mirror finishing, and Ag is plated on the finished surface to form a reflective layer.

(Masking Process)

Next, the lower and side surfaces of the substrate are covered by using a polyimide tape. More specifically, the masking is provided except for the upper surface where the inorganic phosphor particles are to be provided and only the upper surface is exposed.

(Phosphor Layer Forming Process)

Next, the masked substrate is immersed together with the counter electrode in an electrodeposition tank at about 25° C. having CASN particles having an average particle diameter of 7 μm as measured by F.S.S.S. No method dispersed therein as the inorganic phosphor, and the inorganic phosphor is electrodeposited on the exposed surface of the substrate by electrophoresis. Mg ions are added to the electrodeposition tank as an inorganic binder, and this Mg ion precipitates as magnesium hydroxide and/or magnesium carbonate to enable the binding. The thickness of the inorganic phosphor particle layer is regulated to a thickness of 30 μm by controlling coulomb quantity applied between the electrodes.

A semiconductor light emitting device having the inorganic phosphor particle layer is obtained after washing and drying.

(Cover Layer Forming Process)

Next, an $Al_2O_3$ layer is formed by ALD as the cover layer covering the inorganic phosphor particle layer formed on the metal plate.

The metal plate having the CASN phosphor particle layer deposited thereon is placed in a reaction vessel of an ALD apparatus for deposition of a film by ALD.

The $H_2O$ and the TMA which are the starting materials are alternately introduced in the reaction vessel with the intervening vacuum purging at a temperature conditions of about 150° C. The $Al_2O_3$ layer is deposited by the unit of single molecule by repeating the basic cycle of alternate introduction of the materials to thereby form the $Al_2O_3$ layer to a thickness of about 1 μm.

The cover layer forming process will be described later in detail.

(Mask Removal Process)

Finally, the masking tape is removed to thereby obtain the inorganic member having the layer of the inorganic phosphor particles uniformly coated with the $Al_2O_3$ layer disposed on the upper surface of the substrate.

This inorganic member has the phosphor layer with a porosity of 24.0%, and cracks are prevented despite significant difference in the coefficient of linear expansion between the metal substrate and the phosphor layer.

This inorganic member having the metal plate can be used for the light source of a projector or automobile headlight which is excited by an LD light source.

In the case of the inorganic member produced in this Example, the maximum temperature in the production process is 150° C., and therefore, the CASN phosphor used for the inorganic phosphor which is a nitride phosphor does not undergo deterioration. In addition, the phosphor layer is formed to a thickness of 30 μm which is a thickness not exceeding 100 μm, and processing of the layer is difficult in normal sintered ceramics. The phosphor layer is also in direct contact with the metal. Accordingly, the heat generated by the Stokes loss of the phosphor excitation is efficiently dissipated, and loss of color conversion efficiency by the temperature elevation is thereby suppressed.

The surface of the phosphor layer has surface unevenness corresponding to the particle diameter of the inorganic phosphor, and the interstices are formed in the interior of the inorganic member. In addition, a compact film is formed by ALD.

[Cover Layer Forming Process]

The cover layer forming process by the ALD of the Example 1 is described in further detail.

The reaction vessel used in the ALD apparatus in this Example has an inner diameter of 300 mm and the thickness of the sample is 6 mm.

(Prebaking Process)

First, a sample including a substrate having a reflective layer and the inorganic phosphor particle layer formed on such substrate is placed in the oven, and heated to 120° C. for 2 hours for evaporation of the moisture in the sample.

(Specimen Placement Process)

Next, the specimen is placed in the reaction vessel of an ALD apparatus, and lid of the reaction vessel is closed.

(Process of Pre-Deposition Storage)

Next, the pressure of the reaction vessel is reduced by using a rotary pump. The reaction vessel is regulated to a pressure of 10 torr (13332 Pa). Nitrogen gas stream is also introduced in the reaction vessel at a flow rate of 20 sccm ($33 \times 10^{-3}$ Pa·m³/s), and this state is maintained for about 60 minutes for stabilization and final moisture removal.

The reaction vessel is maintained at a temperature of 150° C., and this temperature is maintained during the deposition.

(First Material Supplying Process)

$H_2O$ is introduced in the reaction vessel as the first material for 0.015 seconds.

In order to promote the reaction between the sample and the $H_2O$, stop valve which is the valve connecting the reaction vessel and the vacuum line is closed to expose the sample to $H_2O$ for 15 seconds.

(First Discharge Process)

The stop valve is opened, and the $H_2O$ which failed to react and the side products are discharged from the reaction vessel for 60 seconds with the nitrogen gas stream.

(Second Material Supplying Process)

TMA is introduced in the reaction vessel as the second material for 0.015 seconds.

The stop valve of the reaction vessel is closed to expose the sample to the TMA for 15 seconds to thereby promote the reaction between the sample and the TMA.

(Second Discharge Process)

The stop valve is opened, and the TMA which failed to react and the side products are discharged from the reaction vessel for 60 seconds by the nitrogen gas stream.

The cycle (the process from the first material supplying process to the second discharge process) is repeated until the Al$_2$O$_3$ film of desired thickness is formed. In this Example, an Al$_2$O$_3$ film having a thickness of about 1 µm is formed by 6000 cycles.

After the completion of the film deposition, the stop valve is closed, and the pressure in the reaction vessel is increased to normal pressure with the nitrogen gas stream at a flow rate of 100 sccm (169×10$^{-3}$ Pa·m$^3$/s). The sample is then taken out of the reaction vessel.

An Al$_2$O$_3$ film is formed as the cover layer by the procedure as described above.

EXAMPLE 2

Production of the inorganic member 1D according to the fourth embodiment shown in FIG. 12 is described as Example 2. This Example is also the Example of the inorganic member 1F according to the 10th embodiment shown in FIG. 24A.

The substrate used is a ceramic sintered plate containing a LAG phosphor. This substrate is a substrate having a thickness of about 100 µm produced by pressing a LAG phosphor at a high pressure to form a bulk, sintering the bulk at high temperature and high pressure by hot isostatic pressing (HIP), slicing the bulk, and cutting and polishing the slice.
(Electroconductive Layer Forming Process)

In order to provide one surface of the substrate with electroconductivity, an Al layer having a thickness of about 0.1 µm is formed on this surface of the substrate.
(Phosphor Layer Forming Process)

Next, a particle layer of the CASN phosphor is deposited above the substrate with the intervening Al layer (electroconductive layer) by using CASN phosphor for the inorganic phosphor by repeating the procedure of Example 1.
(Transparent Electroconductive Layer Forming Process)

After washing and drying, the Al layer is treated with a hot water at 90° C. to convert the Al layer which is the electroconductive layer to an Al$_2$O$_3$ layer, thereby making the electroconductive layer transparent.
(Cover Layer Forming Process)

After the drying, a SiO$_2$ layer is formed by ALD to a thickness of about 3 µm as a cover layer.

A SiO$_2$ layer is formed by ALD by repeating the procedure of Example 1 by using TTBS (tris(tert-buthoxy) silanol) as the first material and TMA as the second material.

The procedure as described above results in the color conversion inorganic member having the constitution of the LAG phosphor plate having the CASN phosphor particle layer and the cover SiO$_2$ layer deposited thereon, and the inorganic member of this Example can be used as a color conversion member by mounting either side of the LAG phosphor plate side and the CASN phosphor side on the LED/LD. In addition, since the maximum temperature in the process is up to 150° C., a non-heat resistant nitride phosphor such as CASN can be used for the inorganic phosphor.

EXAMPLE 3

Production of the inorganic member 1D according to the fourth embodiment shown in FIG. 12 is described as Example 3.

A highly dissipative AlN plate is used for the substrate, and an electroconductive layer of ITO is formed on one surface of this substrate. A fluoride phosphor particle layer is then formed on the substrate by repeating the procedure of Example 1. After washing and drying, an Al$_2$O$_3$ layer having a thickness of about 1 µm is formed by ALD.

The electroconductive layer of this Example is light transmissible, and an inorganic member which can be used as a transmission color conversion member without conducting the transparent conductive layer forming process is thereby produced.

EXAMPLE 4

In Example 4, porosity of the phosphor layer was measured by image analysis for an inorganic member prepared by using a YAG inorganic phosphor and forming an Al$_2$O$_3$ layer as the cover layer by ALD. More specifically, porosity of the phosphor layer was measured by using a picture of the cross section of the phosphor layer by the procedure as described below.

The inorganic phosphor used in this Example had an average particle diameter as measured by F.S.S.S. No method of 3.6 µm. The mean particle size by volume distribution calculated from the particle diameter distribution measured by Coulter counter was 6.2 µm.

Figure 21:
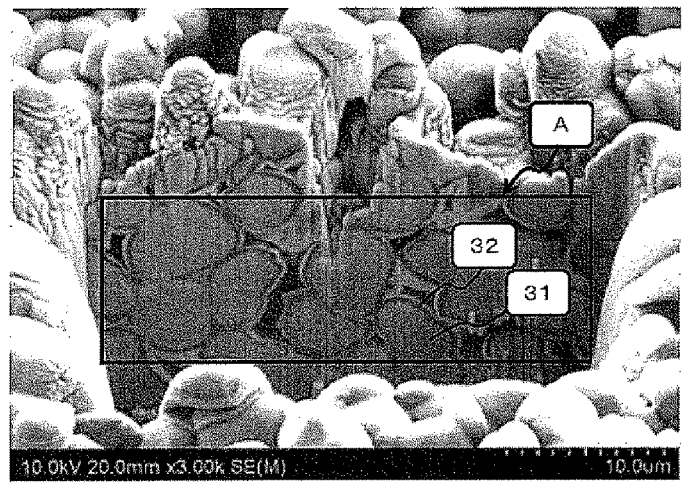
FIG. 21 is an electron micrograph of a cross section of the phosphor layer of the inorganic member according to an Example of the present invention.

As shown in FIG. 21, the inorganic member prepared is divided and a picture of the cross section of the phosphor layer is taken by a scanning electron microscope. In FIG. 21, the pale gray particulate mass is the inorganic phosphor 31, and the dark gray part on the outer periphery of the particulate mass is the cover layer 32.

One division in the scale shown at the right bottom of FIG. 21 is 1 µm, and the cover layer 32 has a thickness of about 300 nm.

Figure 22:
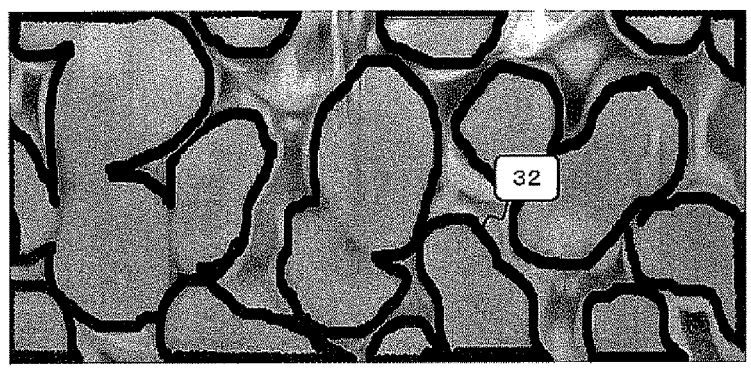
FIG. 22 is the electron micrograph wherein the cover layer is marked black in area A of the FIG. 21.

Next, the area A to be analyzed is cut out of the picture image shown in FIG. 21, and the part of the cover layer 32 is marked black as shown in FIG. 22.

Figure 23:
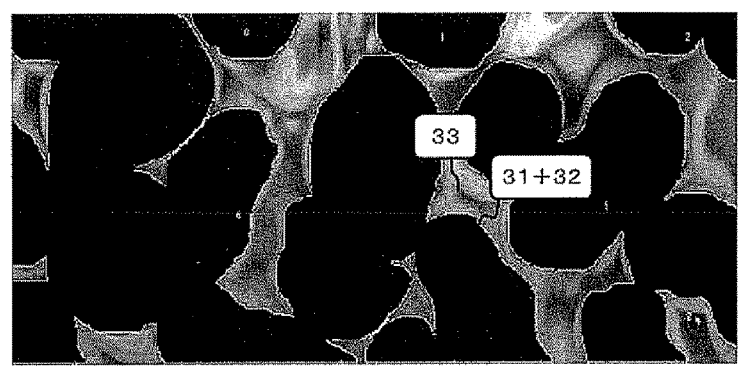
FIG. 23 is the electron micrograph wherein the cover layer and the phosphor are marked black in the area A of the FIG. 21.

Next, the area surrounded by the cover layer 32 marked black is painted black as shown in FIG. 23 by using a particle analyzing software, and this black area is designated the area of the inorganic phosphor including the cover layer 32 (31+32), and the area other than the black area is designated the interstice 33. The area (number of pixels) of the black area divided by the area (number of pixels) of area A gives the proportion of the area of the inorganic phosphor including the cover layer 32 (31+32), and the porosity created by the interstices will be the remainder.

In this Example, content of the inorganic phosphor was 75.4%, and accordingly, the porosity or density was 24.6%.

EXAMPLE 5

Production of the inorganic member 1C according to the third embodiment shown in FIG. 8 is described as Example 5.

In this Example, a plate substrate of Cu is mirror finished and the reflective layer is formed by plating Ag on the mirror finished surface of the Cu substrate with the intervening Ni plated layer as a layer for firm adhesion of the Cu of the substrate and the Ag of the reflective layer. Next, a dielectric multi-layer film including alternately deposited SiO$_2$ layer and Nb$_2$O$_5$ layer is formed by sputtering, and then, an Al film which is a conductive layer functioning as an electrode in the electrodeposition is formed.

Subsequently, the inorganic particle layer mainly including SCASN phosphor is formed by electrodeposition as in the case of Example 1 with the intervening conductive layer. The conductive layer including an Al film is then made transparent by hot water treatment, and then, the cover layer is formed by ALD.

The reflective-type inorganic member thereby produced includes the substrate, and the reflective layer of Ag, the dielectric layer including an inorganic material constituted from 40 layers having a thickness of 3.5 μm, and the inorganic phosphor layer having a thickness of 40 μm formed on the substrate.

The resulting inorganic member enjoy not only the improvement of the reflectance by the Ag reflective layer but also the improvement of the light extraction efficiency and reflectance by the dielectric layer. Accordingly, the optical efficiency could be improved by 5% compared with the inorganic member without the dielectric layer.

EXAMPLE 6

Production of the inorganic member 1F according to the 10th embodiment shown in FIG. 24A is described as Example 6.

The substrate used is a sintered member containing 80% by weight of an inorganic phosphor $Y_3Al_5O_{12}$:Ce.

This sintered member can be prepared by uniformly mixing 240 g of inorganic phosphor YAG particles having an average particle size of 10 μm with 60 g of alumina particles having a average particle size of 2 μm, and pressing the mixture into a columnar bulk by using a high pressure press; firing this bulk at 1400° C. to 2000° C. for 1 to 60 minutes in a vacuum atmosphere in a spark plasma sintering furnace; and then annealing, slicing, cutting, and polishing the resulting sintered bulk to obtain the substrate having a thickness of about 100 μm.

An electroconductive layer of ITO is formed on one surface of this substrate. A layer of preliminarily water-proofed fluoride phosphor particles of $Li_2SiF_6$:Mn having an average particle diameter of about 20 μm is then formed on the substrate by repeating the procedure of Example 1. After washing and drying, an $Al_2O_3$ layer having a thickness of about 1 μm is formed by ALD.

The electroconductive layer of this Example is light transmissible, and an inorganic member which can be used as a transmission color conversion member without conducting the transparent conductive layer forming process is thereby produced.

EXAMPLE 7

In Example 7, a glass substrate containing a LAG phosphor is used for the substrate. The glass substrate includes a glass containing BaO, CaO, ZnO, $SiO_2$, $B_2O_3$, and $Al_2O_3$ as its main ingredient, and it contains 10 to 30% by weight of a LAG phosphor having an average particle diameter of about 10 μm. This glass substrate is prepared by mixing and molding the LAG phosphor powder and the glass powder, sintering the molded mixture in the vacuum to prepare a glass plate containing the LAG phosphor, and polishing the glass plate to obtain the glass substrate having a thickness of 100 μm. A SCASN phosphor particle layer is formed on this glass substrate by repeating the procedure of Example 2, and then, a cover layer of transparent $SiO_2$ was formed by CVD to complete the color conversion inorganic member.

On the ceramics substrate having the wiring therethrough having the flip chip-packaged GaN light emitting element, the color conversion inorganic member is mounted on the sapphire plane of the GaN light emitting element, with the side of the inorganic particle layer on the upper side and the side of the glass containing the LAG phosphor on the lower side, by using a dimethylsilicone resin adhesive to produce an LED which is an amber light-emitting device.

As a Comparative Example, a phosphor-containing glass substrate is produced by mixing two types of phosphors, namely, the LAG phosphor and the SCASN phosphor at amounts equivalent with the Example 7 and sintering the mixture. The procedure as described above is repeated except that the inorganic particle layer is not formed to thereby obtain an LED which is an amber light-emitting device having the glass substrate containing the two types of phosphors.

The amber LED having the color conversion inorganic member of this embodiment has a light emitting output which is about 10 to 20% higher than the amber LED having the glass substrate containing the comparative phosphor, probably because of the presence of the interstices and the prevention of the thermal degradation of the SCASN phosphor of the amber LED of this embodiment.

EXAMPLE 8

Next, production example of the light-emitting device 10E according to the 15th embodiment shown in FIG. 27 is described as Example 8.

(Semiconductor Light Emitting Element Manufacturing Process and Array Process)

A semiconductor light emitting element having the structure shown in FIG. 26A is produced by the method described for the first production method. This semiconductor light emitting element is placed on a plate-shaped jig at a predetermined interval.

(Electroconductive Layer Forming Process)

In order to provide the surface of the semiconductor light emitting element with electroconductivity, an Al layer having a thickness of about 0.1 μm is formed on the semiconductor light emitting element.

(Phosphor Layer Forming Process)

Next, the semiconductor light emitting element and the counter electrode are immersed in an electrodeposition tank at about 25° C. having CASN particles having an average particle diameter of 7 μm as measured by F.S.S.S. No method dispersed therein as the inorganic phosphor, and the inorganic phosphor is electrodeposited on the exposed surface of the semiconductor light emitting element by electrophoresis. Mg ion is added to the electrodeposition tank as an inorganic binder, and this Mg ion precipitates as magnesium hydroxide and/or magnesium carbonate to enable the binding. The thickness of the inorganic phosphor particle layer is regulated to a thickness of 30 μm by controlling coulomb quantity applied between the electrodes.

A semiconductor light emitting element having the inorganic phosphor particle layer is obtained after washing and drying.

(Transparent Electroconductive Layer Forming Process)

After washing and drying, the Al layer is treated with a hot water at 90° C. to convert the Al layer which is the electroconductive layer to an $Al_2O_3$ layer, thereby making the electroconductive layer transparent.

(Cover Layer Forming Process)

Next, an $Al_2O_3$ layer having a thickness of about 1 μm is formed by ALD by repeating the procedure of Example 1 as a cover layer covering the inorganic phosphor particle layer disposed on the surface of the semiconductor light emitting element (Final Separation (Dicing) Process)

Next, the semiconductor light emitting element 8 formed with the cover layer 32 is diced. The parts of the jig 50 where the semiconductor light emitting elements 8 formed with the cover layer 32 are not placed are removed by dicing and polishing, and the semiconductor light emitting elements are peeled off the jig.

EXAMPLE 9

Another production example of the light-emitting element 10E according to the embodiment shown in FIG. 27 is described as Example 9.

An electroconductive layer of the ITO is formed on some limited area of the surface of the semiconductor light emitting element after masking. After removing the mask, a fluoride phosphor particle layer is formed on the semiconductor light emitting element by repeating the procedure of Example 8. After washing and drying, an $Al_2O_3$ layer having a thickness of about 1 μm is formed by ALD.

The electroconductive layer of this Example is light transmissible, and a transmission light-emitting device can be produced without requiring the transparent electroconductive layer forming process.

What is claimed is:

1. A wave-length conversion inorganic member comprising:
    a base body; and
    an inorganic particle layer on the base body, the inorganic particle layer including particles of an inorganic wave-length conversion substance which is configured to absorb light of a first wave-length and to emit light of a second wave-length different from the first wave-length,
    the inorganic particle layer comprising
    an agglomerate of a plurality of the particles, wherein each of the plurality of the particles are in contact with at least one of the other particles or the base body; and
    a cover layer comprising an inorganic material, and the cover layer continuously covering a surface of the base body and surfaces of the particles,
    the inorganic particle layer having an interstice enclosed by the particles, or by the particles and one of the base body and the cover layer,
    wherein each of the plurality of the particles of the wave-length conversion substance is bonded to at least one of the other particles or the base body by an inorganic binder,
    wherein the inorganic binder is a hydroxide or a carbonate of an alkaline earth metal, and
    wherein the base body comprises an inorganic wave-length conversion substance which absorbs the light of the first wave-length and emits light of a third wave-length different from the first wave-length and the second wave-length.

2. The wave-length conversion inorganic member according to claim 1,
    wherein the base body comprises a translucent material.

3. The wave-length conversion inorganic member according to claim 1,
    wherein the base body and the inorganic particle layer has a boundary surface therebetween, and
    wherein the boundary surface is configured to reflect the light of the first wave-length and the light of the second wave-length.

4. The wave-length conversion inorganic member according to claim 1, wherein the base body comprises a light source which is configured to emit light of the first wave-length.

5. The wave-length conversion inorganic member according to claim 1, wherein the inorganic particle layer has a plurality of interstices, and has a density of 1% to 50%.

6. The wave-length conversion inorganic member according to claim 1,
    wherein the particles of the wave-length conversion substance have an average particle size of 0.1 μm to 100 μm, and
    wherein the cover layer has an average thickness of 10 μm to 50 μm.

7. The wave-length conversion inorganic member according to claim 1,
    wherein the inorganic particle layer has a concave and convex surface formed by variations in particle sizes of the particles of the wave-length conversion substance.

8. The wave-length conversion inorganic member according to claim 1,
    wherein the cover layer is formed by atomic layer deposition.

9. The wave-length conversion inorganic member according to claim 1,
    wherein the cover layer contains at least one compound selected from the group consisting of Al2O3, SiO2, ZrO2, HfO2, TiO2, ZnO, Ta2O5, Nb2O5, In2O3, SnO2, TiN, and AlN.

10. The wave-length conversion inorganic member according to claim 1,
    wherein the wave-length conversion substance contains at least one compound selected from the group consisting of sulfide phosphor, halogen-silicate phosphor, nitride phosphor, and oxynitride phosphor.

11. The wave-length conversion inorganic member according to claim 1, wherein the interstice is filled with a filler material.

12. The wave-length conversion inorganic member according to claim 11, wherein the filler material is a gas layer or a solid.

13. The wave-length conversion inorganic member according to claim 11, wherein the filler material is the same material as a material of the cover layer.

* * * * *